United States Patent
Zerbe et al.

(10) Patent No.: US 9,785,589 B2
(45) Date of Patent: Oct. 10, 2017

(54) MEMORY CONTROLLER THAT CALIBRATES A TRANSMIT TIMING OFFSET

(71) Applicant: Rambus Inc., Sunnyvale, CA (US)

(72) Inventors: Jared LeVan Zerbe, Woodside, CA (US); Kevin S. Donnelly, Los Altos, CA (US); Stefanos Sidiropoulos, Palo Alto, CA (US); Donald C. Stark, Palo Alto, CA (US); Mark A. Horowitz, Menlo Park, CA (US); Leung Yu, Santa Clara, CA (US); Roxanne Vu, San Jose, CA (US); Jun Kim, Los Altos Hills, CA (US); Bruno W. Garlepp, Sunnyvale, CA (US); Tsyr-Chyang Ho, Saratoga, CA (US); Benedict Chung-Kwong Lau, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/222,987

(22) Filed: Jul. 29, 2016

(65) Prior Publication Data
US 2017/0031854 A1 Feb. 2, 2017

Related U.S. Application Data

(60) Continuation of application No. 14/859,991, filed on Sep. 21, 2015, now Pat. No. 9,405,678, which is a
(Continued)

(51) Int. Cl.
*G06F 13/364* (2006.01)
*G06F 13/42* (2006.01)
(Continued)

(52) U.S. Cl.
CPC ............ *G06F 13/364* (2013.01); *G06F 1/10* (2013.01); *G06F 3/061* (2013.01); *G06F 3/0659* (2013.01);
(Continued)

(58) Field of Classification Search
CPC .... G06F 1/10; G06F 13/4282; G06F 13/1694; G06F 13/4243; G06F 12/0246;
(Continued)

(56) References Cited

U.S. PATENT DOCUMENTS 3,510,585 A 5/1970 Stone
4,481,625 A 11/1984 Roberts et al.
(Continued)

FOREIGN PATENT DOCUMENTS

EP 0253096 A2 1/1988
EP 0369690 A2 5/1990
(Continued)

OTHER PUBLICATIONS

Bellare et al., Forward Integrity for Secure Audit Logs, Nov. 23, 1997, pp. 1 -16, USA. 16 pages.
(Continued)

*Primary Examiner* — Brian D Nguyen
(74) *Attorney, Agent, or Firm* — The Neudeck Law Firm, LLC

(57) ABSTRACT

An integrated circuit device includes a transmitter circuit operable to transmit a timing signal over a first wire to a DRAM. The DRAM receives a first signal having a balanced number of logical zero-to-one transitions and one-to-zero transitions and samples the first signal at a rising edge of the timing signal to produce a respective sampled value. The device further includes a receiver circuit to receive the respective sampled value from the DRAM over a plurality of wires separate from the first wire. In a first mode, the
(Continued)

transmitter circuit repeatedly transmits incrementally offset versions of the timing signal to the DRAM until sampled values received from the DRAM change from a logical zero to a logical one or vice versa; and in a second mode, it transmits write data over the plurality of wires to the DRAM according to a write timing offset generated based on the sampled values.

21 Claims, 45 Drawing Sheets

Related U.S. Application Data continuation of application No. 14/613,276, filed on Feb. 3, 2015, now Pat. No. 9,164,933, which is a continuation of application No. 14/154,068, filed on Jan. 13, 2014, now Pat. No. 8,948,212, which is a continuation of application No. 13/447,080, filed on Apr. 13, 2012, now Pat. No. 8,630,317, which is a continuation of application No. 12/430,836, filed on Apr. 27, 2009, now Pat. No. 8,170,067, which is a division of application No. 11/327,213, filed on Jan. 5, 2006, now Pat. No. 7,535,933, which is a continuation of application No. 10/684,618, filed on Oct. 13, 2003, now Pat. No. 7,042,914, which is a continuation of application No. 09/421,073, filed on Oct. 19, 1999, now Pat. No. 6,643,787.

(51) Int. Cl.
*G06F 13/40* (2006.01)
*G06F 3/06* (2006.01)
*G06F 1/10* (2006.01)
*G06F 13/16* (2006.01)
*H04L 7/00* (2006.01)
*G11C 7/10* (2006.01)
*G06F 12/02* (2006.01)
*H04L 7/033* (2006.01)

(52) U.S. Cl.
CPC ........ *G06F 3/0679* (2013.01); *G06F 12/0246* (2013.01); *G06F 13/1689* (2013.01); *G06F 13/1694* (2013.01); *G06F 13/404* (2013.01); *G06F 13/4243* (2013.01); *G06F 13/4282* (2013.01); *G11C 7/1045* (2013.01); *H04L 7/0008* (2013.01); *G06F 2212/7201* (2013.01); *G06F 2212/7207* (2013.01); *H04L 7/033* (2013.01)

(58) Field of Classification Search
CPC ...... G06F 13/364; G06F 3/061; G06F 3/0659; G06F 3/0679; G06F 13/404; G06F 13/1689; G06F 2212/7207; G06F 2212/7201; H04L 7/0008; H04L 7/033; G11C 7/1045

See application file for complete search history.

(56) References Cited

U.S. PATENT DOCUMENTS

| | | |
|---|---|---|
| 4,575,860 A | 3/1986 | Scorrdo |
| 4,807,259 A | 2/1989 | Yamanaka et al. |
| 4,847,867 A | 7/1989 | Nasu et al. |
| 5,036,529 A | 7/1991 | Shin |
| 5,097,489 A | 3/1992 | Tucci |
| 5,254,883 A | 10/1993 | Horowitz et al. |
| 5,355,391 A | 10/1994 | Horowitz et al. |
| 5,376,833 A | 12/1994 | Chloupek |
| 5,432,823 A | 7/1995 | Gasbarro et al. |
| 5,485,490 A | 1/1996 | Leung et al. |
| 5,489,862 A | 2/1996 | Risinger |
| 5,498,990 A | 3/1996 | Leung et al. |
| 5,513,327 A | 4/1996 | Farmwald et al. |
| 5,554,945 A | 9/1996 | Lee et al. |
| 5,577,236 A | 11/1996 | Johnson et al. |
| 5,579,352 A | 11/1996 | Llewellyn |
| 5,604,694 A | 2/1997 | Callahan |
| 5,606,717 A | 2/1997 | Farmwald et al. |
| 5,614,855 A | 3/1997 | Lee et al. |
| 5,615,358 A | 3/1997 | Vogley |
| 5,619,158 A | 4/1997 | Casal et al. |
| 5,671,259 A | 9/1997 | Thomas et al. |
| 5,684,421 A | 11/1997 | Chapman et al. |
| 5,703,489 A | 12/1997 | Kuroe |
| 5,706,447 A | 1/1998 | Vivio |
| 5,724,392 A | 3/1998 | Klimek et al. |
| 5,742,798 A | 4/1998 | Goldrian |
| 5,757,786 A | 5/1998 | Joo |
| 5,763,283 A | 6/1998 | Cernosek et al. |
| 5,778,419 A | 7/1998 | Hansen et al. |
| 5,831,929 A | 11/1998 | Manning |
| 5,838,177 A | 11/1998 | Keeth |
| 5,838,204 A | 11/1998 | Yao |
| 5,852,378 A | 12/1998 | Keeth |
| 5,860,080 A | 1/1999 | James et al. |
| 5,870,347 A | 2/1999 | Keeth et al. |
| 5,872,736 A | 2/1999 | Keeth |
| 5,886,948 A | 3/1999 | Ryan |
| 5,889,703 A | 3/1999 | Shiota et al. |
| 5,889,824 A | 3/1999 | Ueda |
| 5,892,981 A | 4/1999 | Wiggers |
| 5,897,656 A * | 4/1999 | Vogt .................. G06F 12/0833 711/141 |
| 5,910,920 A | 6/1999 | Keeth |
| 5,920,518 A | 7/1999 | Harrison et al. |
| 5,926,034 A | 7/1999 | Seyyedy |
| 5,930,182 A | 7/1999 | Lee |
| 5,935,263 A | 8/1999 | Keeth et al. |
| 5,940,608 A | 8/1999 | Manning |
| 5,940,609 A | 8/1999 | Harrison |
| 5,946,244 A | 8/1999 | Manning |
| 5,946,260 A | 8/1999 | Manning |
| 5,949,254 A | 9/1999 | Keeth |
| 5,953,284 A | 9/1999 | Baker et al. |
| 5,953,286 A | 9/1999 | Matsubara et al. |
| 5,959,929 A | 9/1999 | Cowles et al. |
| 5,963,502 A | 10/1999 | Watanabe et al. |
| 5,986,955 A | 11/1999 | Siek et al. |
| 5,990,730 A | 11/1999 | Shinozaki |
| 5,996,043 A | 11/1999 | Manning |
| 6,000,022 A | 12/1999 | Manning |
| 6,003,118 A | 12/1999 | Chen |
| 6,009,487 A | 12/1999 | Batra et al. |
| 6,011,732 A | 1/2000 | Harrison et al. |
| 6,014,759 A | 1/2000 | Manning |
| 6,016,282 A | 1/2000 | Keeth |
| 6,025,718 A | 2/2000 | Hushek |
| 6,026,050 A | 2/2000 | Baker et al. |
| 6,026,051 A | 2/2000 | Keeth et al. |
| 6,029,250 A | 2/2000 | Keeth |
| 6,029,252 A | 2/2000 | Manning |
| 6,031,787 A | 2/2000 | Jeddeloh |
| 6,032,220 A | 2/2000 | Martin et al. |
| 6,032,274 A | 2/2000 | Manning |
| 6,034,878 A | 3/2000 | Osaka et al. |
| 6,047,248 A | 4/2000 | Georgiou |
| 6,049,846 A | 4/2000 | Farmwald et al. |
| 6,091,655 A | 7/2000 | Yamada et al. |
| 6,094,704 A | 7/2000 | Martin |
| 6,094,727 A | 7/2000 | Manning |
| 6,101,197 A | 8/2000 | Keeth |
| 6,101,612 A | 8/2000 | Jeddeloh |
| 6,108,795 A | 8/2000 | Jeddeloh |
| 6,115,318 A | 9/2000 | Keeth |
| 6,131,149 A | 10/2000 | Lu et al. |
| 6,185,644 B1 | 2/2001 | Farmwald et al. |
| 6,232,806 B1 | 5/2001 | Woeste et al. |
| 6,233,294 B1 | 5/2001 | Bowers et al. |

(56) References Cited

U.S. PATENT DOCUMENTS

| | | | |
|---|---|---|---|
| 6,236,623 | B1 | 5/2001 | Read et al. |
| 6,276,844 | B1 | 8/2001 | Coteus et al. |
| 6,282,210 | B1 | 8/2001 | Rapport et al. |
| 6,292,903 | B1 | 9/2001 | Coteus et al. |
| 6,304,623 | B1 | 10/2001 | Richards et al. |
| 6,321,282 | B1 | 11/2001 | Horowitz et al. |
| 6,330,650 | B1 | 12/2001 | Toda et al. |
| 6,426,984 | B1 | 7/2002 | Perino et al. |
| 6,430,696 | B1 | 8/2002 | Keeth |
| 6,442,644 | B1 | 8/2002 | Gustavson et al. |
| 6,449,727 | B1 | 9/2002 | Toda |
| 6,462,591 | B2 | 10/2002 | Garrett et al. |
| 6,470,060 | B1 | 10/2002 | Harrison |
| 6,480,946 | B1 | 11/2002 | Tomishima et al. |
| 6,493,803 | B1* | 12/2002 | Pham .................. G06F 13/28 710/22 |
| 6,507,808 | B1* | 1/2003 | LaFauci ............. G06F 17/5022 703/14 |
| 6,510,503 | B2 | 1/2003 | Gillingham et al. |
| 6,553,452 | B2 | 4/2003 | Garlepp et al. |
| 6,553,472 | B2 | 4/2003 | Yang et al. |
| 6,560,674 | B1* | 5/2003 | Hosogi ............. G06F 12/0833 711/118 |
| 6,567,903 | B1* | 5/2003 | Walton ............. G06F 11/1666 711/165 |
| 6,611,905 | B1 | 8/2003 | Grundon et al. |
| 6,674,823 | B2 | 1/2004 | Samueli et al. |
| 6,678,801 | B1* | 1/2004 | Greim ............. G06F 12/0692 710/305 |
| 6,681,283 | B1* | 1/2004 | Thekkath ........... G06F 12/0815 710/305 |
| RE38,482 | E | 3/2004 | Leung et al. |
| 6,775,328 | B1 | 8/2004 | Segaram |
| 6,804,764 | B2 | 10/2004 | LaBerge et al. |
| 6,807,614 | B2 | 10/2004 | Chung |
| 6,889,284 | B1 | 5/2005 | Nizar et al. |
| 6,928,571 | B1 | 8/2005 | Bonnella et al. |
| 6,970,988 | B1 | 11/2005 | Chung |
| 7,076,745 | B2 | 7/2006 | Togo |
| 7,100,066 | B2 | 8/2006 | Jeong |
| 7,224,595 | B2 | 5/2007 | Drep et al. |
| 2001/0047450 | A1 | 11/2001 | Gillingham et al. |
| 2002/0000871 | A1 | 1/2002 | Davies |
| 2002/0002650 | A1 | 1/2002 | Christenson |
| 2002/0027805 | A1 | 3/2002 | Roohparvar |
| 2002/0054611 | A1 | 5/2002 | Seta |
| 2002/0062421 | A1 | 5/2002 | Chang |
| 2002/0069374 | A1 | 6/2002 | Kopser et al. |
| 2002/0078294 | A1 | 6/2002 | Tsuchida et al. |
| 2004/0158420 | A1 | 8/2004 | Kim et al. |

FOREIGN PATENT DOCUMENTS

| | | |
|---|---|---|
| GB | 2316208 | 2/1998 |
| GB | 2320994 | 7/1998 |
| JP | 63-276935 A2 | 11/1988 |
| JP | 3087907 A2 | 4/1991 |
| JP | 04117709 A2 | 4/1992 |
| JP | 11-219587 | 8/1999 |
| WO | 94/14121 | 6/1994 |
| WO | 9815897 A1 | 4/1998 |
| WO | 99/03106 A1 | 1/1999 |
| WO | 99/19876 | 4/1999 |

OTHER PUBLICATIONS

Chang et al., "A 2 Gb/s/pin CMOS Asymmetric Serial Link," Symposium on VLSI Circuits Digest of Technical Papers, Dept. of Electrical Engineering, Stanford University, Serial Link:Jan. 24, 1998. 2 pages.

Coburn et al., "Phase-Locked Loop with Programmable Phase Offset," IP.Com Journal, IP.Com Inc., West Henrietta, NY, UH, Jul. 1, 1989, XP013025670, ISSN: 1533-001.

Dally et al., "Digital Systems Engineering" 1998, pp. 361-366. 21 pages.

Efendovich, Avner et al., Multifrequency, Zero-Jitter Delay Locked Loop, IEEE. J. Solid State Circuit, vol. 29, No. 1, Jan. 1994. 4pages.

EP Communication dated Dec. 14, 2010 re extended European Search Report for EP Application No. 10178139.1. 6 pages.

EP Extended Search Report dated Feb. 8, 2011 re EP Application No. 10178143.3. 5 pages.

EP Extended Search Report with mail date of Feb. 8, 2011 re EP Application No. 10177780.3. 7 pages.

EP Further Response dated Jun. 8, 2015 in EP Application No. 10177780.3, Includes Claims 1 to 11 of New Main Request (Highlighted and Clear copies). 9 pages.

EP Office Action dated Dec. 8, 2011 re EP Application No. 10178143.3. 5 pages.

EP Official Communication dated Sep. 9, 2011 for EP Application No. 10177780.3. 4 pages.

EP Response dated Apr. 28, 2015 in EP Application No. 10177780.3, Includes Claims 1-13 of a Main Request and Claims 1-11 of a First Auxiliary Request (Highlighted and Clear copies). 23 pages.

EP Response dated Apr. 3, 2012 to the Official Communication of Dec. 8, 2011 re EP Application No. 10178143.3, Includes New Claims (Highlighted and Clear Copy). 12 pages.

EP Response dated Feb. 23, 2011 to the Summons to Attend Oral Proceedings of Nov. 23, 2010 and of Jan. 11, 2011 re EP Application No. 07119986.3. 73 pages.

EP Response dated Jul. 11, 2011 to the Official Communication dated Mar. 14, 2011 and to the European Search Opinion dated Feb. 8, 2011 re EP Application No. 10177780.3. 17 pages.

EP Response dated Jul. 14, 2011 to the Official Communication dated Mar. 14, 2011 re EP Application No. 10178567.3 13 pages.

EP Response dated Jul. 20, 2011 to the Official Communication dated Mar. 14, 2011 re EP Application No. 10178143.3. 13 pages.

EP Response dated Jul. 21, 2011 to the Official Communication dated Jan. 31, 2011 re EP Application No. 10178139.1. 19 pages.

EP Response dated Jun. 18, 2012 to the Official Communication pursuant Article 15(1) of the Rules of Procedure of the Boards of Appeal dated Feb. 17, 2012 in EP Application No. 00972087.1-2212, Includes Sixth and Seventh Auxiliary Requests (Clear and Highlighted copies). 45 pages.

EP Response dated Mar. 19, 2012 to the Official Communication dated Sep. 9, 2011 for EP Application No. 10177780.3. 9 pages.

EP Response dated Mar. 21, 2011 to the Summons to Attend Oral Proceedings of Nov. 23, 2010 and of Jan. 11, 2011 re EP Application No. 07119986.3. 15 pages.

EP Response to Office Communication pursuant to Rule 71(3) EPC with mail date of Sep. 28, 2010, re EP Patent Application No. 05023 820.3-2212. 13 pages.

EPResponse to the Official Communication of Mar. 14, 2011, dated Jul. 11, 2011 in EP Application No. 10177780.3, Includes New Claims (Highlighted and Clear Copies) and New Description. 17 pages.

EP Summons dated Feb. 11, 2015 to attend Oral Proceedings re EP Application No. 10177780.3. 3 pages.

EP Summons dated Feb. 4, 2015 to Attend Oral Proceedings re EP Application No. 10178143.3. 3 pages.

EP Summons with mail date of Nov. 23, 2010 to Attend Oral Proceedings re EP Application No. 07119986.3. 5 pages.

Extended EP Search Report dated Feb. 8, 2011 re EP Application No. 10178567.3. 5 pages.

Gabara et al., "Digitally Adjustable Resistors in CMOS for High-Performance Applications," IEEE Journal of Solid-State Circuits, vol. 27, No. 8, Aug. 1992. 10 pages.

Intel, "440BX AGPset: 82443BX Host/Bridge/Controller Datasheet," Apr. 1998. 158 pages.

K.—Y. K. Chang et al., A 0.4-4GB/s CMOS Quad Transceiver Cell Using on-chip regulated Dual-Loop PLLs', IEEE Journal of solid state circuits, vol. 38, No. 5, May 2003.

Nakase et al.,"Source-Synchronization and Timing Vernier Techniques for 1.2 GB/s SLDRAM Interface," IEEE Journal of Solid-State Circuits, vol. 34, No. 4, Apr. 1999, pp. 494-501. 8 pages.

Official Communication pursuant to Article 94(3) EPC dated Aug. 4, 2009, for Application No. EP 07 119 986.3-2212.

(56) References Cited

OTHER PUBLICATIONS

Poulton, John, Signaling in High Performance Memory Systems, IEEE Solid State Circuits Conference, slides 1-59, Feb. 1999. 30 pages.
Response dated Feb. 10, 2010 to Official Communication dated Aug. 4, 2009 for EP Divisional Application No. 07119986.3-2212. 12 pages.
Response with mail date of Nov. 25, 2010 to the Official Communication dated Nov. 23, 2010 re EP Application No. 07119986.3. 1 page.
Response with mail date of Nov. 30, 2010 to the Official Communication dated Nov. 23, 2010 to EP Application No. 07119986.3. 5 pages.
Ryan. Kevin, 'DDR SDRAM Functionality and Controller Read Data Capture,' Micron Technology, Inc., DesignLine, 1999, pp. 1-24, vol. 8, Issue 3. 24 pages.
Sidiropoulos et al. A Semidigital Dual Delay-Locked Loop, IEEE Journal of Solid-State Circuits, vol. 32, No. 11, pp. 1683-1692, (Nov. 1997). 10 pages.
SLDRAM Consortium, "400 Mb/s/pin SLDRAM Draft/Advance Data Sheet," (pp. 1-56), Aug. 27, 1997. 56 pages.
Song et al., NRZ Timing Recovery Technique for Band-Limited Channels, IEEE Journal of Solid-State Circuits, vol. 32, No. 4, Apr. 1997, pp. 514-520. 7 pages.
Stefani, Donald G., "Offset Varies PLL's Phase Shift," EDN Electrical Design News, Reed Business Information, Highlands Ranch, CO. US, vol. 36, No. 22, Oct. 24, 1991, p. 172, XP000266602, ISSN: 0012-7515.
Tamura et al., "5 GB/s Bidirectional Balanced-Line Link Compliant with Plesiochronous Clocking", IEEE Journal of solid state circuits conference technical paper, ISSCC 2001.

\* cited by examiner

|  |  | C[4] | C[3] | C[2] | C[1] | C[0] |  | C[4] | C[3] | C[2] | C[1] | C[0] |
| --- | --- | --- | --- | --- | --- | --- | --- | --- | --- | --- | --- | --- |
| EVEN | 0 | D4 | D3 | D2 | D1 | D0 |  | ST | O3 | O2 | O1 | O0 |
| ODD | 0 | ST | O3 | O2 | O1 | O0 |  | ST | O3 | O2 | O1 | O0 |
| EVEN | 1 | M15 | M14 | M13 | M12 | M11 |  | A13 | A12 | A11 | A10 | A9 |
| ODD | 1 | A13 | A12 | A11 | A10 | A9 |  | A13 | A12 | A11 | A10 | A9 |
| EVEN | 2 | M10 | M9 | M8 | M7 | M6 |  | A8 | A7 | A6 | A5 | A4 |
| ODD | 2 | A8 | A7 | A6 | A5 | A4 |  | A8 | A7 | A6 | A5 | A4 |
| EVEN | 3 | M5 | M4 | M3 | M2 | M1 |  | X | A3 | A2 | A1 | A0 |
| ODD | 3 | M0 | A3 | A2 | A1 | A0 |  | X | A3 | A2 | A1 | A0 |

NORMAL OPERATION FORMAT      CALIBRATION MODE FORMAT

FIG. 42

MEMORY CONTROLLER THAT CALIBRATES A TRANSMIT TIMING OFFSET

RELATED APPLICATIONS

The present application is a continuation of U.S. application Ser. No. 14/859,991, filed Sep. 21, 2015, now U.S. Pat. No. 9,405,678, which is a continuation of U.S. application Ser. No. 14/613,276, filed Feb. 3, 2015, now U.S. Pat. No. 9,164,933, which is a continuation of U.S. application Ser. No. 14/154,068, filed Jan. 13, 2014, now U.S. Pat. No. 8,948,212, which is a continuation of U.S. application Ser. No. 13/447,080, filed Apr. 13, 2012, now U.S. Pat. No. 8,630,317, issued Jan. 14, 2014, which is a continuation of U.S. patent application Ser. No. 12/430,836, filed Apr. 27, 2009, now U.S. Pat. No. 8,170,067, issued May 1, 2012, which is a divisional of U.S. patent application Ser. No. 11/327,213, filed Jan. 5, 2006, now U.S. Pat. No. 7,535,933, issued May 19, 2009, which is continuation of U.S. patent application Ser. No. 10/684,618, filed Oct. 13, 2003, which is now U.S. Pat. No. 7,042,914, issued May 9, 2006, which is a continuation of U.S. patent application Ser. No. 09/421,073, filed Oct. 19, 1999, which is now U.S. Pat. No. 6,643,787, issued on Nov. 4, 2003, which are hereby incorporated by reference in their entireties.

FIELD OF THE INVENTION

The present invention relates to bus systems. More particularly, the present invention relates to a method and apparatus for optimizing the voltage and timing characteristics in a bus system, and to a method for transmitting control information during system calibration.

BACKGROUND OF THE INVENTION

Computer systems and other electrical systems typically use one or more buses to interconnect integrated circuits and other system components. Data, typically in digital form, is communicated between such circuits and components via a bus.

Recent trends in bus development have dramatically reduced the voltage swings associated with different data states on the bus. Early bus systems saw rail-to-rail voltage swings from 3.5 or 5.0 volts down to zero volts. More contemporary bus systems provide voltage swings of less than 1 volt. Limited voltage swings have resulted in reduced power dissipation and lower levels of induced noise on the bus. These reductions are particularly important in the context of bus systems running at ever increasing clock rates.

However, reduced voltage swings and increasing data rates pose considerable problems to the system designer. Reduced voltage swings necessarily provide reduced voltage margins. That is, the ability of system components to distinguish one data state from another on the bus is reduced as the upper and lower swing thresholds move closer together. Similarly, increasing operating frequencies require system components to detect data on the bus during shorter and shorter time intervals. Accordingly, voltage and timing margins for bus signals are often limiting factors in determining overall system performance.

FIG. 1 is a simple block diagram of a bus system comprising a master 11 and slaves 12a-12n connected via a data bus 30 and a folded clock signal (Clock-To-Master "CTM" and Clock-From-Master "CFM"). As shown in the related signal timing diagram of FIG. 2, valid data is apparent on the data bus during a period T. Ideally, the data signal would be clearly defined at VHI for a first data state and at VLO for a second data state. VHI and VLO would be equally spaced above and below a reference voltage, Vref. Such ideal relationships would provide maximum voltage margin between high and low data states, and correspondingly optimal signal detection capabilities for system components.

Additionally, data would be detected at time t1 during the "data eye," i.e., the period ("tbit") during which valid data is on the bus between data transition periods. Time t1 corresponds to center of the data eye and provides maximum timing margin (½ tbit) for data detection between data transition periods.

Unfortunately, the ideal voltage and timing margins illustrated in FIG. 2 do not exist in actual bus systems. FIGS. 3A and 3B illustrate typical timing skews between the ideal occurrence of a clock signal within the data eye and actual occurrences. Such clock timing skews arise from many possible sources, such as differences in the manufacture of signal line traces on printed circuit boards, or differences in signal flight time due to the buildup of standing waves induced by signal and clock reflections and noise on signal lines.

In FIG. 3A, a CTM signal transition occurs early in the data eye by a period $\delta$ before the ideal placement of the CTM transition. In other words, the master reads data from a slave too early relative to the clock by a time $\delta$. In FIG. 3B, the CFM signal occurs late in the data eye by the same time. Thus, the master writes data into the slave too late in the data eye by time $\delta$.

Slight differences in the actual timing of the clock signal and/or the data signal will result in a shift of their ideal timing relationship. In addition, the bidirectional nature of some signal lines in the bus system will result in timing shifts of different polarities depending on the direction of data flow.

Each one of the multiple slaves connected to the bus might have a different and unpredictable timing error in relation to the ideal clock placement. Such errors reduce the overall timing margin in the system. Further, as actual transition times wander, the hazard arises that a device will attempt to read data during a data transition period, i.e., during a period where the data is not valid on the bus. This hazard increases with system operating frequency.

A comparison between FIGS. 4A and 4B illustrates the problem of voltage errors in the bus system of FIG. 1. In FIG. 4A, ideal relationships between VHI, VLO, and Vref are shown, where the voltage swing from VHI to Vref is the same as the voltage swing from Vref to VLO. In one embodiment, VHI is 1.8 volts, Vref is 1.4 volts, and VLO is 1.0 volts. In contrast, the voltage swing from VHI to Vref in FIG. 4B is much less than the voltage swing from Vref to VLO. Such an unequal relationship dramatically reduces the voltage margin for accurately detecting a data value on the bus associated with VHI.

Where the bus system of FIG. 1 uses single-ended data and a single reference voltage, as explained below in greater detail, the presence of voltage errors is particularly harmful. For such systems, a reference voltage (Vref) centered between VHI and VLO, such as shown in FIG. 4A, would provide maximum voltage margin.

Unfortunately, a number of system phenomena prevent the stable, centered positioning of VHI and VLO about Vref. For example, channel-DC resistance induces voltage errors in current mode signaling systems. With channel-DC resistance, a write data eye can shift in voltage as it goes down the signaling channel. That is, slaves further away from the master are likely to experience smaller voltage swings than the swings of slaves closer to the master, simply due to increasing channel-DC resistance which forms a voltage divider with the termination resistance. In addition, setting output voltage levels to be symmetric about Vref in manufactured systems which experience real process, voltage, and temperature variations is very difficult.

At some point, like the timing errors illustrated above, voltage errors will result in a data error. At a minimum, the presence of voltage errors will reduce the voltage margins allowed within a bus system.

Recognizing the inevitable degradation of the timing and voltage characteristics of bus system signals and the problems associated with same, conventional bus systems sought to compensate for the timing and voltage errors by gross adjustments of the data and/or clock signals in the master. This approach improved signaling margins where degradations were predictable, or where a very limited number of components were connected to a simple bus. However, as bus systems have increased in complexity and size, it has become clear that many factors adversely impacting timing and voltage margins are unique to individual slave devices, or to the relative position of the slave to the master within the overall system.

Thus, the conventional use of timing and voltage offsets in the master has proven ineffective in contemporary bus systems. Similarly, the use of vernier re-calibration techniques has resulted in inconsistent system performance and unacceptable bandwidth degradation in high frequency systems. Accordingly, a need remains for an approach to timing and voltage error compensation which is reliable and well adapted to complex, high frequency bus systems.

SUMMARY OF THE INVENTION

A system includes a first integrated circuit device and a second integrated circuit device. The first device transmits a data sequence to the second integrated circuit device, and the second device samples the data sequence to produce receiver data. The second device then transmits the receiver data back to the first device. Within the first integrated circuit device, a comparison between the data sequence and the receiver data is performed, and based on the comparison, the first device generates information representative of a calibrated timing offset. The first device uses the information representative of the calibrated timing offset to adjust timing associated with transferring write data from the first integrated circuit to the second integrated circuit.

BRIEF DESCRIPTION OF THE DRAWINGS

FIG. 42 illustrates changes in the format of an exemplary control information packet as between normal mode of operation and a calibration mode of operation.

DETAILED DESCRIPTION OF THE PREFERRED EMBODIMENTS

Figure 1:
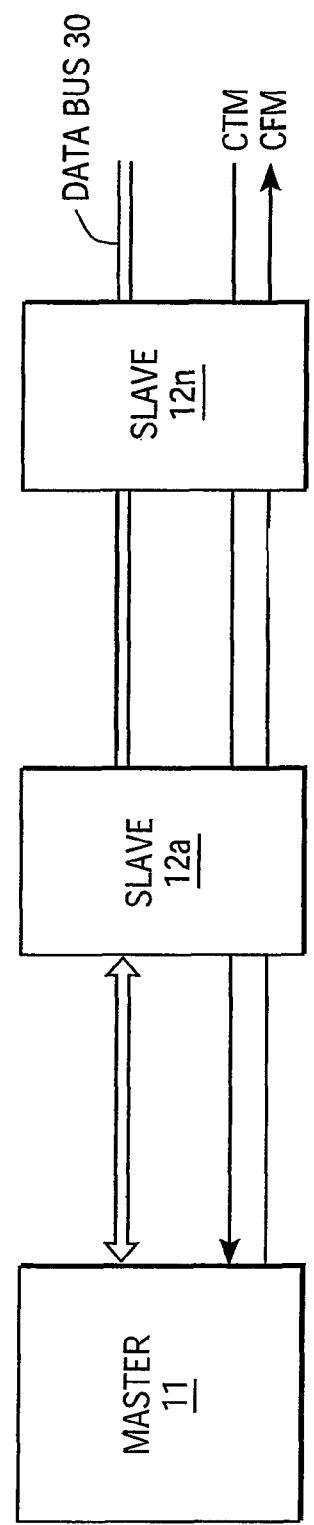
FIG. 1 is a block diagram of a bus system.
Figure 2:
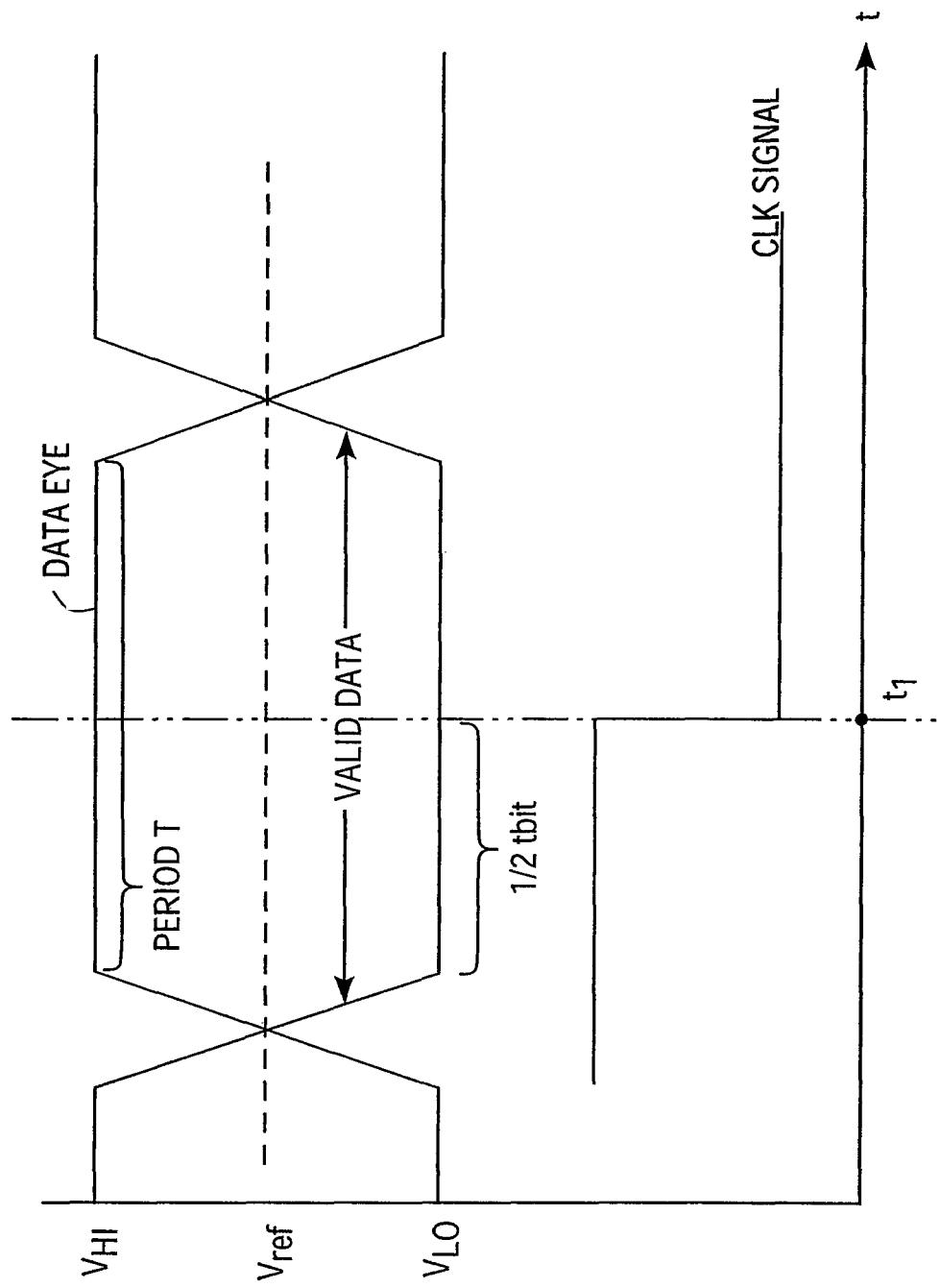
FIG. 2 is a timing diagram illustrating an ideal relationship between a data eye and a read/write clock signal.
Figure 5:
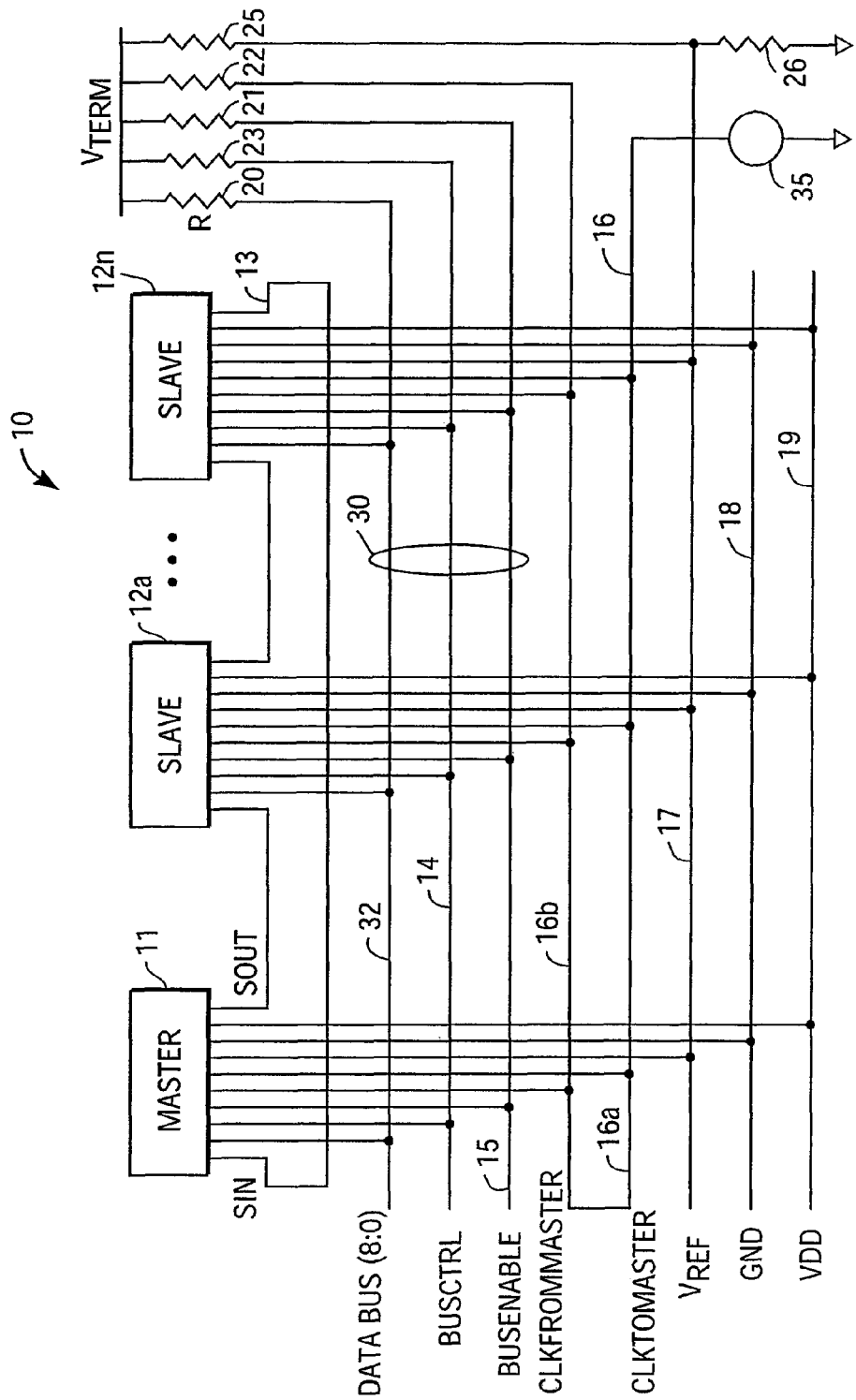
FIG. 5 is a block diagram of a bus system showing exemplary channel signaling in some greater detail.

In order to better understand the use, implementation, and associated benefits of the present invention, a general bus system readily adapted to the present invention will be described with reference to FIG. 5. In the block diagram of FIG. 5, a bus system 10, shown in some additional detail with reference to the bus system shown in FIG. 1, comprises bus 30 coupled between a master 11 and a plurality of slaves 12a-12n. Bus 30 is a high speed, low voltage swing bus comprising multiple signal lines and transferring data between slaves 12a-12n and master 11.

Master 11 and each slave 12a-12n typically include an interface circuit (not shown) coupling the respective device to bus 30. Within bus system 10, a master can communicate with another master (not shown) and with slaves 12a-12n. In contrast, slaves only communicate with masters.

Master 11 contains intelligence and generates commands to the slaves. Master 11 may be a microprocessor, a digital signal processor, a graphics processor, peripheral controller, an input/output (I/O) controller, a DMA controller, a memory controller, a communications device, or some other type of intelligent controller.

Slaves require only a low level of intelligence. In one preferred embodiment, slaves 12a-12n are DRAMs, but might be one or more other types of memory devices including electrically programmable read only memories (EPROMs), flash EPROMs, random access memories (RAMs), static RAMs (SRAMs), video RAMs (VRAMs), etc. In another embodiment, slaves 12a-12n are bus transceivers.

Master 11 and slaves 12a-12n each include Data Bus [8:0] pins, at least one BusCtrl pin and BusEnable pin, a ClkToMaster ("CTM") pin, a ClkFrom Master ("CFM") pin, and a Vref pin. These pins receive and transmit low voltage swing signals and correspond to the channel signal line(s) and buses shown in FIG. 5. In the illustrated embodiment, a nine-bit data bus is assumed. However, one of ordinary skill in the art will understand that the data bus might include any reasonable number of signal lines, and is typically part of a larger communication channel having a control bus and/or an address bus.

Master 11 may be configured to communicate control information to slaves 12a-12n in many different ways. The BusCtrl 14 and BusEnable 15 signal paths shown in FIG. 5 are typical of such configurations, and may each comprise a single signal line or a number of signal lines. Further, master 11 and slaves 12a-12n may comprise a daisy chained, initialization signal line connected between the SOut and SIn pins shown in FIG. 5.

Data bus signal lines 32 transfer data between master 11 and slaves 12a-12n. The data bus signal lines 32 are transmission lines having controlled impedances. Each data bus signal line 32 is terminated at one end in a termination resistor (collectively shown as 20). The termination resistors are coupled to a termination voltage, Vterm. The resistance value R of each termination resistor 20 is equal to the line impedance of its data bus signal line 32. Such a configuration helps prevent unwanted signal reflections on the signal line. Other signal lines in memory system 10, such as BusCtrl line 14, BusEnable line 15, CTM line 16a, and CFM line 16b, are similarly terminated by termination resistors 23, 21, 22, respectively.

Clock line 16 is coupled at one end to a clock 35. In one embodiment, clock 35 is external to and independent of master 11 and slaves 12a-12n. The clock signal generated by clock 35 is carried by clock line 16 to master 11 and slaves 12a-12n. Clock line 16 is folded back to form two line segments 16a and 16b. Segment 16a carries the CTM signal, and segment 16b carries the CFM signal.

Bus system 10 also includes a reference voltage line 17 that couples Vref to each of master 11 and slaves 12a-12n. As shown in FIG. 5, voltage Vref is generated in a voltage divider formed by resistors 25 and 26 between termination voltage Vterm and ground. In addition to Vref, master 11 and slaves 12a-12n are connected to ground (GND) via line 18 and a source voltage VDD via line 19.

In bus system 10, data driven by master 11 propagates past slaves 12a-12n along bus 30. Slaves 12a-12n are able to "sense" the data on the bus in accordance with control information sent from master 11. For example, the master might initiate a transfer of data by broadcasting an access request packet. Each slave 12a-12n decodes the access request packet and determines whether it has been selected to respond. If selected, the slave then responds appropriately by, for example, accepting data from the data bus in a Write operation, or driving data onto the data bus in a Read operation.

The foregoing system is exemplary of systems characterized by single-ended data transmission/reception over a bus consisting of multiple, impedance balanced signal lines. Data is transmitted at a relatively high frequency over these signal lines in relation to a single reference voltage. Such a system is susceptible to the timing errors and voltage errors as described above.

As will be seen hereafter, the present invention optimizes bus transmission conditions by minimizing overall timing and voltage errors. Operating margins for the system are improved accordingly, and data is communicated with greater reliability.

Fundamentally, bus systems operate in two phases; a calibration phase in which system operating parameters may be determined and a normal operation phase in which data is transferred at high speed in accordance with the parameters established during the calibration phase. Effective calibration of the bus system's operating parameters presents a number of concerns which will be discussed in detail below.

Signal Timing Adjustment

In a first general aspect, the present invention provides a system and method by which individual slave devices adjust their read and/or write timing to "slave" to a master clock signal. This aspect of the present invention is explained with reference to FIG. 6.

Figure 6:
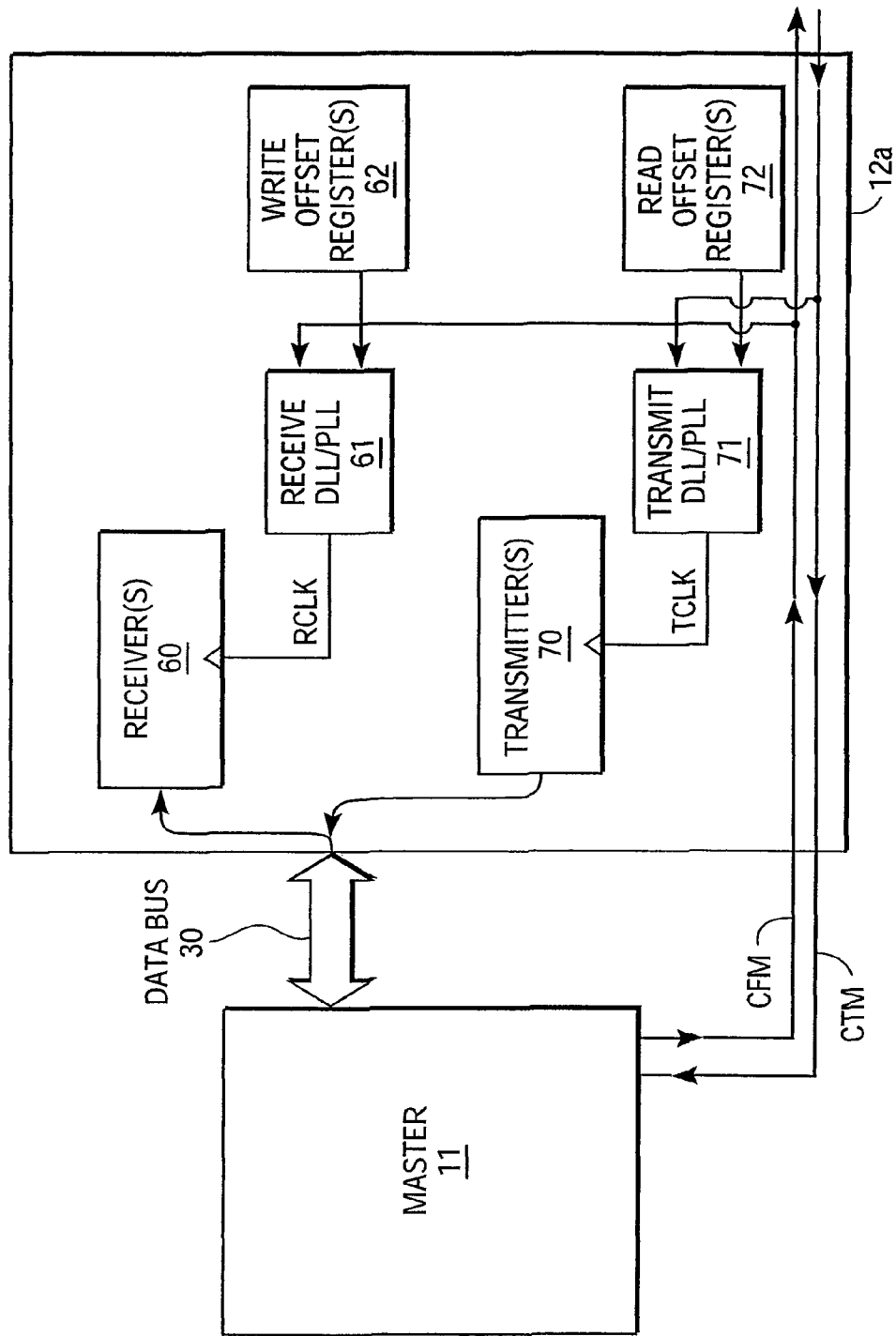
FIG. 6 is a block diagram generally illustrating the timing adjustment aspect of the present invention as applied to a typical slave device/master device relationship.

FIG. 6 further illustrates the relationship between master 11 and slave 12a within the context of the present invention. It is contemplated that all slaves 12a-12n of FIG. 5 would be configured as is the slave illustrated in FIG. 6, but for the sake of simplicity only one slave is shown. Further, considerable detail unrelated to the present invention has been omitted from the system shown in FIG. 6.

Slave 12a comprises one or more receivers 60 and one or more transmitters 70 connected to data bus 30. Data sent from master 11 is communicated via data bus 30 to receivers 60. Data sent to master 11 from slave 12a is placed on data bus 30 by transmitters 70. The construction of receivers 60 and transmitters 70 is conventional and determined by the nature of the slave device and bus system.

Synchronous receipt of data by receivers 60 and synchronous transmission of data by transmitters 70 are respectively controlled by a Receive-clock signal (RCLK) and a Transmit-clock signal (TCLK). These signals are indicative of a class of clock signals gating data to/from the slave device and are referred to as "internal read/write clocking signals." The RCLK signal is derived from the operation of a Receive Delay-Locked-Loop or Phase-Locked-Loop (DLL/PLL) circuit 61 and a Write Offset Register 62. While a DLL or PLL is presently preferred, any clocking circuit capable of accurately generating the internal read/write clock signal in relation to the master clock signal and the offset value may be used. The TCLK signal is derived from the operation of a Transmit DLL/PLL circuit 71 and a Read Offset Register 72. As seen hereafter, both RCLK and TCLK are preferably derived in relation to the CTM and/or the CFM signals, but any clock signal might serve as the master clock signal.

The Receive DLL/PLL 61 and Transmit DLL/PLL 71 may be separately implemented, or implemented in a single clocking circuit using well understood design principles. For example, commonly assigned U.S. patent application Ser. No. 08/795,657, now U.S. Pat. No. 6,125,157, illustrates several possible implementations of a DLL/PLL circuit. U.S. Pat. No. 5,614,855 also discloses a competent DLL circuit.

Write Offset Register 62 stores an offset value established during system calibration or initialization. The stored offset value defines a timing adjustment, as required, to RCLK in relation to the master clock signal (e.g., CFM, as shown in FIG. 6).

Figure 3:
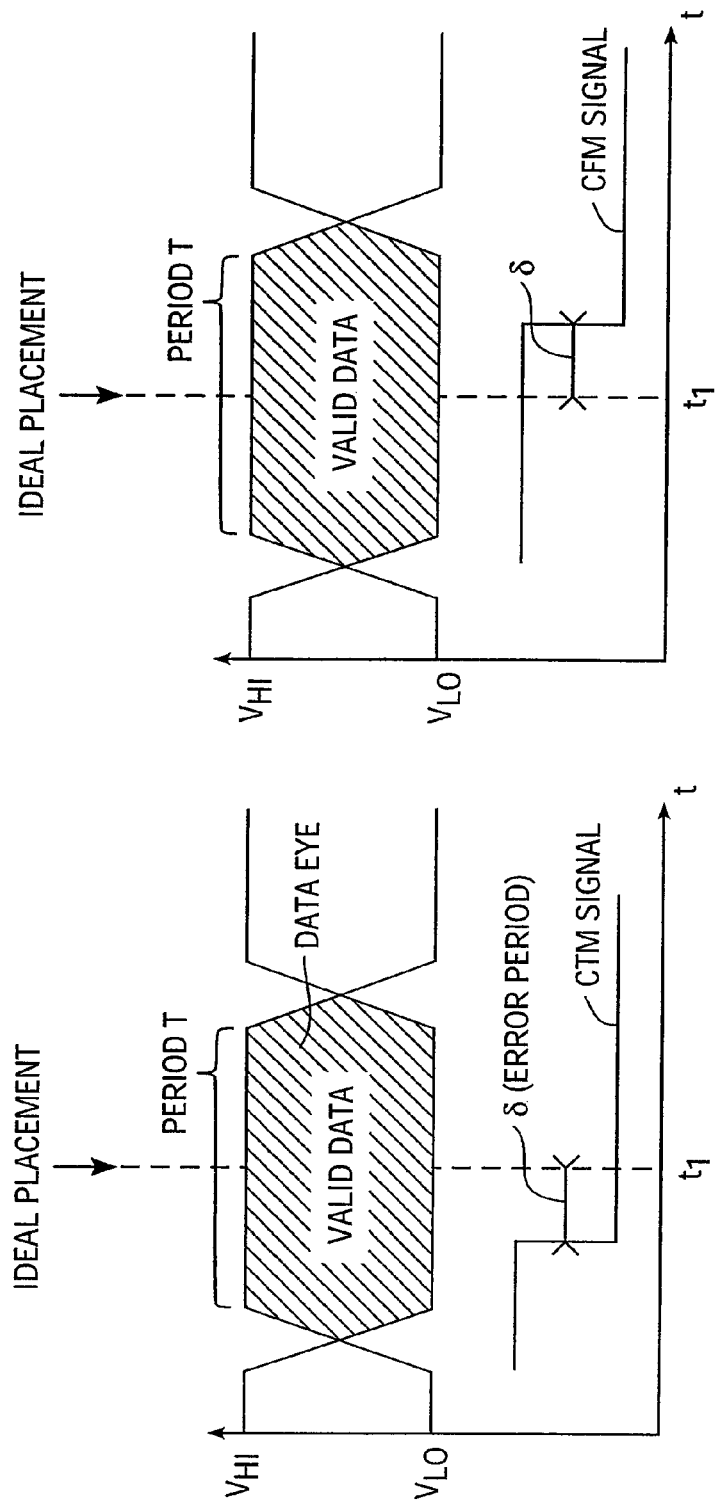
FIGS. 3A and 3B are timing diagrams illustrating typical timing relationships between a data eye and a read/write clock signal.

For example, the individual timing characteristics of slave 12a in relation to the master clock signal are evaluated and adjusted during the calibration phase of operation, typically during system initialization. If the unadjusted application of the master clock signal to slave 12a results in a Write operation execution outside of the center of the data eye, see FIG. 3B, then an offset value corresponding to the timing error δ (lead or lag) is calculated and stored in Write Offset Register 62. This offset value, when applied to the Receive DLL/PLL circuit 61 adjusts the timing of the RCLK signal such that data is accepted from data bus 30 in the center of the data eye, thereby compensating for any Write operation timing errors.

This timing error compensation is made individually to slave 12a, and is maintained, i.e., locked, by the DLL/PLL. The master clock signal remains fixed. No timing adjustment or compensation is required within master 11. The Write timing for each slave in the system may be individually adjusted in this manner.

The same holds true for the Read timing of each slave. The offset value stored in Read Offset Register 72 is similarly defined and applied to adjust, as required, the Read timing of slave 12a.

The block diagram of FIG. 6 illustrates the relationship of the timing adjustment circuit(s) to the receivers and transmitters in a slave device, to a master device, and to a master clock signal. FIGS. 7 through 11 illustrate several embodiments of these circuits in additional detail. Each of these several embodiments is capable of providing an offset in a slave device DLL/PLL without consuming excessive power or occupying a significant area within the slave device.

Figure 7:
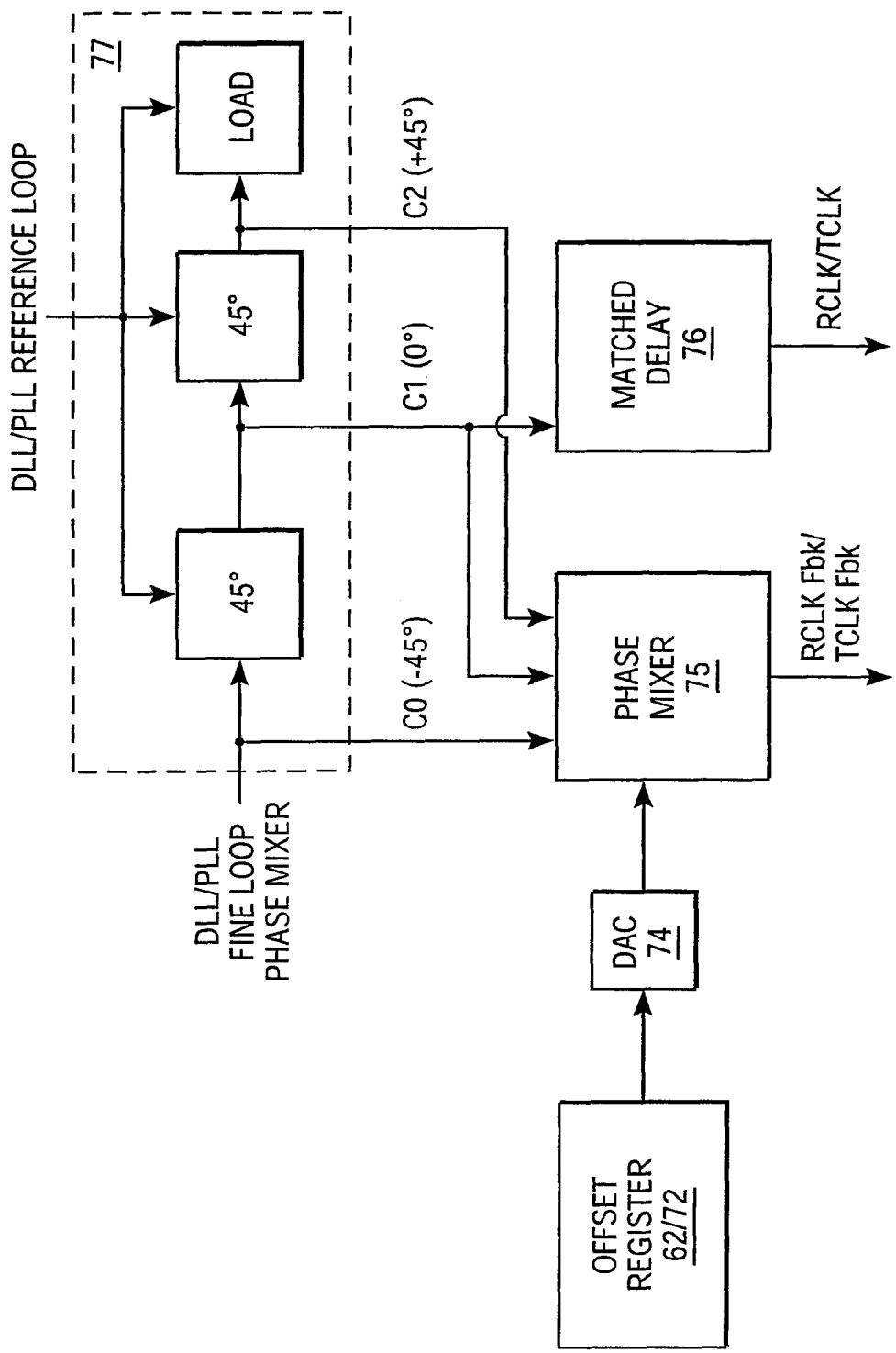
FIG. 7 is a circuit diagram showing a first embodiment of a timing offset circuit according to the present invention.

The circuit shown in FIG. 7 takes full advantage of signals typically apparent in conventional DLL/PLL circuits. In the illustrated example, a clock from the DLL/PLL reference loop is acquired along with a 45° earlier version of the output clock taken from the fine loop phase mixer. These inputs are applied to a vector circuit 77 which may comprise two 45° phase shift blocks and a corresponding load. With this arrangement, vector circuit 77 outputs the original −45° input (C0), a 0° output from the first 45° phase shift block (C1), and a +45° output from the second 45° phase shift block (C2). The 0° output from the first 45° phase shift block is output as either RCLK or TCLK through a matched delay circuit 76.

The three outputs (C0, C1, and C2) from vector circuit 77 are applied to a phase mixer 75. By phase mixing (i.e., interpolating) the three signals, phase mixer 75 is able to generate an offset feedback signal varying between −45° and +45°. The actual value of this offset feedback signal, which is returned as a feedback control signal to the DLL/PLL, is defined by the offset value stored in the Offset Register (62 or 72). The offset value is applied to Phase Mixer 75 through a digital-to-analog (DAC) converter 74. In this manner, system timing is conveniently adjusted using 45° sections of the DLL/PLL reference loop. Thus, this embodiment is able to adjust timing of RCLK/TCLK between −45° and +45°. Of note, the timing adjustments provided by the circuit in FIG. 7 are made in degrees such that the adjustment capability will scale in relation to the system operating frequency.

Figure 8:
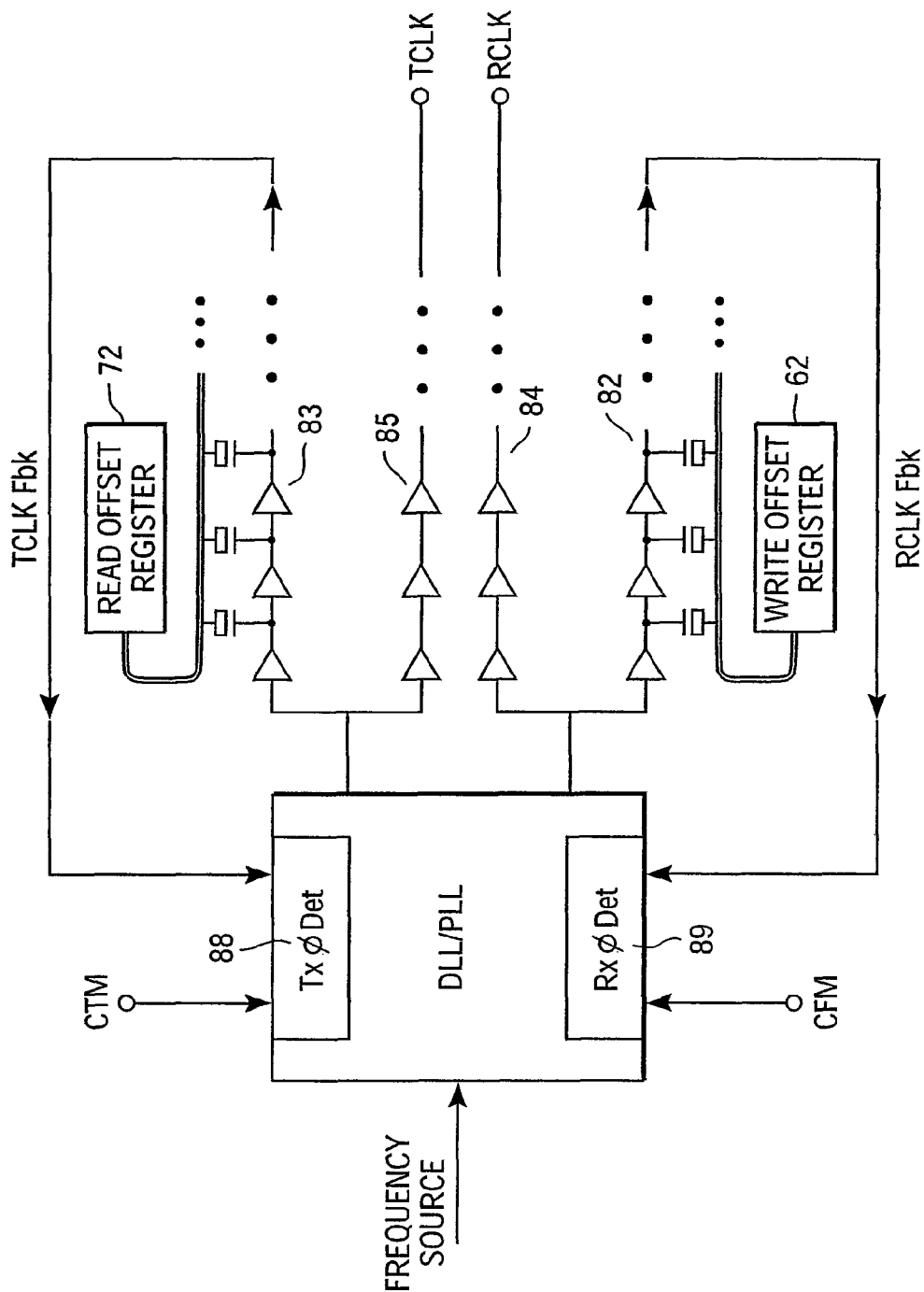
FIG. 8 is a circuit diagram showing a second embodiment of a timing offset circuit according to the present invention.

In contrast, the circuit shown in FIG. 8 provides timing adjustment by changing an absolute time delay. The approach implemented by the circuit in FIG. 8 cannot be scaled with the operating frequency and is more susceptible to manufacturing process, voltage and temperature variations, but it is easy to implement and uses a relatively smaller device area.

In the circuit of FIG. 8, the DLL/PLL receives a clock signal or stable frequency source in addition to the CTM and CFM signals which are applied to a transmit phase (φ) detector 88 and a receive phase (φ) detector 89, respectively. (Alternatively, CTM or CFM may be used as the frequency source). Transmit phase detector 88 also receives the TCLK feedback signal, TCLKFbk. Receive phase detector 89 similarly receives the RCLK feedback signal, RCLKFbk. The RCLK and TCLK signals are each output through a respective clock buffer chain 84 and 85.

The feedback signals RCLKFbk and TCLKFbk are adjusted by adding or subtracting loads and thus adjusting the delay of a chain of inverters, 82 and 83, selected according to the offset value stored respectively in Write Offset Register 62 and Read Offset Register 72. The individual bits of the stored offset values may be configured to drive the enabling nodes of corresponding MOS capacitors to effect a binary weighted variable load in the feedback paths of RCLKFbk and TCLKFbk to the DLL/PLL circuit.

Figure 9:
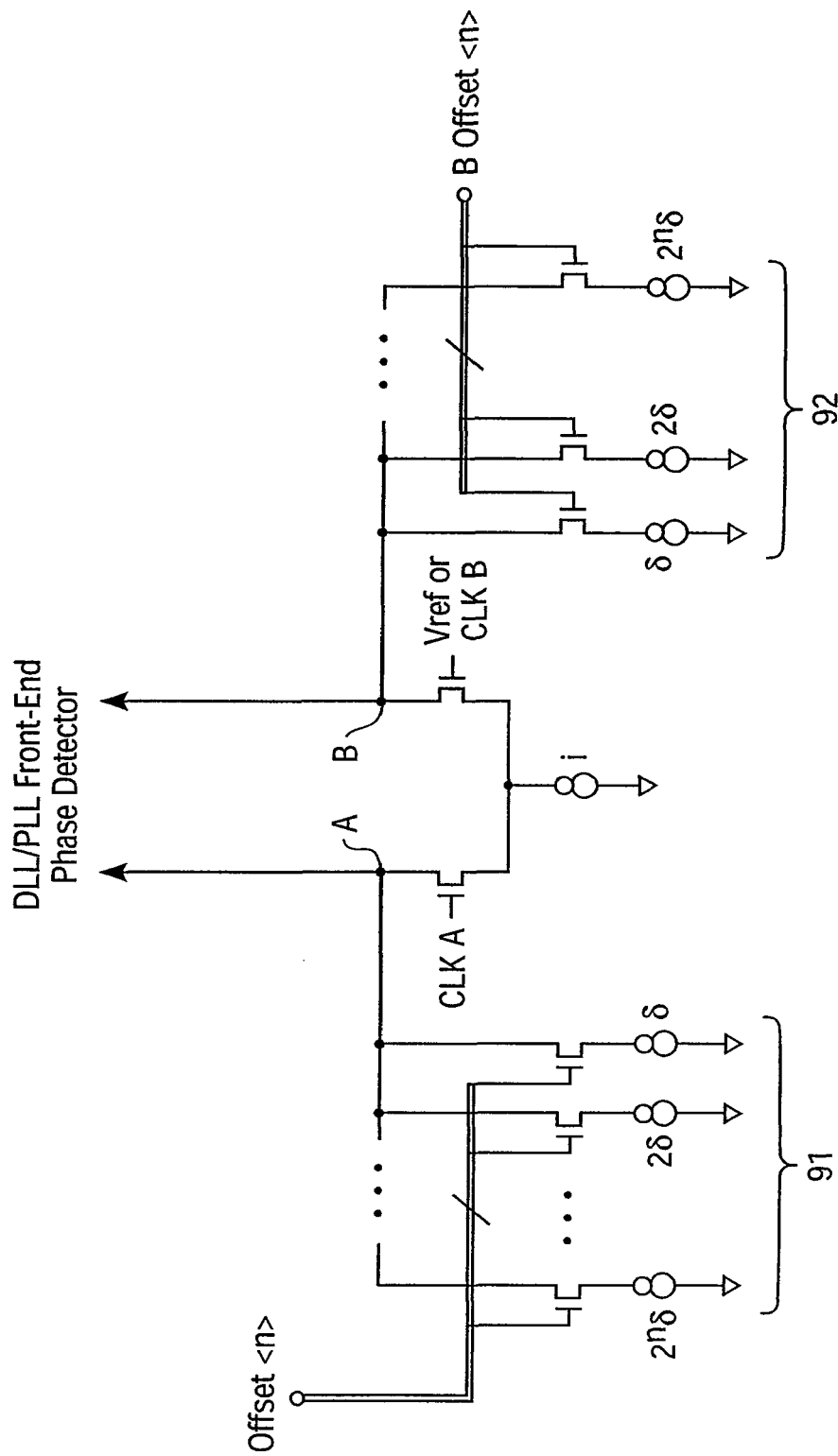
FIG. 9 is a circuit diagram showing a third embodiment of a timing offset circuit according to the present invention.

Another technique for providing timing offset is illustrated by the circuit shown in FIG. 9 which is analogous in operation to the circuit shown in FIG. 8. This technique uses binary-weighted current sources to place an offset current into the input (front-end) differential pair of the PLL/DLL phase detector. See 88 or 89 in FIG. 8. This offset current "pre-tilts" the input comparator one way or the other. This pre-tilt shifts the setup/hold window by adjusting the effective cross-point. The circuit shown in FIG. 9 requires a very small area on the slave device, even smaller than the circuit shown in FIG. 8. However, it should be recognized that the offset generated in this manner is really a voltage offset which only produces a corresponding timing offset when multiplied by the input edge rate. As a result, the offset is subject to not only process, voltage, and temperature variations, but also variation in the input-edge rate.

With reference to FIG. 9, the output of binary-weighted current sources in a first chain of current sources 91 are summed in node A in accordance with a first set (A) of offset bits (1 . . . n). Similarly, the output of binary-weighted current sources in a second chain of current sources 92 are summed in node B in accordance with a second set (B) of offset bits (1 . . . n). The first and second sets of offset bits are stored in an Offset Register, such as the Read Offset Register 72 or the Write Offset Register 62 of FIGS. 6 and 8.

Figure 10:
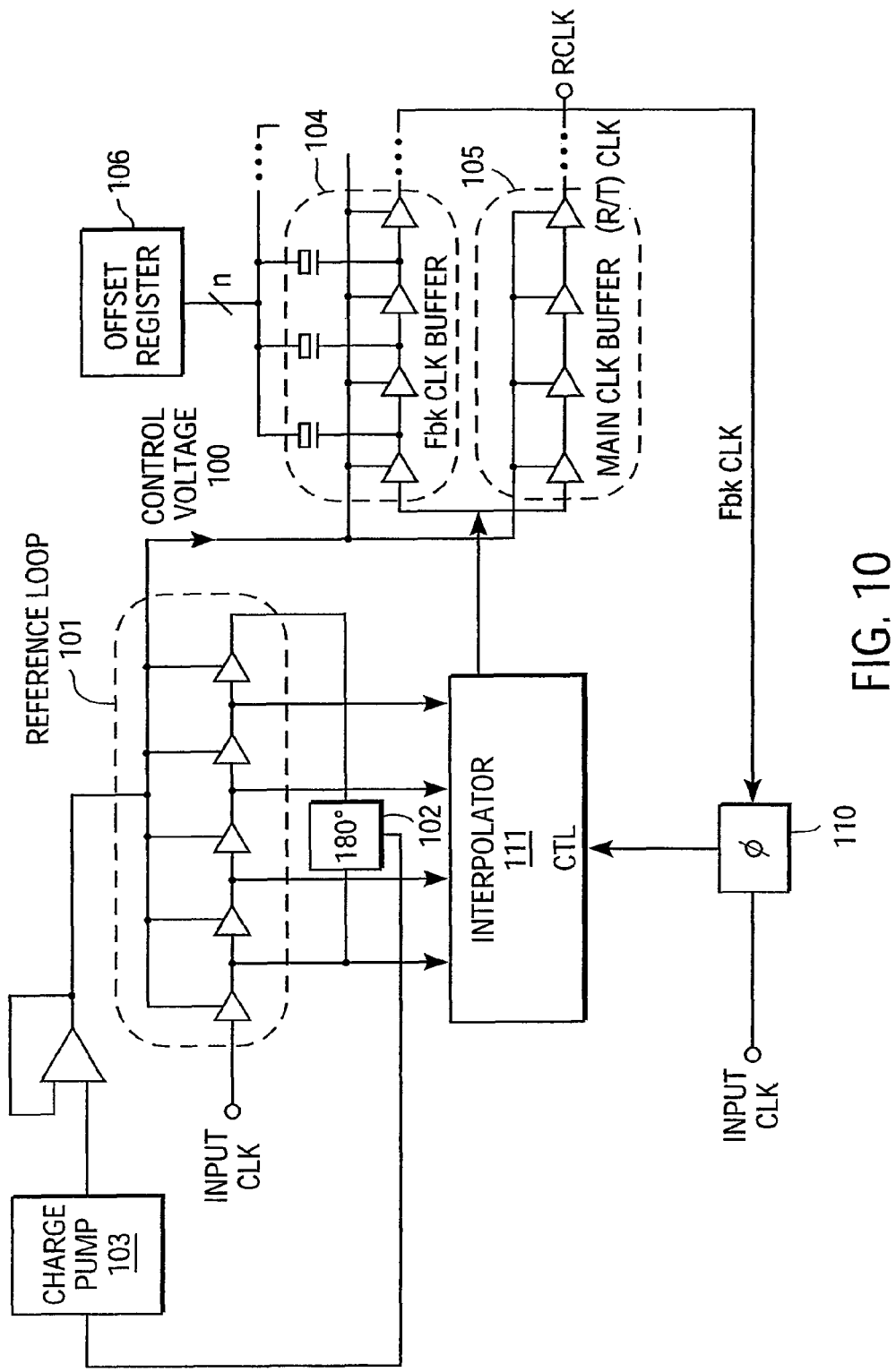
FIG. 10 is a circuit diagram showing a fourth embodiment of a timing offset circuit according to the present invention.

Another technique for generating a constant (in degrees) phase offset is illustrated in FIG. 10. This technique employs a DLL utilizing delay elements with an adjustable supply voltage. In this embodiment, a reference loop control voltage 100 is set by a feedback reference loop 101 to an appropriate value such that the delay of a number of static, or semi-static, gates spans 0 to 180° of the clock period. Reference loop 101 receives an input clock signal and operates with phase detector 102 and charge pump 103. This feedback reference loop 101 essentially sets the supply voltage (control voltage 100) of the static gates such that their RC time constant is an appropriate fraction of the clock cycle.

The reference loop control voltage (Vc) 100 is used to drive the peripheral loop interpolators as well as a portion of the main clock (CLK) buffer 105 and feedback clock (FbkCLK) buffer 104. The FbkCLK signal is applied along with the input clock signal to phase detector 110. The output signal of phase detector 110 is applied to Interpolator 111 which also receives selected phase signals from reference loop 101.

By virtue of the fact that the delay-vs-supply characteristics of the reference loop buffers and the main and feedback buffers closely track one another, the offset introduced by changing the load capacitance of the feedback clock buffer 104 stays constant over supply and temperature variations. For example, assume that the clock cycle is Tc and the required offset is To. The reference loop will set Vc, such that N*R*Cref=Tc/2, where N is the number of buffers in the reference loop, and R and C are the resistance and capacitance associated with each buffer in the reference loop. Offset control register 106 will set the delay of the feedback clock buffer to differ from the main clock buffer by To=M*R*Cfb, where M is the number of buffers in the main clock buffer and R and Cfb are resistance and capacitance associated with each buffer in the main clock buffer. Since voltage and temperature variations do not affect N, Cref, M, Cfb, and since the reference loop adjusts R such that N*R*Cref always equals Tc/2, it follows that the ratio of To and Tc stays constant in the first order.

The specific implementation shown in FIG. 10 uses digitally controlled capacitance to adjust the delay of feedback clock buffer 104. The same result can be accomplished by changing the resistance of the buffers, i.e., controlling their width, or by multiplexing between two or more of the delay buffers. Both of these alternatives have the property that they generate an offset which stays constant relative to the clock period.

Figure 11:
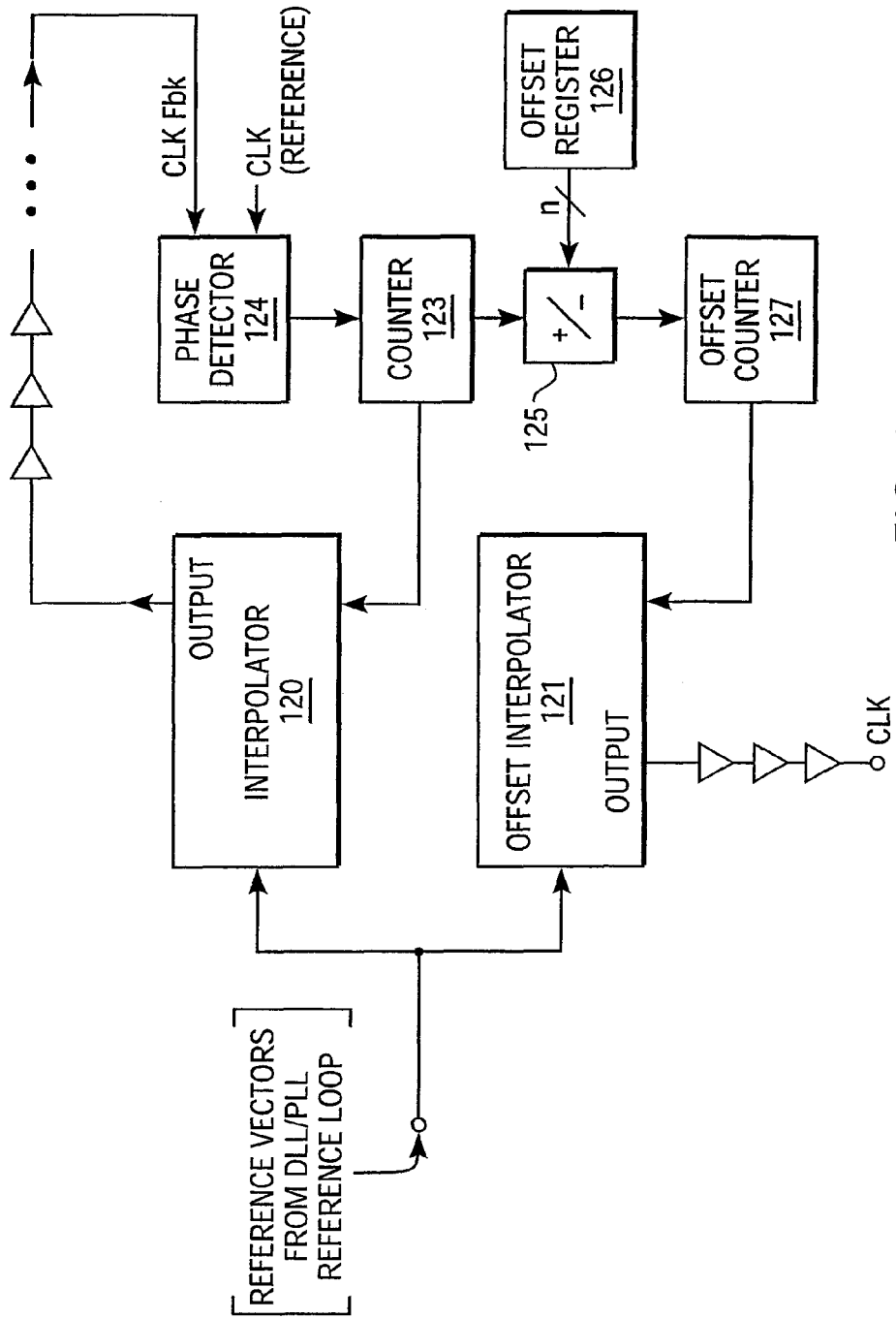
FIG. 11 is a circuit diagram showing a fifth embodiment of a timing offset circuit according to the present invention.

Like the exemplary circuits shown in FIGS. 7 and 10, the circuit of FIG. 11 provides timing adjustment in degrees. However, in the embodiment shown in FIG. 11, a full offset interpolator 121 is used in conjunction with a primary interpolator 120. Both interpolators receive a set of input or reference vectors from the DLL/PLL reference loop like, for example, those shown in FIG. 7. The primary Interpolator 120 generates a feedback signal (CLKFbk) based on the reference vectors and the output of counter 123. Counter 123 receives the output of phase detector 124 which compares the CLKFbk signal with a reference clock signal, such as CTM or CFM.

The output of counter 123 is also applied to adder circuit 125 which adds or subtracts, the offset value (n bits) stored in Offset Register 126. The adder result is then applied to Offset Counter 127, the output of which is applied to Offset Interpolator 121. Based on the reference vectors from the DLL/PLL reference loop and the Offset Counter output, Offset Interpolator 121 generates a clock signal (CLK).

Thus, Offset Interpolator 121 uses the same basic input vectors as the primary Interpolator 120 but has an offset register value added or subtracted from its mixing control value. The feedback clock (CLKFbk) used to close the control loop can be either the output of the primary Interpolator 120 (as shown), or that of the Offset Interpolator 121, recognizing that the difference is that one output will have an offset register value opposite (i.e., the polarity is inverted) that of the other.

The implementation illustrated in FIG. 11 provides an arbitrary phase offset, i.e., one ranging a full 360°. Since this offset is provided in degrees rather than absolute time (picoseconds of adjustment) the offset is stable with respect to process, voltage, temperature (PVT) and frequency. Its size is comparable to that of the foregoing exemplary implementations.

Duty Cycle Adjustment

Up to this point timing errors have been described in the context of read/write clock signals skewed in relation to data eyes. Using any one of the mechanisms described above, a properly adjusted read/write clock signal may be developed for each slave device to maximize clock signal margins in relation to data appearing on the data bus. For the sake of clarity, the examples illustrated above describe data being communicated on one edge of the read/write clock. However, many contemporary bus systems communicate data between a master and one or more slaves using more than one edge of a clock signal or using multiple clocks having different phases. Alternatively, contemporary systems communicate multiple bits in relation to a single clock edge, but using different phase offsets. The use of multiple clock edges or multiple clocks at different phases results in an additional source of timing errors in the bus system, namely duty cycle errors. This problem is illustrated for an exemplary double data rate (DDR) system in FIGS. 12A and 12B.

Figure 12A:
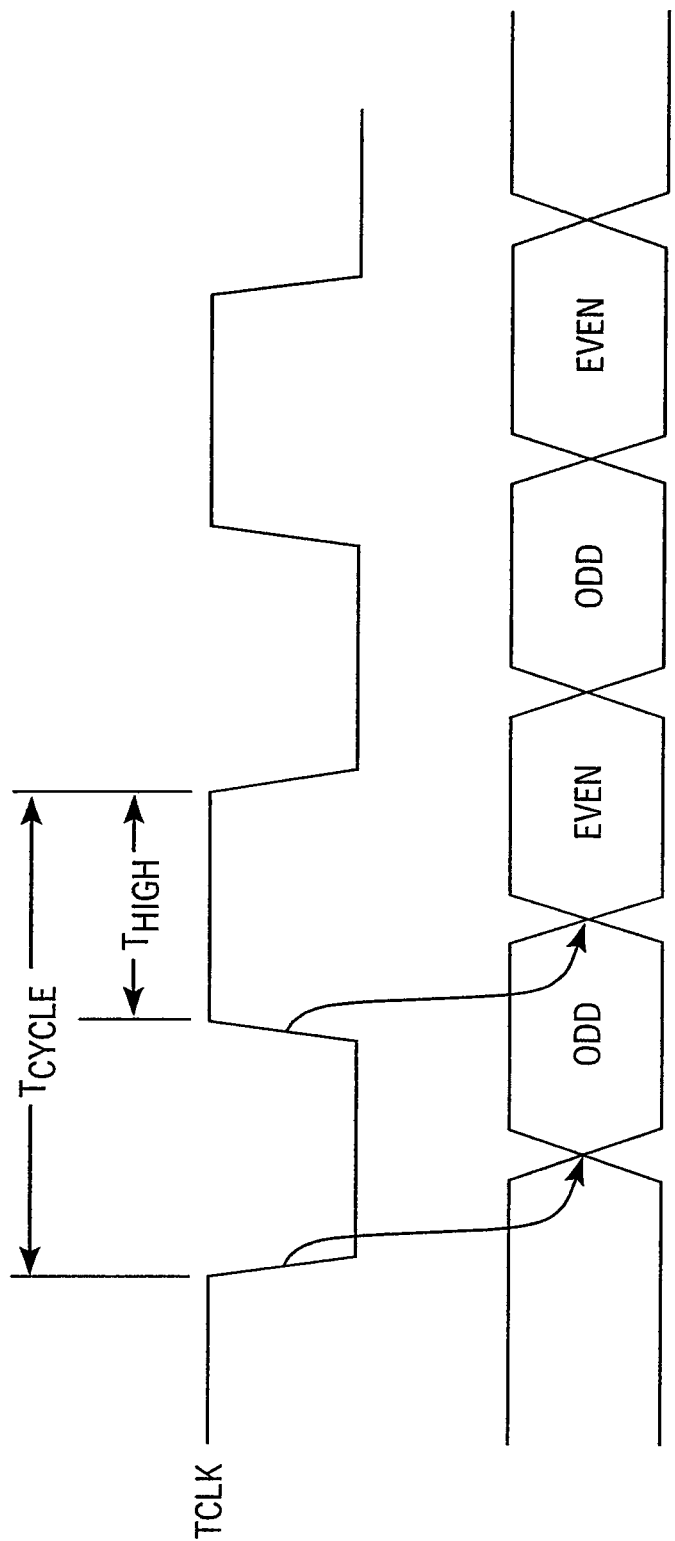
FIGS. 12A and 12B illustrate data transmission timings in an exemplary double-data-rate system.
Figure 12B:
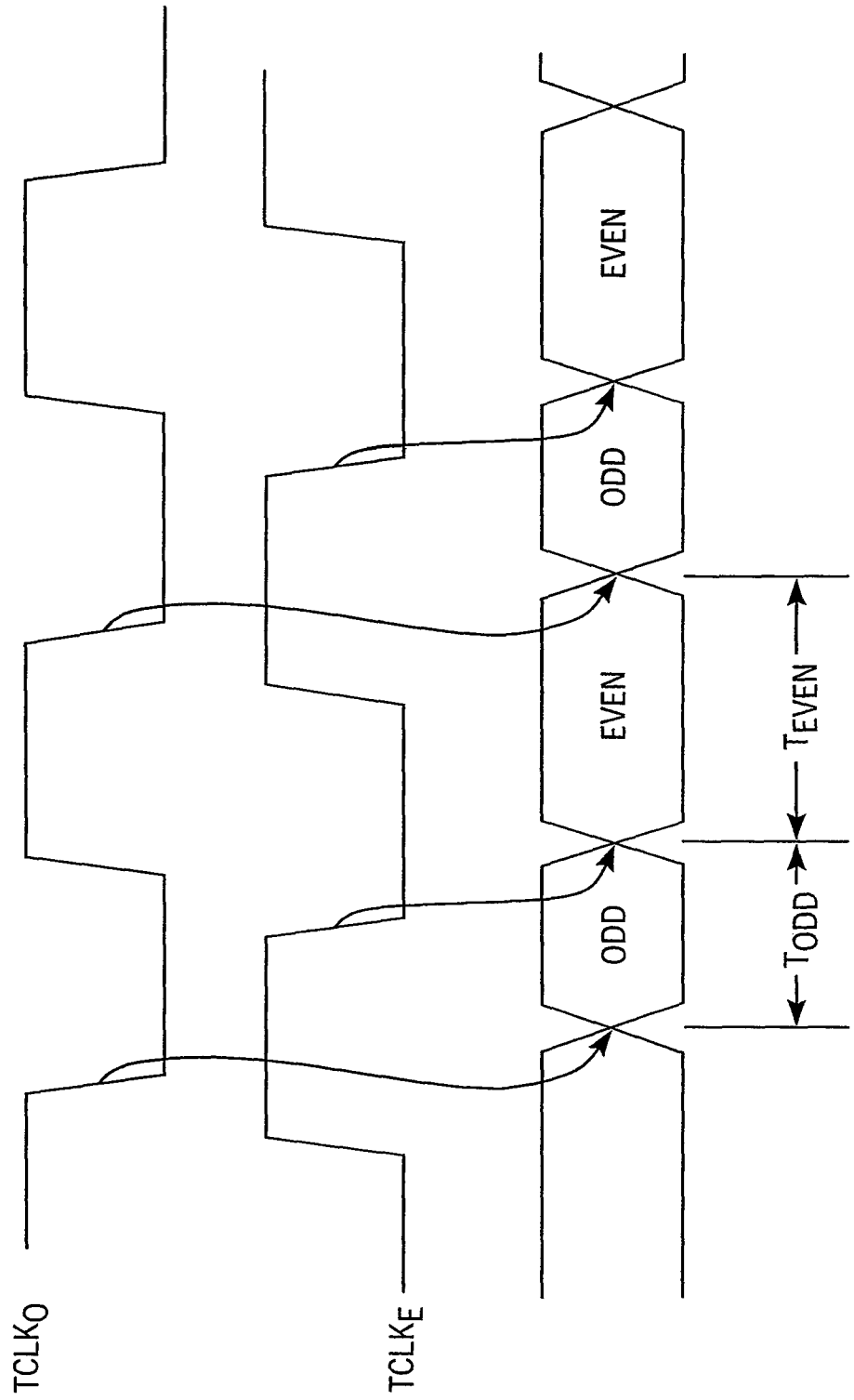

In a DDR system, two bits of data are transmitted on one or more data bus lines during each clock cycle. These two bits are often referred to as "even" and "odd" data bits. Double data rate transmission may be accomplished in many ways, but two are illustrated here. In FIG. 12A, a single internal clock (tclk) is used to set the duration of data transmission on the bus for both the even and odd data bits. In the example, even data is referenced to the high state of internal clock tclk and the odd data is referenced to the low state of tclk. The duty cycle of tclk is defined to be $T_{high}/T_{cycle}$. Further, since the "width" of the even data bit transmission cycle (or data eye) is defined by the duration of the high state of tclk, a second duty cycle, or a "data duty cycle" may be defined. The data duty cycle is the width of the even data eye divided by the sum of the widths of the even and odd data eyes, i.e., $T_{even}/(T_{even}+T_{odd})$. It should be noted that $T_{even}+T_{odd}$ will typically be less than $T_{cycle}$ due to signal jitter. The data duty cycle will be approximately equal to the clock duty cycle, although there may be slight differences if there are other odd/even offsets in the system. A similar DDR system might be constructed using a single clock, where the widths of the data eyes (odd and even) are set by the cross points of the true and complement forms of the clock rather than by the rising and falling edges of the clock FIG. 12B shows an analogous system that uses two clock signals, tclkE and tclko. The falling (or rising) edge of tclko defines the beginning of the odd data eye and the falling (or rising) edge of $tclk_E$ defines the beginning of the even data eye. For this system, the duty cycle of interest is actually defined by the difference between these two falling edges divided by the cycle time, rather than by the duty cycle of either clock signal. The data duty cycle may be defined as above.

The timing diagrams of FIGS. 12A and 12B are drawn with reference to a data transmission clock (tclk). Similar diagrams might be drawn with reference to a data reception clock (rclk). However, when drawn with reference to the data reception clock, the right half of the even data eye and the left half of the odd data eye are encompassed by the high state of the rclk. As with the transmission clock example illustrated above, a differential reception clock with timing set at the crosspoints, or two single ended clocks with falling (rising) edges might be used to establish the requisite data reception eyes.

The present invention may be used to properly adjust duty cycle(s) in relation to a transmission and/or a reception clock. Further, the present invention has application beyond DDR systems. For example, the present invention might be adapted for use in a Quad Data Rate (QDR) system in which timing for data exchange is set by four clocks spaced 90° apart. In QDR systems there are actually four different data duty cycles, each data duty cycle being defined as the width of an eye for a given data bit divided by the width of all data eyes. One of ordinary skill in the art will see that the following principles may be applied to any N-Data Rate system, where N is a whole number.

No matter the actual number of clock signals or edges, the overall timing margin of the bus system is limited by the width of the smallest data eye defined by a duty cycle. Thus, for maximum timing margins, the data duty cycle should be as close to 1/N as possible, where N is the number of duty cycle defining clock signals or edges in the system.

However, the variable effects described above combine to skew duty cycle data eyes. Offsets in the system clock or in the internal clock generation circuits will result in duty cycle timing errors which reduce timing margins and compress overall system timing requirements. Thus, adjustment of the clock signals defining erroneous duty cycles is required to optimize system bus performance.

Figure 13:
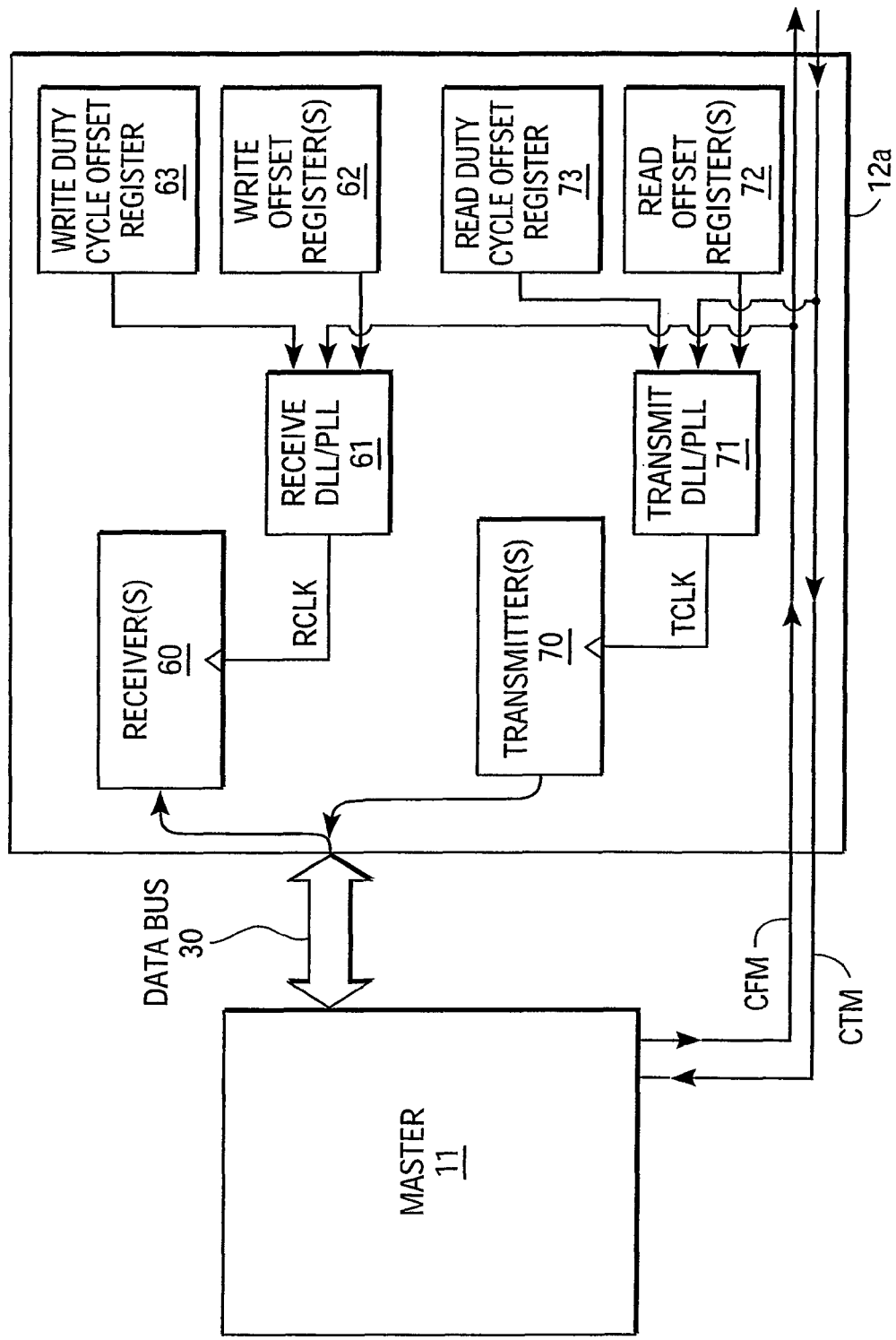
FIG. 13 is a block diagram illustrating the addition of a duty cycle offset register(s) to one embodiment of a bus system within the context of the present invention.

Read duty cycle adjustment and/or write duty cycle adjustment may be accomplished in a manner similar to that discussed above in relation to read/write clocks. For example, as shown in FIG. 13, a write duty cycle offset register 63 and/or a read duty cycle offset register 73 may be added to the structure shown and described in relation to FIG. 6. The Receive DLL/PLL buffer 61 and the Transmit DLL/PLL buffer 71 are modified to accept and use the read/write duty cycle offset values stored in registers 63 and 73. These read/write duty cycle offset values are used to adjust the duty cycles of the clock signals produced by these buffers.

Duty cycle adjustment does not necessarily require active clock recovery, as provided by the DLL/PLL. Duty cycle adjustment might equally apply to a system where skews between internal and external timing points are compensated outside the slave devices, outside the master, or outside both the master and slave devices.

In other words, duty cycle adjustment may be accomplished not only by use of offset registers located on individual slave devices, but also by use of one or more global offset register(s) resident in the master. A single "mean" duty cycle offset value might be stored in the global register and communicated to individual slave devices, or a plurality of individualized duty cycle offset values might be stored and communicated on an individual basis to respective slave devices or group of slave devices. The one or more duty cycle offset register(s) might alternatively be stored outside the master or slave devices.

Figure 14:
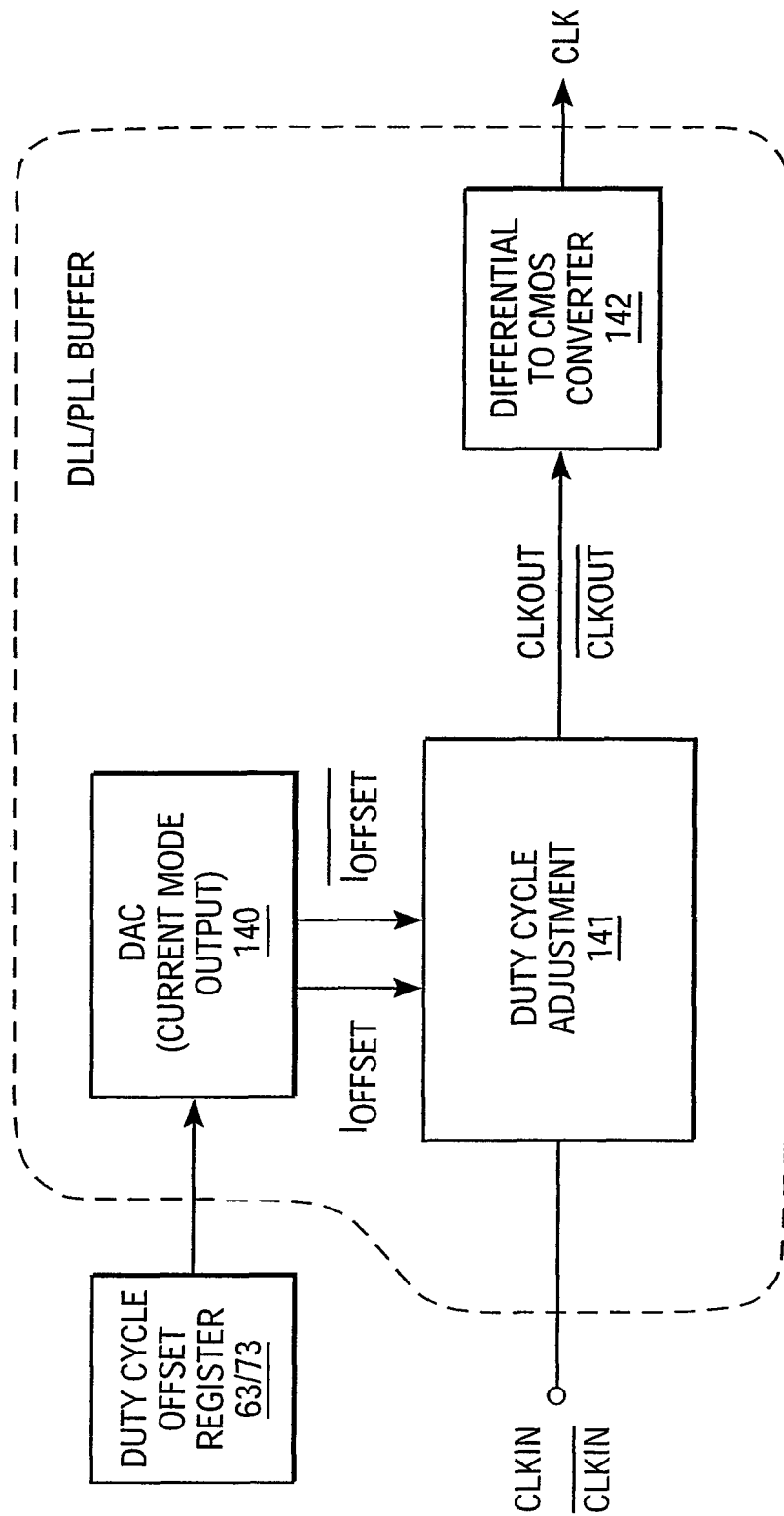
FIG. 14 is one embodiment of a duty cycle adjustment mechanism adapted for use with the duty cycle registers shown in the system of FIG. 13.

One embodiment of a duty cycle adjustment circuit is shown in FIG. 14. This circuit, preferably residing within the DLL/PLL buffer circuit, comprises a current mode output digital-to-analog converter (DAC) 140 receiving the duty cycle adjustment values from read/write duty cycle offset register (63/73). In response to the duty cycle adjustment value received, DAC 140 produces two current signals $I_{OFFSET}$ and $\overline{I_{OFFSET}}$ which are applied to duty cycle adjustment circuit 141.

In a nominal case, wherein no duty cycle adjustment is required $I_{OFFSET}$ and $\overline{I_{OFFSET}}$ are equal and the differential input signal clkin passes through duty cycle adjustment circuit 141 unchanged to form output signal clkout. The clkout signal is then converted by a differential to CMOS converter circuit 142 to form a single ended clock for use in the receiver or transmitter circuits. Alternatively, differential to CMOS converter circuit 142 may be replaced by a differential buffer/amplifier which would produce a differential clock signal of appropriate strength to drive the receiver or transmitter circuits.

If there is some difference in the current signals $I_{OFFSET}$ and $\overline{I_{OFFSET}}$, the differential waveforms clkout and $\overline{clkout}$ will be shifted in relation to one another. This shift in relationship will change their differential duty cycle. As presently preferred, the ratio ($I_{OFFSET}, \overline{I_{OFFSET}})/Io$ (see FIG. 15) will be relatively constant resulting in better independence from voltage and temperature drifts. The duty cycle change will be reflected in the output clock signal (CLK) produced by differential to CMOS converter 142.

The above circuit performs duty cycle adjustment in an "open-loop" manner. That is, no feedback mechanism exists between the corrected clock signal and the duty cycle adjustment circuit. Accordingly, the system must either have sufficient timing margin to work following a single calibration cycle during initialization, or the system must perform periodic re-calibrations.

Figure 15:
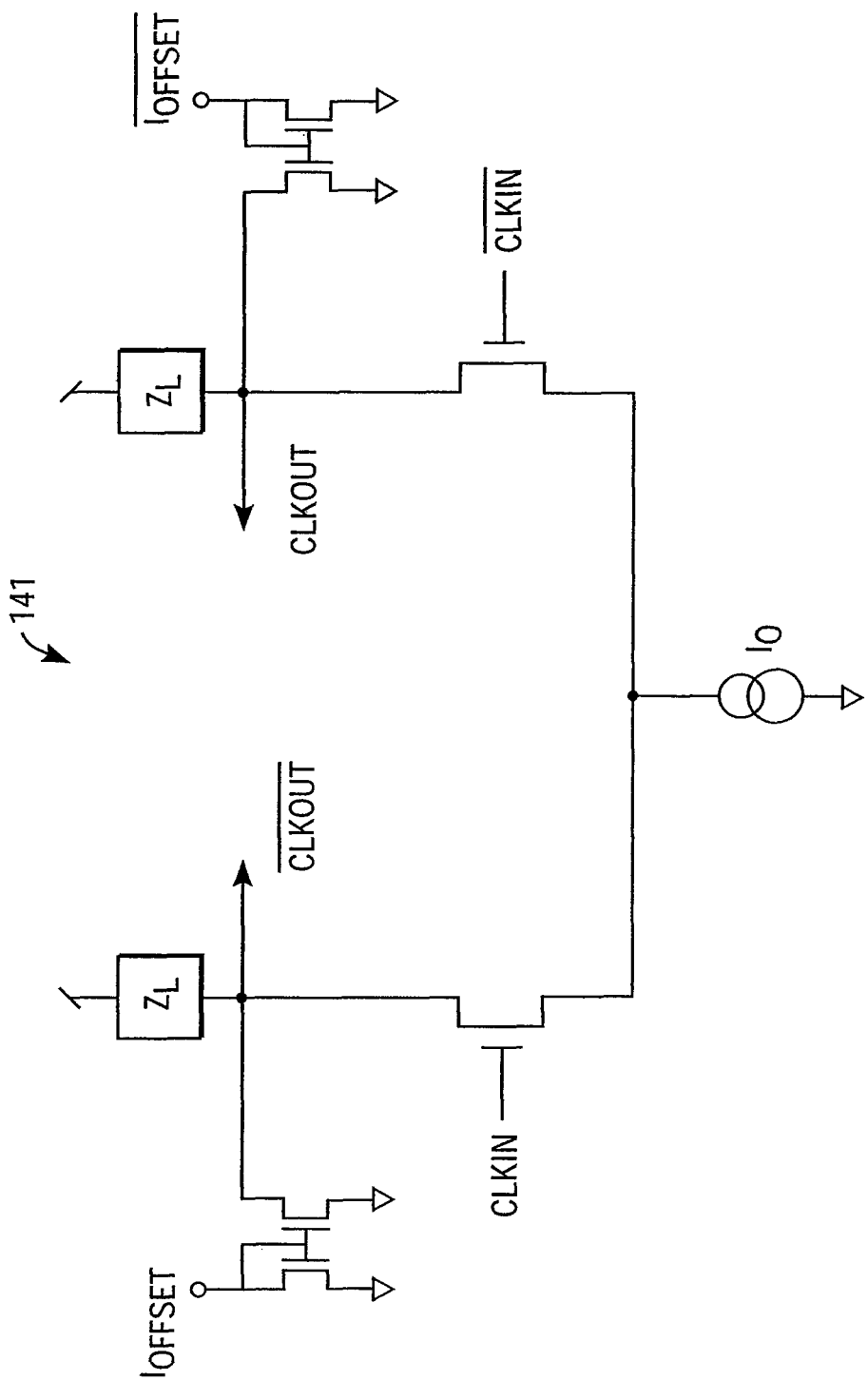
FIG. 15 is a more detailed exemplary circuit showing one possible implementation of the duty cycle adjustment circuit shown in FIG. 14.
Figure 16:
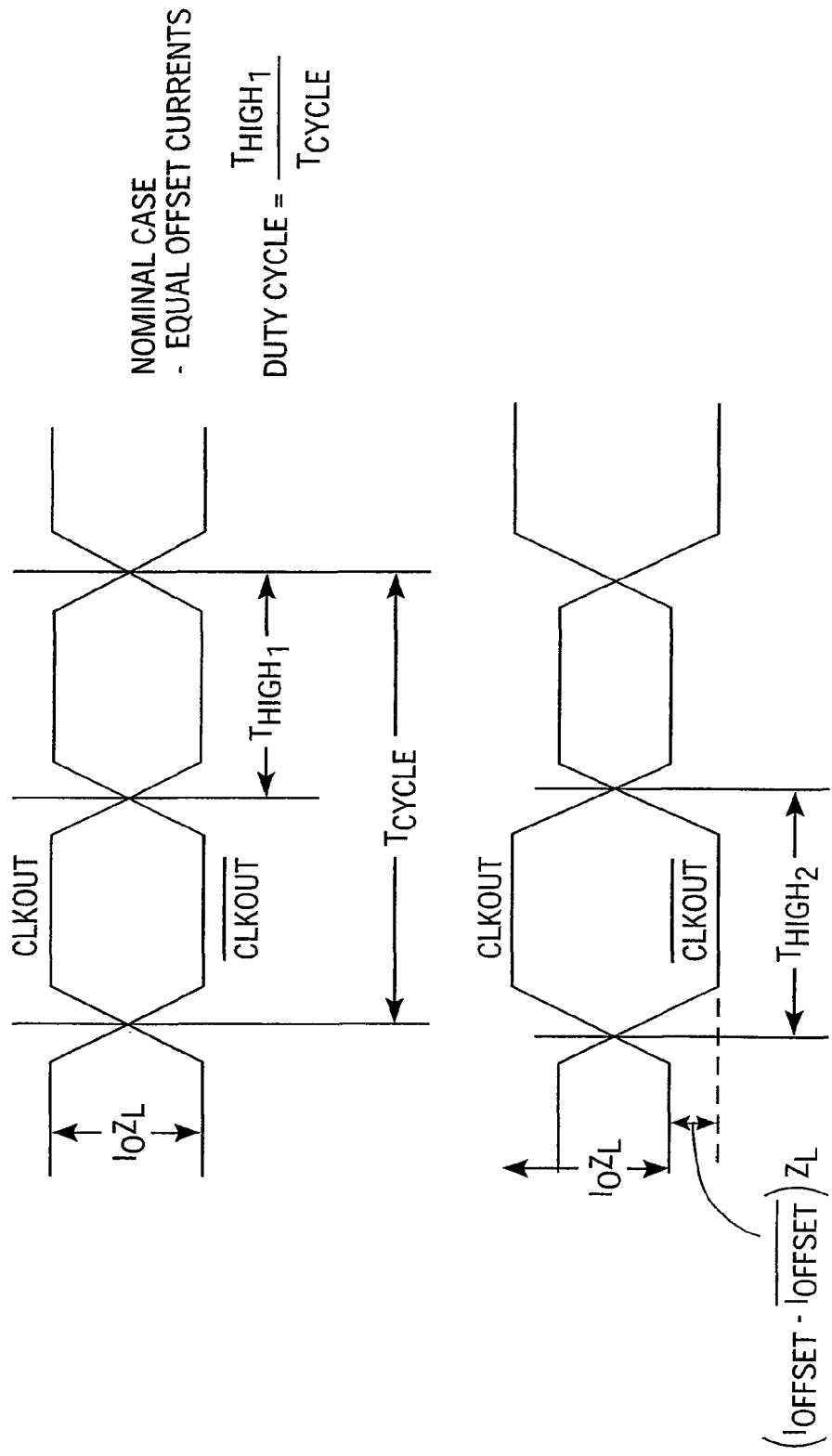
FIG. 16 is a waveform diagram illustrating certain relationships between the signals apparent in the foregoing duty cycle adjustment circuit.

A presently preferred embodiment of the duty cycle adjustment circuit 141 of FIG. 14 is shown in FIG. 15. The circuit shown in FIG. 15 receives $I_{OFFSET}$, $\overline{I_{OFFSET}}$, Io, clkin and $\overline{\text{clkin}}$ as inputs, and generates clkout and $\overline{\text{clkout}}$ as outputs. Relationships between these signals are further illustrated in FIG. 16.

Figure 17:
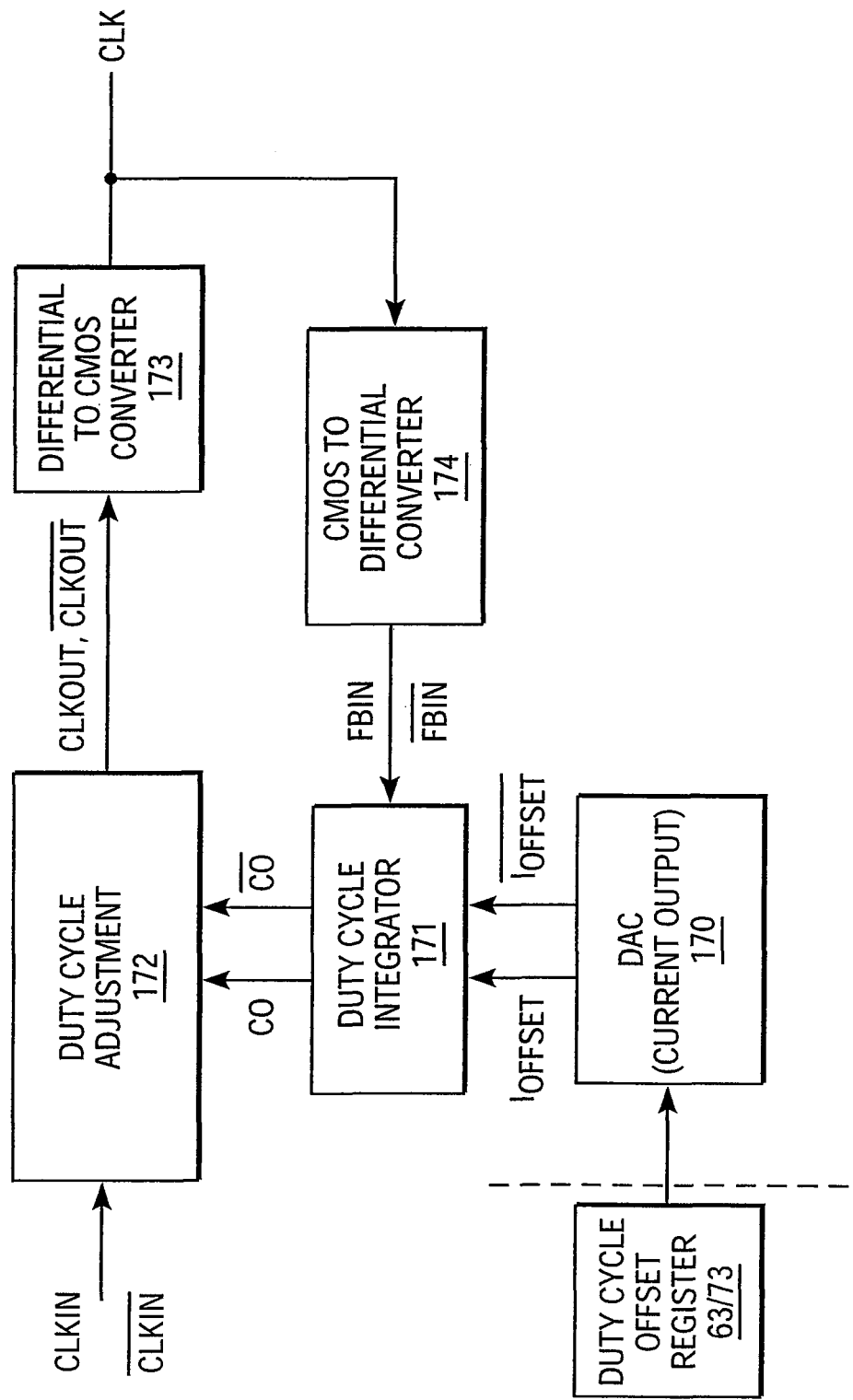
FIG. 17 is another embodiment of a duty cycle adjustment mechanism adapted for use with the duty cycle registers shown in the system of FIG. 13.

Another exemplary embodiment of the duty cycle adjustment circuit is shown in FIG. 17. The circuit, like the one shown in FIG. 14, comprises a DAC 170 receiving the duty cycle offset values from duty cycle offset register 63/73 and duty cycle adjustment circuit 172 receiving clkin and $\overline{\text{clkin}}$ and outputting clkout and $\overline{\text{clkout}}$ to differential to CMOS converter 173 which produces the output signal (CLK). However, this embodiment further comprises a feedback path formed by duty cycle integrator 171 and CMOS to differential converter 174. One embodiment of duty cycle integrator 171 is shown in FIG. 18.

In addition to $I_{OFFSET}$ and $\overline{I_{OFFSET}}$, duty cycle integrator 171 receives a differential feedback clock signals FBin and $\overline{\text{FBin}}$. The differential feedback clock signals FBin and $\overline{\text{FBin}}$ steer the bias current (Io) 180 using differential pair 181a/b (FIG. 18). If the feedback clock has a 50% duty cycle, the two current signals in differential pair 181a/b will be equal and the voltage difference at output nodes co and $\overline{\text{co}}$ will not change. If, however, the duty cycle is not 50%, then a voltage difference will rise or fall as the current is integrated into capacitors 182a/b.

Figure 18:
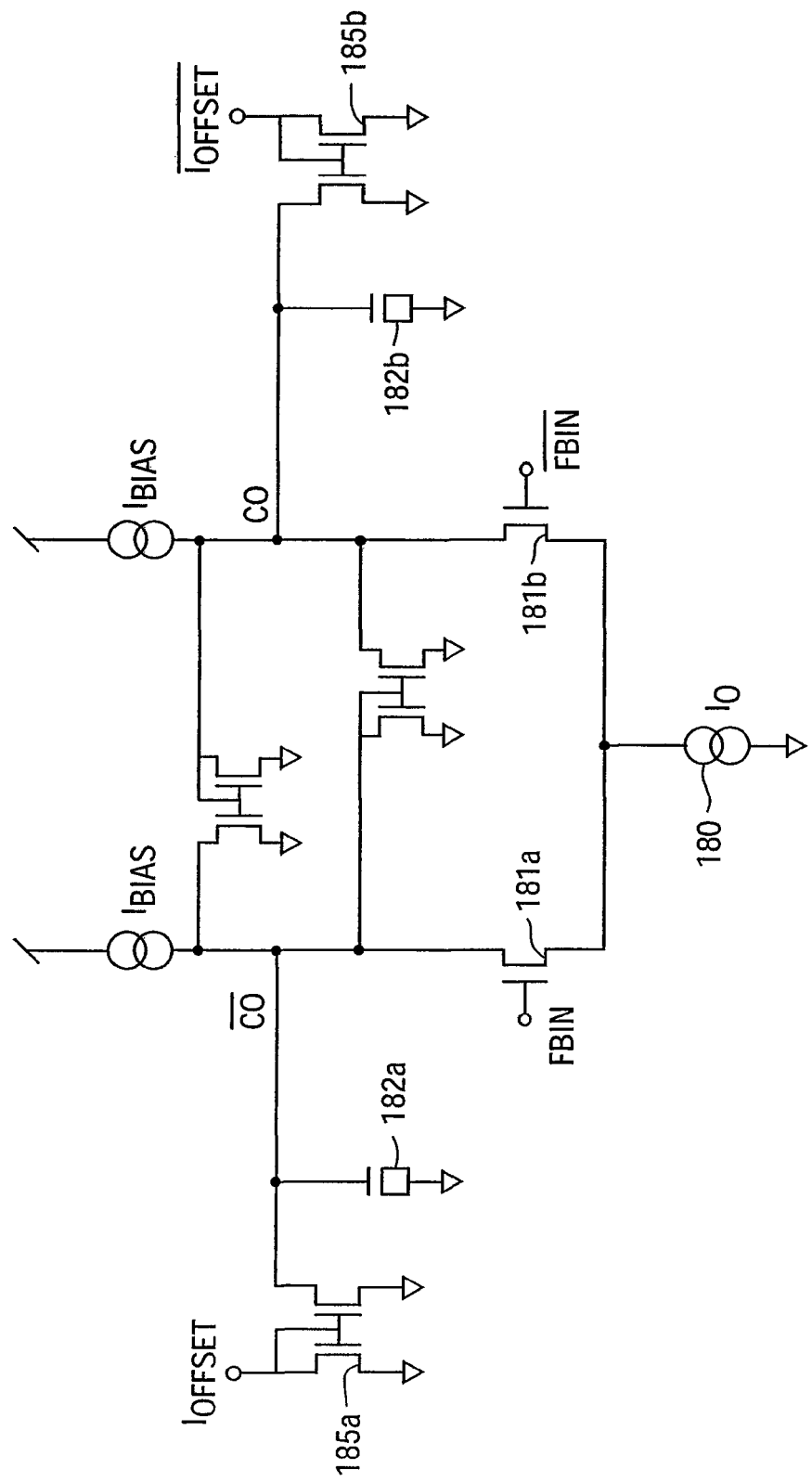
FIG. 18 is a more detailed exemplary circuit showing one possible implementation of the duty cycle integrator shown in FIG. 17.
Figure 19:
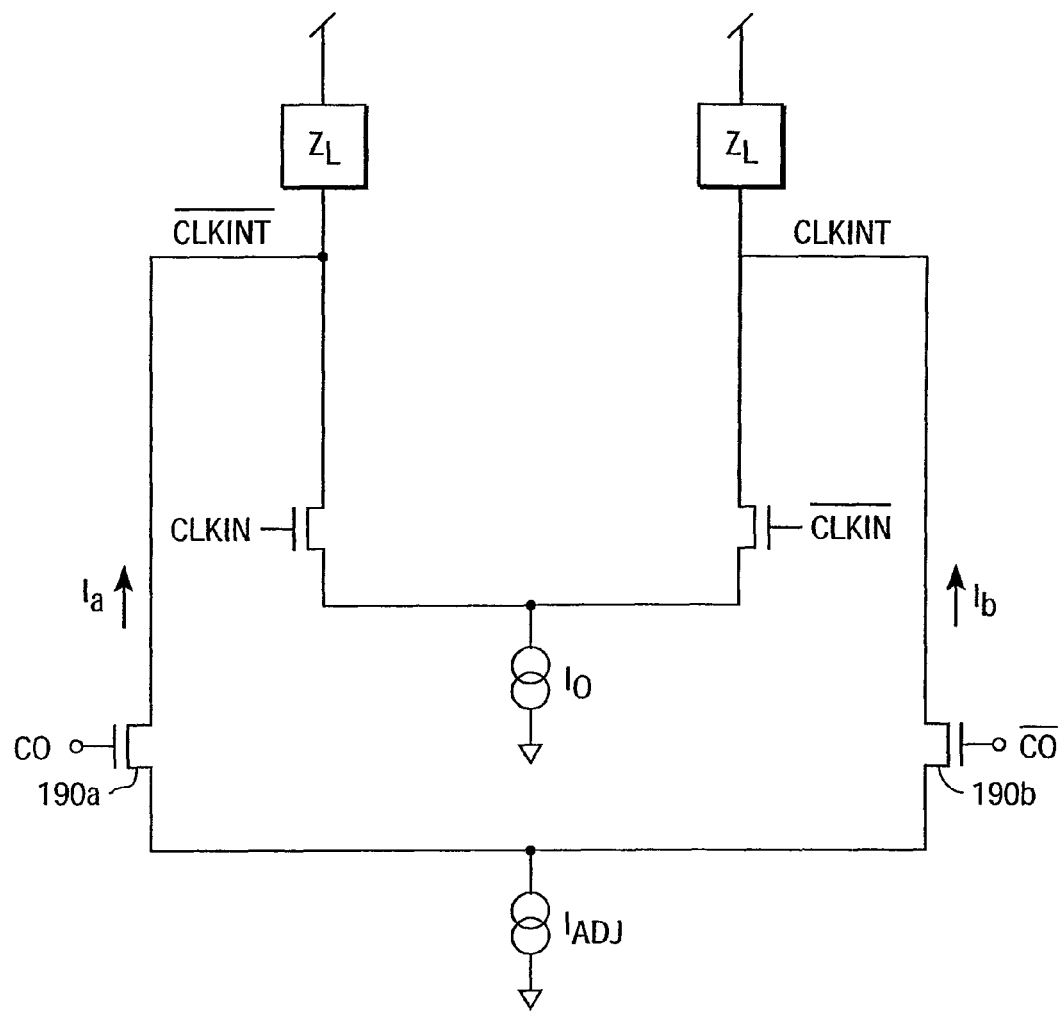
FIG. 19 is a more detailed exemplary circuit showing one possible implementation of the duty cycle adjustment circuit shown in FIG. 17.

The output (at nodes co and $\overline{\text{co}}$) of this duty cycle integrator shown in FIG. 18 is applied to the duty cycle adjustment circuit of FIG. 19 where it steers current in the differential pair 190a/b. As with the duty cycle adjustment circuit shown in FIG. 15, the difference in currents Ia and Ib will shift the clkout and $\overline{\text{clkout}}$ currents one to another, thereby changing the duty cycle.

In principle, this duty cycle adjustment scheme should produce the desired clock signal duty cycle without the effect of the duty cycle adjustment value applied from the duty cycle offset register. In practice, however, device mismatches in the duty cycle integrator (171 in FIG. 17 and FIG. 18) and in the CMOS to differential converter (174 in FIG. 17) will not be compensated out, so the optimum adjustment value for the duty cycle offset register will sometimes be nonzero. Current mirrors 185a/b of FIG. 18 add the differential offset current OFFSET to the integration nodes co and $\overline{\text{co}}$. This will cause the system to reach equilibrium for a FBin duty cycle of other than 50%. Thus, by changing $I_{OFFSET}$ based on the duty cycle adjustment value stored in the duty cycle offset register (63/73), the duty cycle of the clock (CLK) can be properly adjusted. Any value for $I_{OFFSET}$ and $\overline{I_{OFFSET}}$ will require a compensating duty cycle adjustment on FBin and $\overline{\text{FBin}}$ to be made by the feedback loop formed by duty cycle adjustment circuit 172, differential to CMOS converter 173, CMOS to differential converter 174, and duty cycle integrator 171. As with the embodiment shown in FIG. 15, the ratio of ($I_{OFFSET}$, $\overline{I_{OFFSET}}$)/Io is relatively constant.

Figure 20:
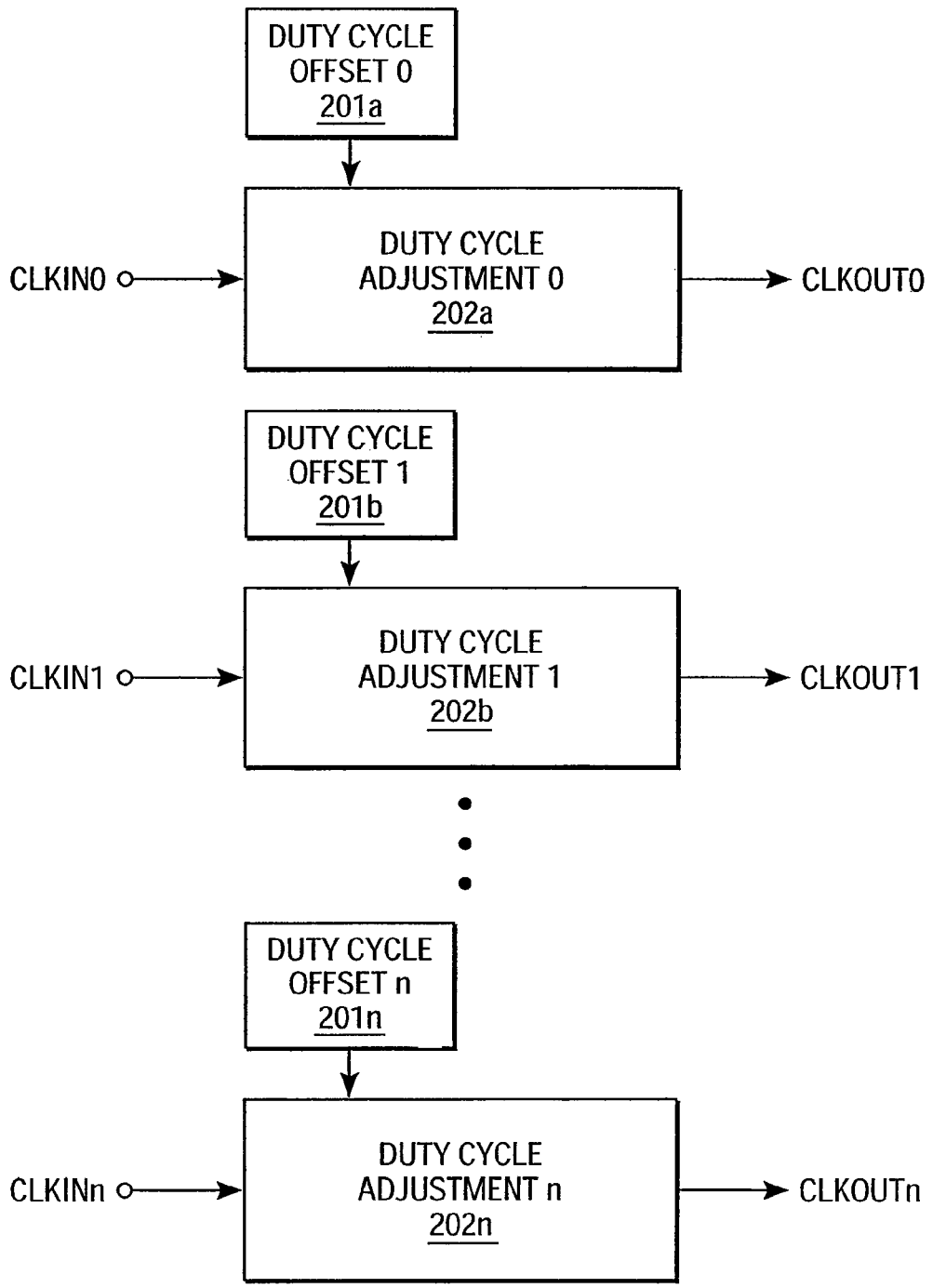
FIG. 20 is a block diagram illustrating duty cycle adjustment scheme within the context of the present invention as applied to an N-data-rate system.

The precepts and relations taught by the exemplary circuits above, may be generically extended and applied to systems having N clocks producing N-Data Rate signals. Conceptually this application is illustrated in FIG. 20 in which a plurality of duty cycle offset values 201 (a . . . n) are respectively applied to duty cycle adjustment circuits 202 (a . . . n) to properly adjust input clock signals CLKin (0 . . . n). In this embodiment, each clock signal is delayed by a corresponding duty cycle offset, but a single mean duty cycle offset value might be applied to each duty cycle adjustment circuit.

Figure 21:
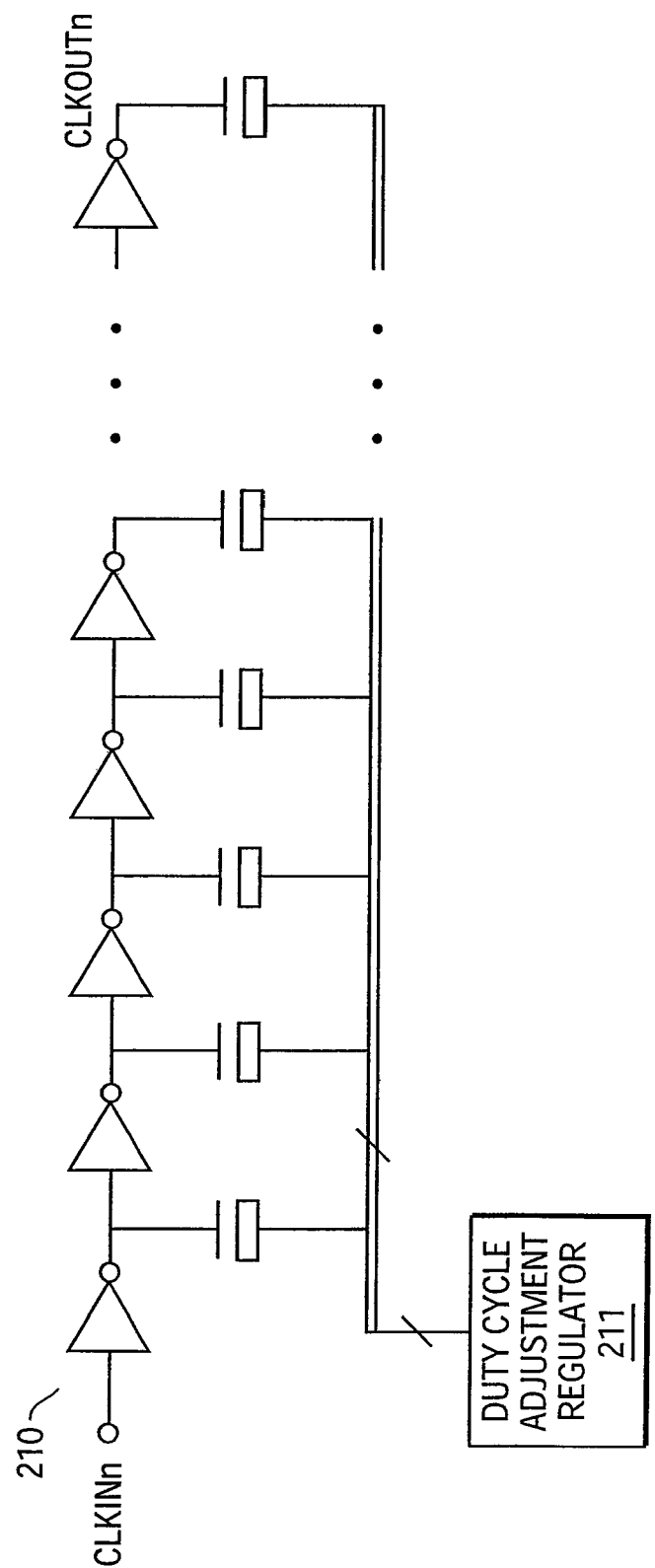
FIG. 21 is a more detailed exemplary circuit showing one possible implementation of the duty cycle adjustment circuit(s) shown in FIG. 20.

In one preferred implementation, each duty cycle adjustment circuit 202 in FIG. 20 comprises the circuit shown in FIG. 21. This circuit's behavior is analogous to that of the circuit shown in FIG. 8. In the circuit of FIG. 21, clock signal delay is adjusted by adding or subtracting loads from a chain of inverters 210, where the loads are selected according to the duty cycle offset value stored in duty cycle offset value register 211. By adjusting the relative delays of the N delay adjustment circuits 202, the size of the N-data eyes can be individually defined.

A variation on this scheme would be to use N-1 buffers rather than N, wherein the size of the Nth data eye corresponding to the Nth clock is defined by moving all the other clock eyes relative to the this last clock. In another related embodiment, the constant delay buffers of FIG. 10 would be used instead of the inverters of FIG. 8. This scheme would have the advantage that delay adjustments would not change with environmental conditions.

Figure 22:
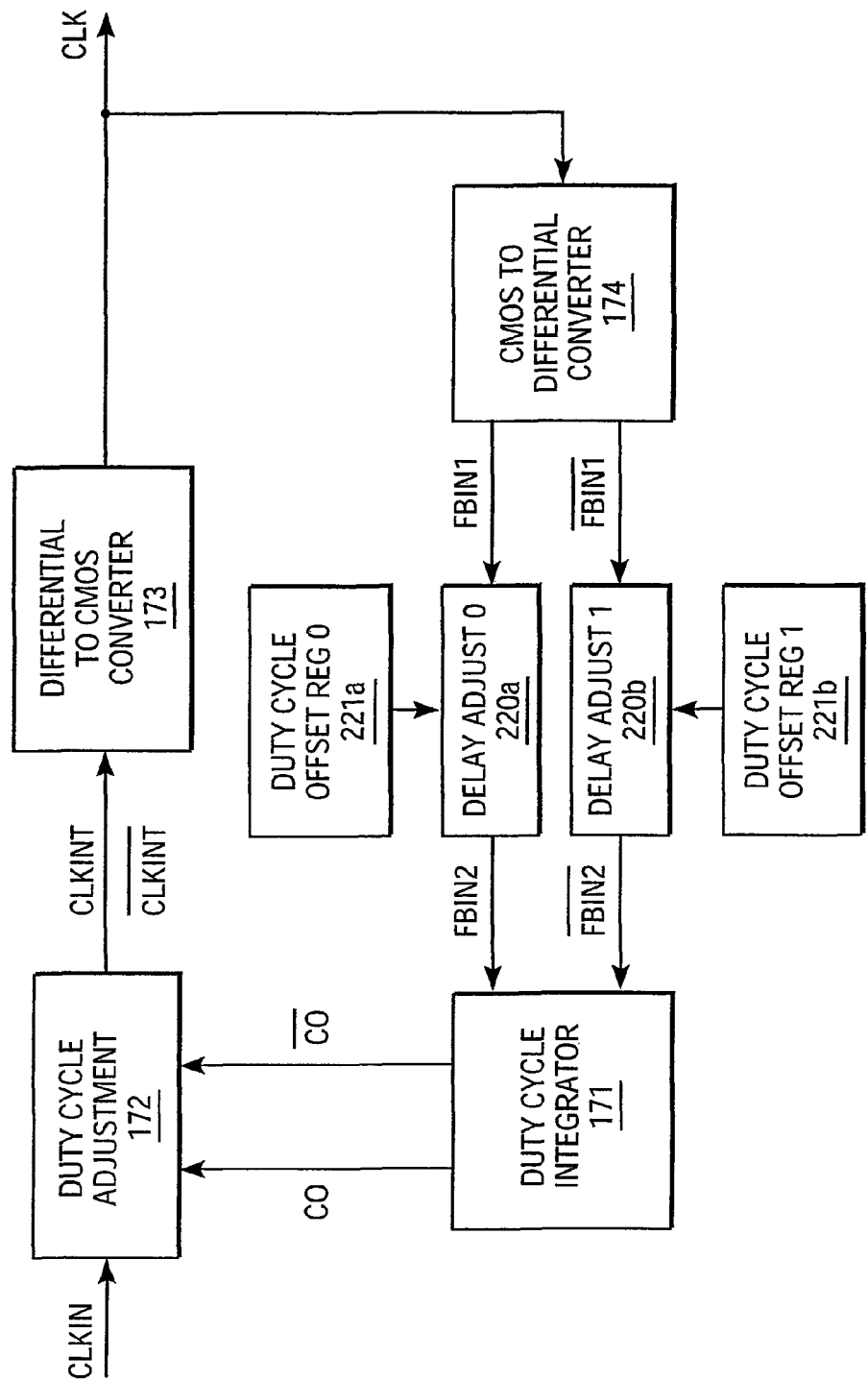
FIG. 22 is yet another embodiment of a duty cycle adjustment mechanism adapted for use with the duty cycle register(s).

In yet another embodiment drawn in relation to a DDR system, the circuit shown in FIG. 22 is used to provide appropriate delay adjustments. The circuit of FIG. 22 is identical to that of FIG. 17 except that the DAC and the duty cycle offset port in the duty cycle integrator have been replaced. The offset is provided by skewing the differential feedback clock FBin1 using delay adjustment circuits 220a/b receiving duty cycle adjustment values from registers 221a/b before feeding it as FBin2 into the duty cycle integrator 171. The delay adjustment circuits 220a/b may be similar to the circuits shown in FIG. 8 or 10.

The embodiment shown in FIGS. 20 and 21 is designed to effect duty cycle adjustment in a slave device. However, it is also possible to adjust the duty cycle on the master using similar schemes and circuits. Of course, master resident circuits that accomplish duty cycle adjustment will consist of a single duty cycle adjustment register storing a single "mean" duty cycle adjustment value, or a plurality of registers storing duty cycle adjustment values for each respective slave device. In the later implementation, the master selects the appropriate duty cycle adjustment value on the basis of the slave device having data written to it or having data read from it.

Figure 23:
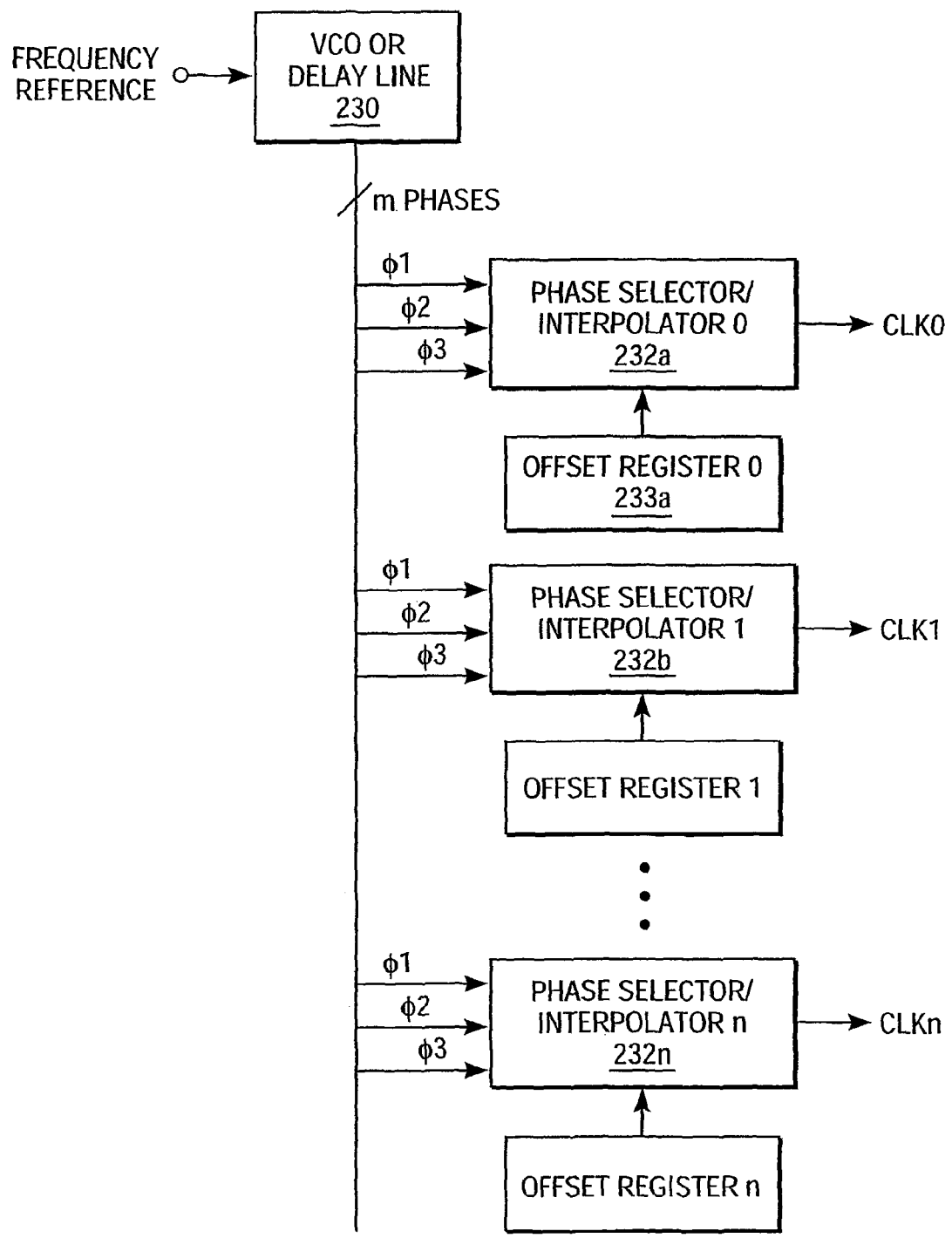
FIG. 23 is a block diagram illustrating another duty cycle adjustment scheme within the context of the present invention as applied to an N-data-rate system.

FIG. 23 illustrates another embodiment of a duty cycle adjustment circuit correcting multiple clocks. In this scheme, the individual clocks are produced from differently phased clock signals ($\phi 1$, $\phi 2$, $\phi 3$) coming from Voltage Controlled Oscillator (VCO) or delay line 230. (Any reasonable number of phased clock signals may be used, but three are shown in this example.) Based on the duty cycle adjustment values stored in duty cycle registers 233 (a . . . n), phase selectors/interpolators 232 (a . . . n) adjust the exact timing of the output clock edges in relation to a nominal value. Movement of these clock signal edges changes the sizes of the corresponding data eyes. In another variation of this scheme, phase selector/interpolator operation is controlled both by the duty cycle adjustment value and the overall phase adjustment register used to set the phases of all the internal clocks to desired relationships with respect to a reference clock.

Adjustments to Correct Voltage Errors

Figure 4:
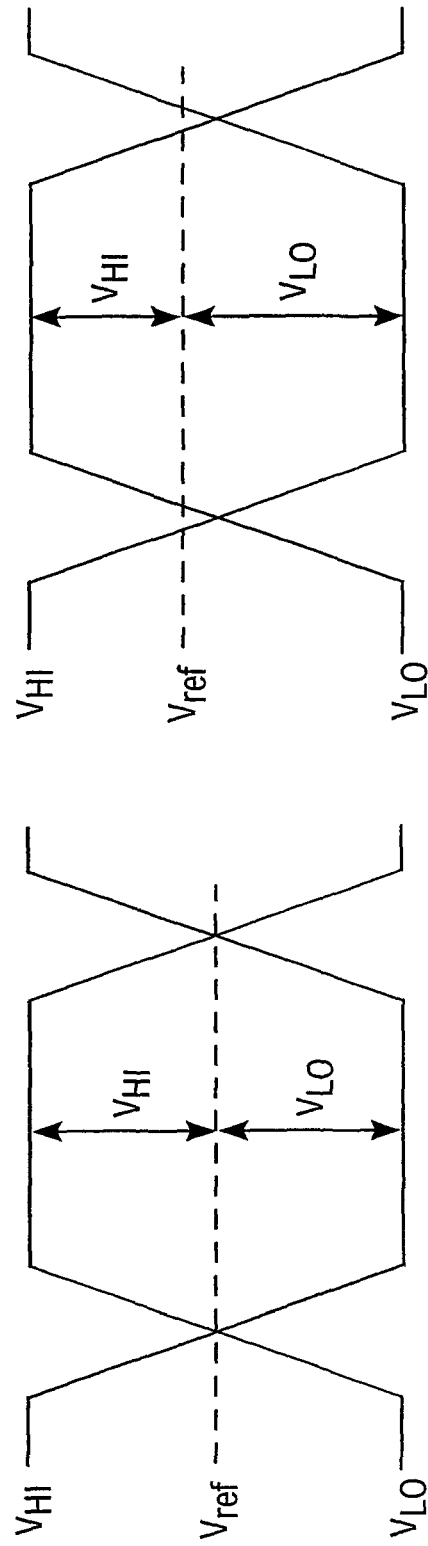
FIGS. 4A and 4B are swing voltage diagrams illustrating the difference between an ideal voltage swing and a typical voltage swing.

In addition to timing errors, voltage errors frequently plague bus systems. Voltage errors and their effects were illustrated in the discussion of FIGS. 4A and 4B above.

In a second general aspect, the present invention provides a system and method by which individual slave devices adjust or compensate the voltage of data received from the data bus, and/or adjust the voltage/current of data being driven onto the data bus. Analogous to the timing adjustment techniques described above, voltage adjustment takes place on a slave by slave basis.

During voltage adjustment, the output voltage swing is properly set and any voltage offset in the received data is compensated. These two functions may be accomplished in many specific ways. Fundamentally, after the master output swing and input levels are optimally established, the resulting signal levels are considered reference, and both slave input offsets and slave output voltage/current are adjusted to correspond to these references.

Figure 24:
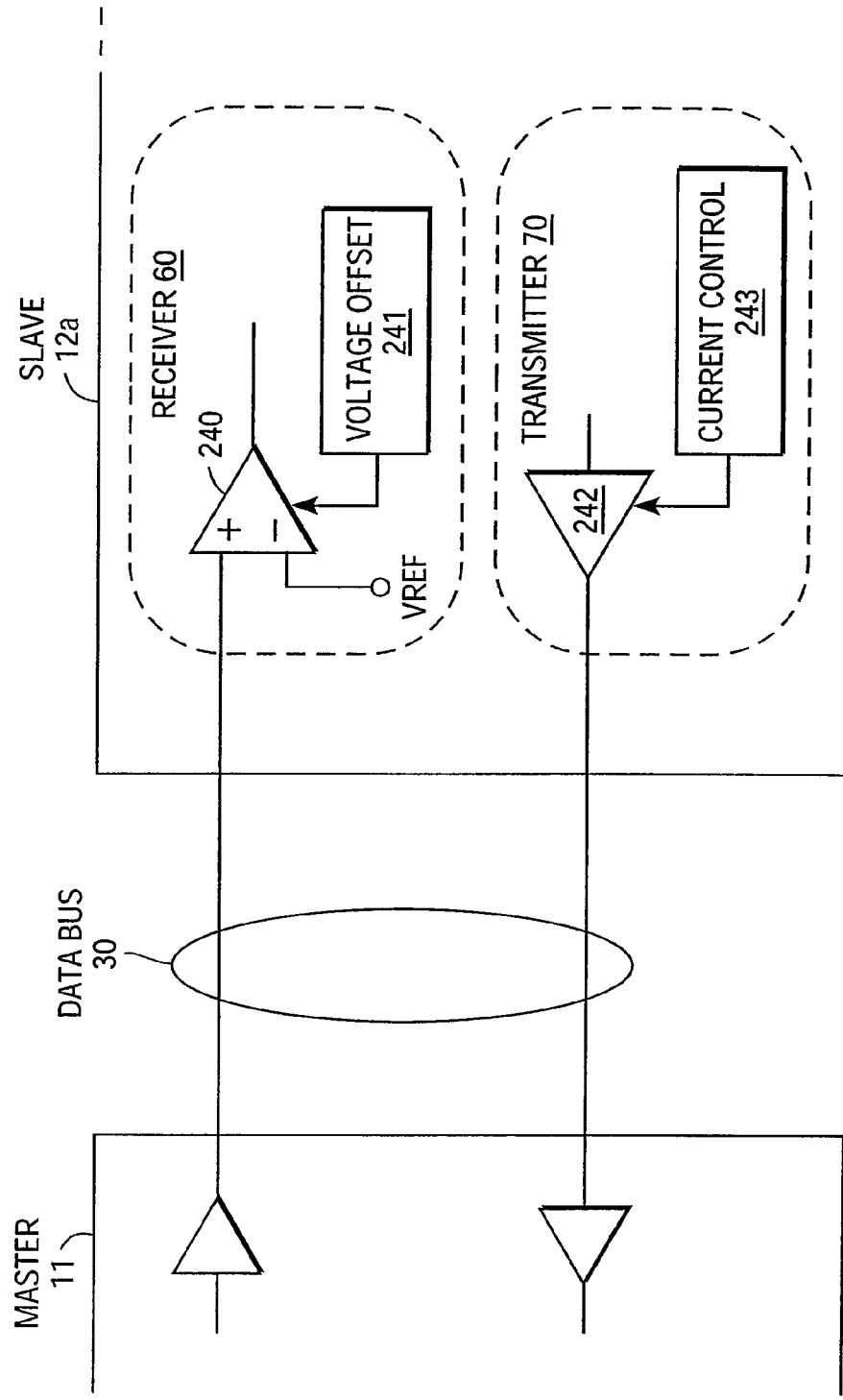
FIG. 24 is a block diagram generally illustrating the voltage adjustment aspect of the present invention as applied to a typical slave device/master device relationship.

FIG. 24 illustrates a basic approach to voltage adjustment in which signals received from data bus 30 at the front end of a receiver 60 (only a portion of which is shown) are input to a differential compensating amplifier 240. The write data voltage levels are compared to Vref and adjusted in accordance with a write voltage offset value stored in voltage offset circuit 241. Similarly, the output current of driver 242 is adjusted in accordance with read voltage offset value stored in a current control circuit 243. This example assumes a slave output scheme based on controlled current source output drivers, but is readily adapted to other forms of output drivers.

In the approach illustrated in FIG. 24, and discussed in more detail below, the master contains the more extensive logic and control circuitry required to calibrate the output current level and input voltage offset for each slave in the system. As there are typically many more slaves than masters in a system, the overall system impact of the voltage calibration and adjustment components is minimized. Further, slave die space is conserved.

The exemplary circuits shown in FIGS. 7 through 11 illustrate several embodiments in which one or more offset values are used to adjust read/write timing to the center of a prescribed data eye. By adjusting read/write timing on a slave by slave basis, the effects at each slave can be compensated for individually and independently. Further, the exemplary circuits shown in FIGS. 13 through 23 illustrate several embodiments in which one or more offset values are used to adjust read/write clock duty cycles. In order to adjust read/write timing (including duty cycle) on a slave by slave basis, the one or more offset values must be determined and stored for each slave device.

Calibration

The process of determining and storing the slave offset value(s) is performed during the calibration phase of system operation. The calibration phase typically occurs during system initialization, but may be performed otherwise. For example, calibration may be performed periodically or upon detection of some threshold number of bit errors. The actual determination of the timing offset values may be done using many different techniques. Several techniques are described below.

One technique is referred to as 90° calibration, and it requires the use of a DLL/PLL on the master capable of shifting its clock output by 90°. Together, the block diagram of FIG. 25 and the timing diagram of FIG. 26 illustrate this technique which is used to calibrate the master-transmit-to-slave, or the write path.

Figure 25:
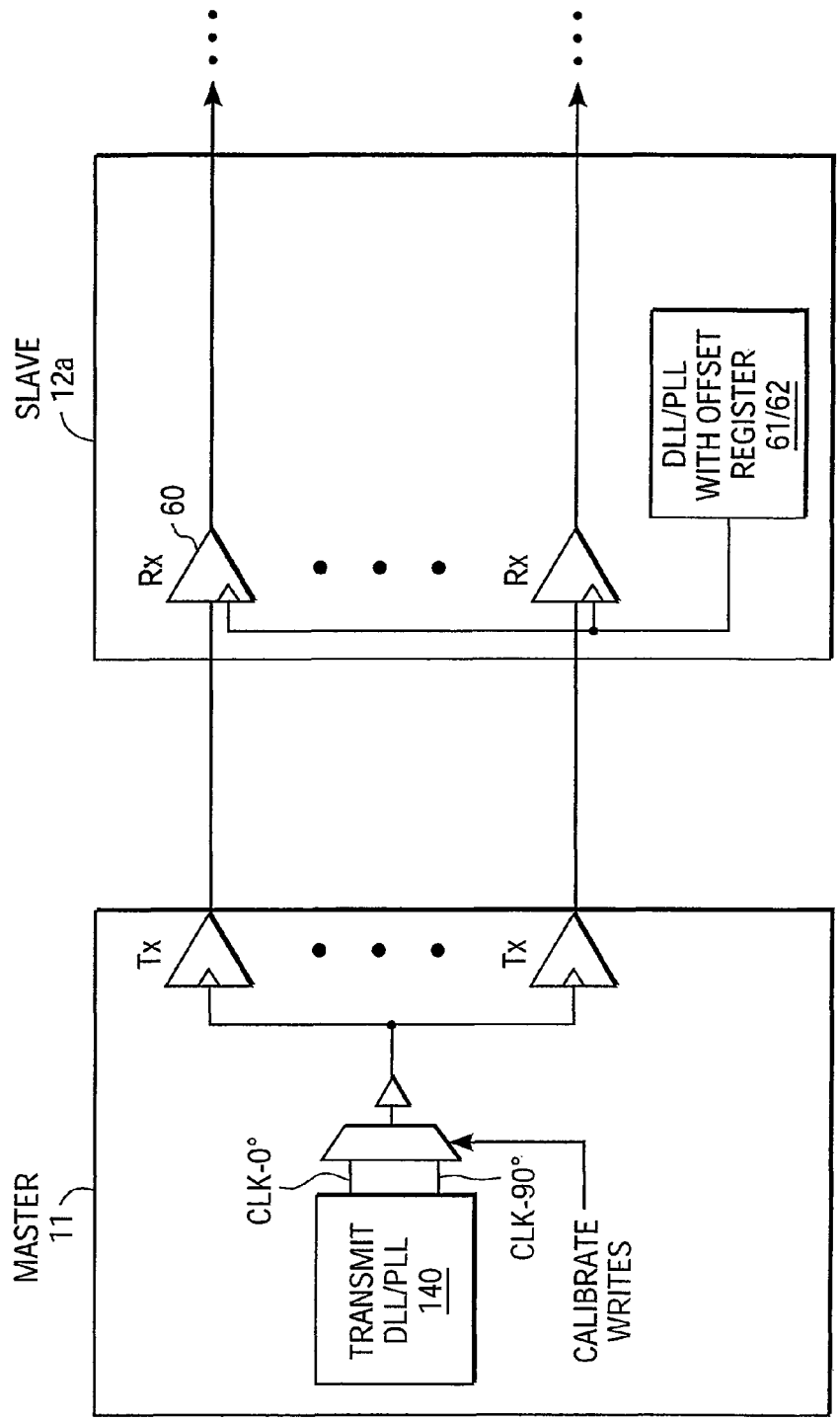
FIG. 25 is a block diagram illustrating a first approach to timing calibration consistent with the present invention.
Figure 26:
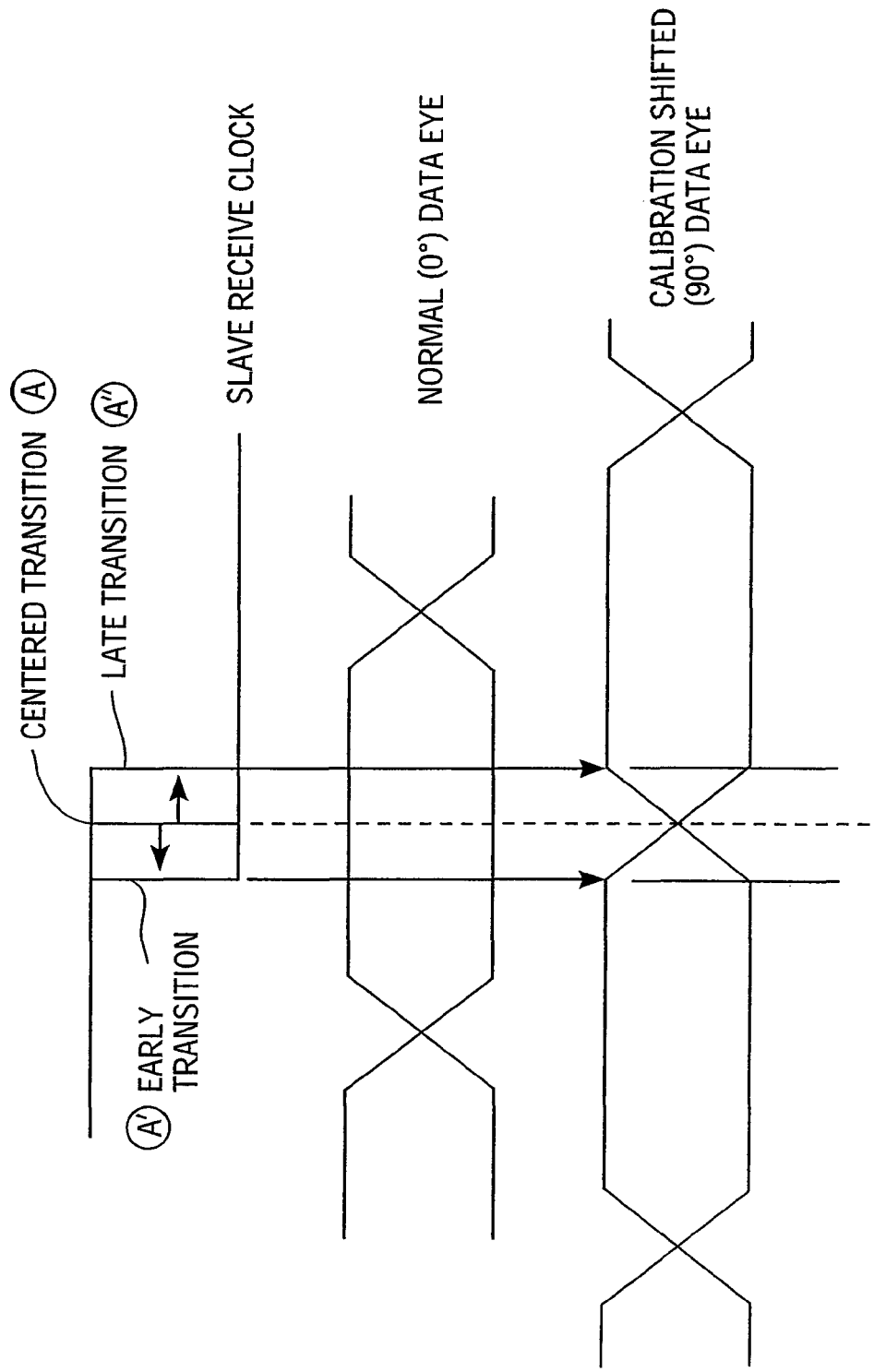
FIG. 26 is a timing diagram illustrating the timing calibration approach shown in FIG. 25.

In FIG. 25, master 11 comprises a transmit DLL/PLL having a normal (0°) output clock signal and a calibration shifted (90°) internal transmit clock signal. During the calibration phase, master 11 selects the calibration shifted output clock, and then transmits a data sequence to receiver(s) 60 in slave 12a. (Some considerations for a proper calibration phase data sequence are discussed below). Given a data eye corresponding to the normal output clock from the transmit DLL/PLL of master 11, a properly centered slave receive clock would transition in the center of the data eye. See signal A in FIG. 26. However, since the calibration shifted internal transmit clock signal offsets data by 90°, a centered transition of the slave receive clock "A" will now occur at the center of the data transition region instead of the center of the data eye. In cases where the slave receive clock is too early, signal A' in FIG. 26, or too late, signal A" in FIG. 26, the transition will not occur at the center of the data transition. Assuming that the data pattern used during calibration has a balanced number of 0 to 1 and 1 to 0 transitions, then this result allows slave receiver 60 to operate as a phase detector.

For example, assuming a data transition from a "0" to "1" on the data bus line into the slave receiver, the early occurring slave receiver clock transition A' would consistently produce a "0" output. Similarly, the late occurring slave receiver clock transition A" would consistently produce a "1" output. Thus, the data output by the slave receiver can be used to determine phase information during the calibration phase. The slave receiver data derived from this calibration process can be stored in the slave and returned to the master during a subsequent read operation.

The foregoing capabilities can be used by system designers to define an appropriate write offset value. Many different algorithms may be implemented as a matter of routine design choice which result in a "centering" write offset value using a minimum amount of time and resources. For example, a simple single data transition might be written from master 11 to slave 12a in a large block of data, say 128 bits consisting of 64 ones followed by 64 zeros. These bits are stored in the slave and read back to the master. The master determines where in the data block a one-to-zero transition occurred, and uses this information to increment or decrement the write offset value. This sequence of steps continues until the offset value dithers back and forth between "0" and "1" (i.e., "toggles") with each iteration at which point a centering offset value has been obtained.

Conceptually, the foregoing technique extends conventional DLL/PLL locking loop techniques to implement timing offset control by building a distributed pseudo-DLL using the slave receivers as phase detectors. Thus, assuming the presence within the master of a 90°-shiftable DLL clock, the additional hardware required to implement timing calibration is minimal. Once the output of the data receiver(s) toggle, the distributed loop can be "locked," and the timing of the master output clock returned to normal (0°).

Figure 27:
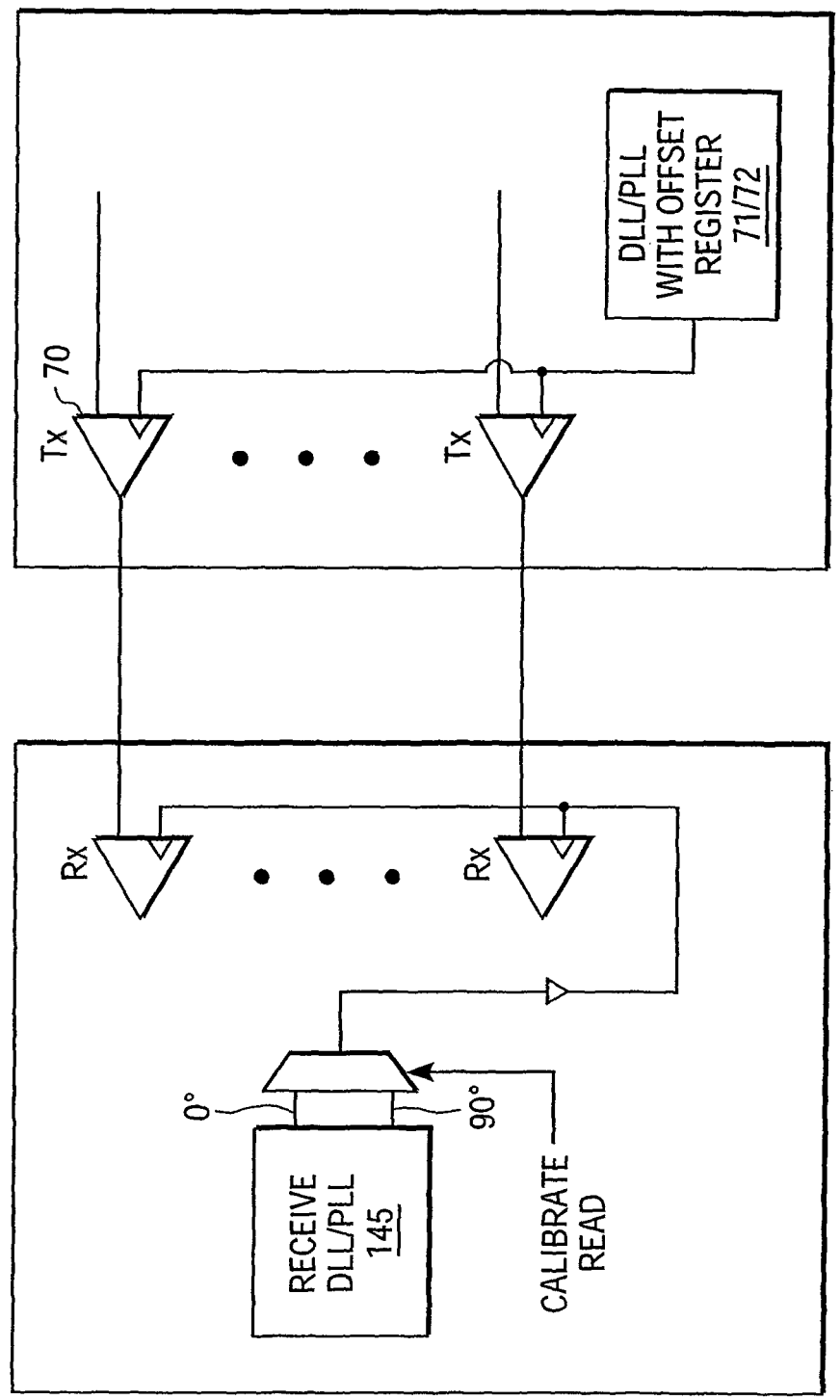
FIG. 27 is a block diagram illustrating a second approach to timing calibration consistent with the present invention.

A similar approach to slave transmitter clock calibration (i.e., read offset value determination) can be readily discerned from the foregoing. In this approach, the internal receive clock for the master is shifted by 90° and the master data receivers function as phase detectors. The process of transmitting a block of data, looking for tell-tale data transitions, adjusting the offset value, and repeating until determination of the optimal read offset value, is performed as explained above, except for the consideration that data flow is reversed between the two processes. FIG. 27 illustrates this approach and the presence of a Receiver DLL/PLL 145 having an output clock which is shiftable by 90°.

The circuits shown in FIGS. 25 and 27 require that the transmit and receive DLL/PLL on the master incorporate circuits providing the 0° and 90° shifted clock signals. However, such area consuming circuits are not required in the more numerous slave devices, and such phase-shifted clocks are easily available in many DLL/PLL designs. Thus, these configurations accomplish the purposes of the present invention with reduced overall system costs.

Figure 28:
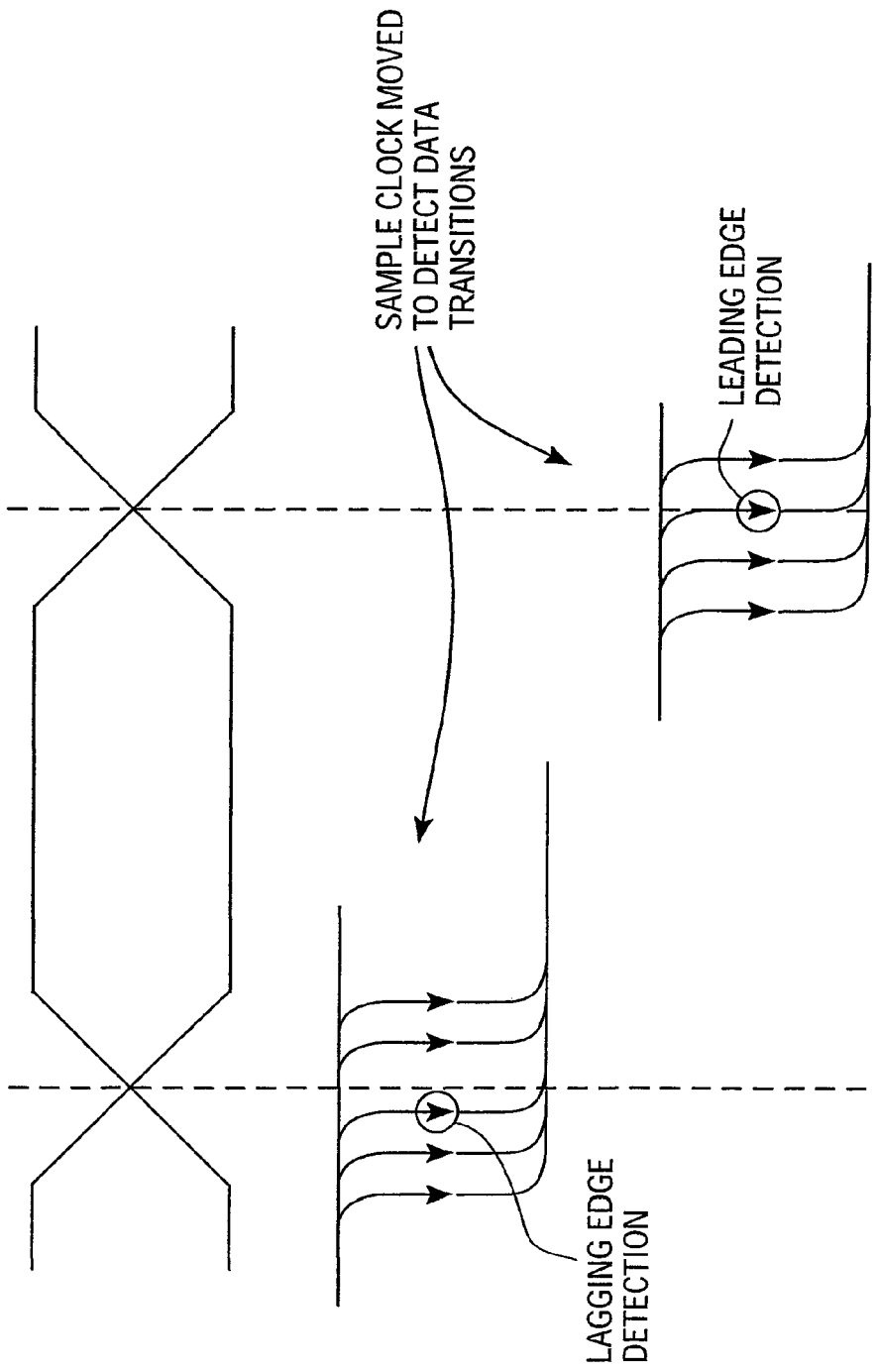
FIG. 28 is a timing diagram illustrating a scanning window approach to timing calibration.

Another approach to timing calibration uses a "scanning window," as illustrated in FIG. 28, to determine an appropriate offset value for slave read or write timing. During calibration, the offset interpolators are scanned across a data window as the master searches for a transition from a passing region to a failing region, i.e., a data transition from 0-to-1, or 1-to-0. One way to accomplish this scanning effect is to provide a register in the master (or slave) DLL/PLL having a range of offset values. By scrolling through the range of offset values and applying each value to the read/write clock, the clock transition will move in relation to the data eye. One offset value will find the leading edge of the data eye and another offset value will find the lagging edge of the data eye. After the master has located both edges of the passing window of the data eye and identified the two corresponding offset values, the master can then take the two offset values and interpolate half-way between them to find the center position for the read/write clock relative to the data eye.

Once an appropriate offset value has been determined, it is written to the corresponding offset register in the slave. Alternatively, the offset scanning may be done by offset interpolators in the slave device. However, the first approach of locating the required interpolators in the master saves overall area in the system.

As illustrated in FIG. 24, one or more offset values are used to adjust slave read/write voltages in relation to Vref. By adjusting the read/write voltages on a slave by slave basis, Vref is maintained as a reference and voltage effects are compensated at a local level rather than forcing a system level compensation scheme. In order to adjust the read/write voltages on a slave by slave basis, the one or more offset values must be determined and stored in the voltage offset circuit and current control circuit of FIG. 24 or equivalent circuits.

The process of determining and storing the voltage offset value(s) is performed during the calibration phase like the process for determining and storing timing offset value(s). The actual determination of the voltage offset values may be done using many different techniques. Several techniques are described below.

Figure 29:
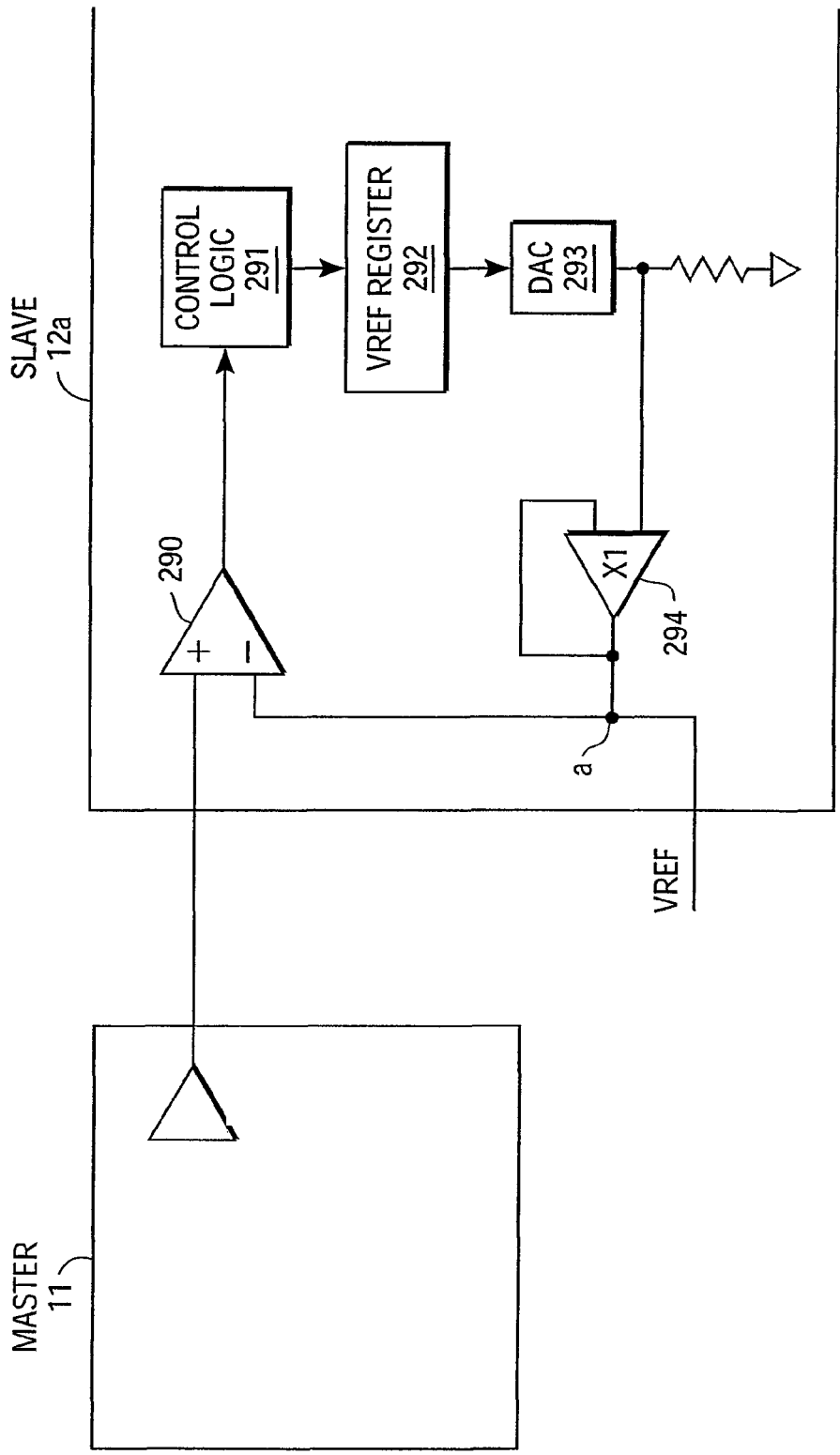
FIG. 29 is a block diagram illustrating a scanning window approach to voltage calibration.
Figure 30:
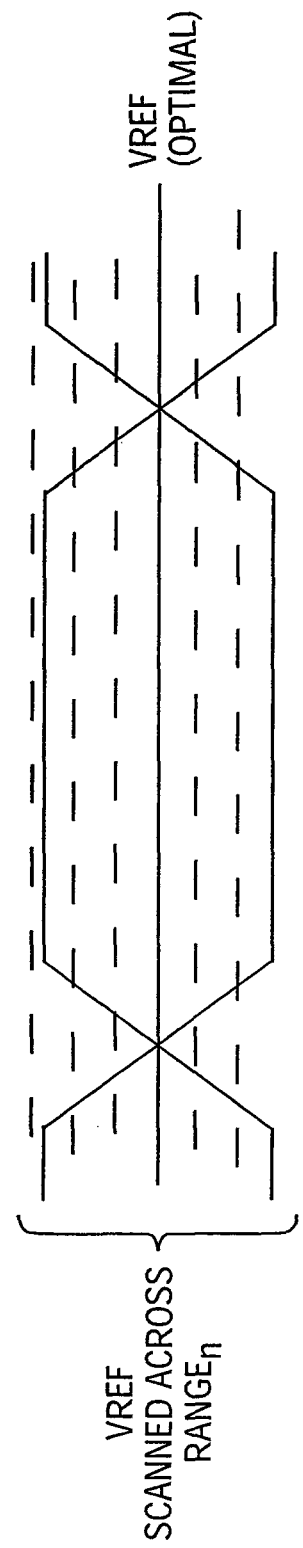
FIG. 30 is a voltage diagram illustrating the scanning window approach of the circuit in FIG. 29.

The first technique for calibrating slave voltages, i.e., determining the voltage offset values, is illustrated in FIGS. 29 and 30. Analogous to the timing calibration scanning window approach, this technique uses a scanning window to calibrate slave voltages. That is, the scanning window feedback mechanism is applied to voltages instead of timing.

The circuit shown in FIG. 29 assumes a voltage calibration directed to the input (or write) voltage swing for data transmitted from the master to the slave. As data is written from master 11 to a receiver in slave 12a during calibration, its voltage level is compared in 290 with an externally supplied Vref signal. The comparison result is fed back through control logic 291, Vref register 292, and a DAC 293, to an offset-port of a stabilizing (1×) amplifier 294. The nature of node "a" in FIG. 29 is determined by the nature of the Vref signal. Where Vref is an externally generated, or otherwise voltage controlled signal, node "a" will comprise an adder circuit or other means for combining the two signal paths. Alternatively, where Vref is generated internal to the slave device by the value stored in an offset register, the adder circuit may be omitted.

As with the scanning window approach described above, high and low pass/fail transition points are identified. Vref on the slave is set in accordance with a final adjustment offset value located half way between the offset values corresponding to the high and low pass/fail transition points.

Figure 31:
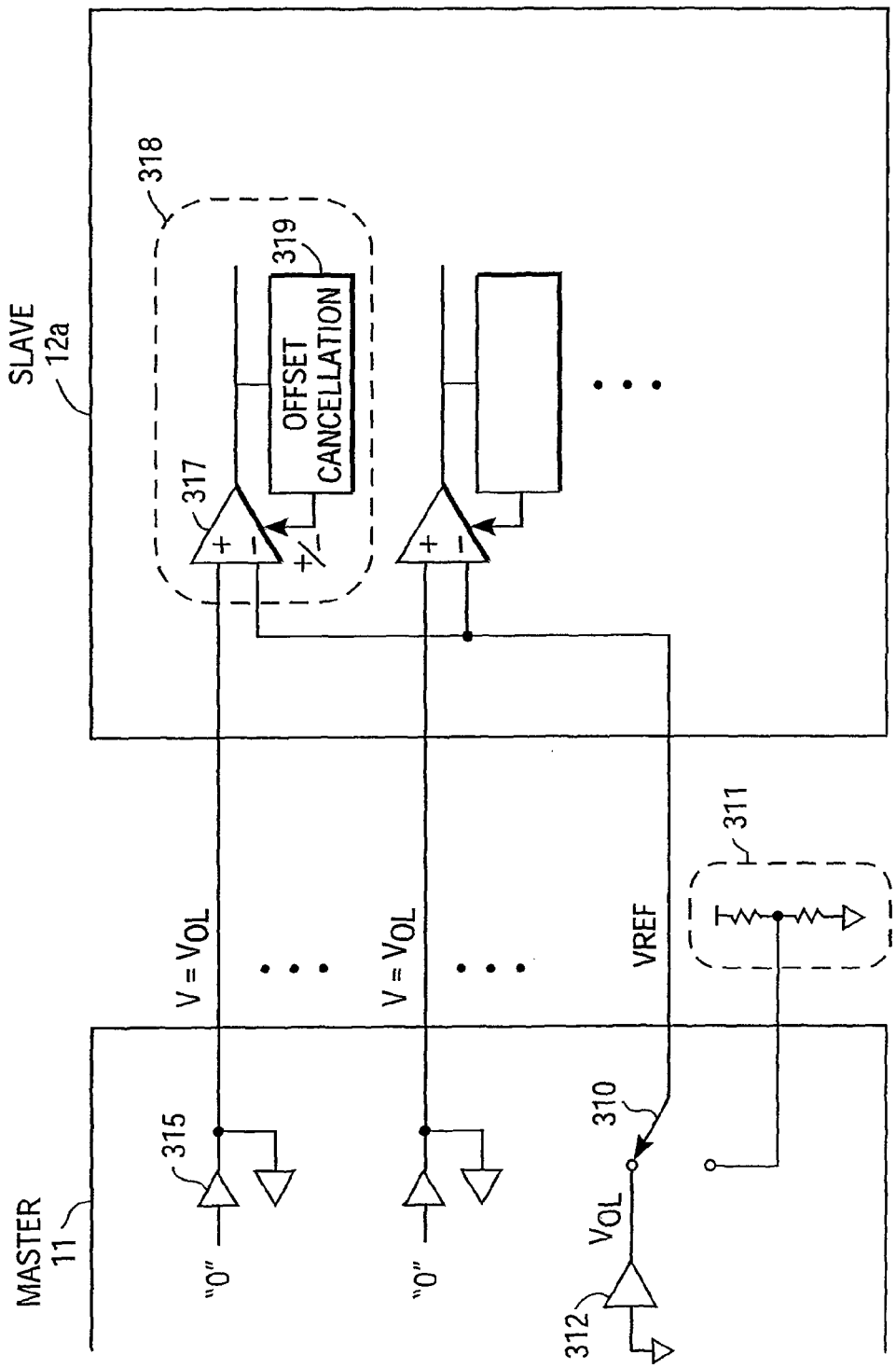
FIG. 31 is a block diagram illustrating a first embodiment of a voltage calibration circuit consistent with the present invention.

In another technique, write voltage calibration is accomplished through the use of voltage offset cancellation loops located in the slave receiver(s). This technique is illustrated in FIG. 31 in which master 11 actually drives the slave's Vref. Master 11 comprises a switch 310 between a nominal Vref generator 311 and a $V_{OL}$ ("voltage output low") voltage source 312. During write voltage calibration, master 11 switches the slave Vref to $V_{OL}$, and simultaneously drives $V_{OL}$ on its output drivers 315.

Slave 12a is placed in write offset calibration mode wherein each slave receiver compares the received data signal at $V_{OL}$ with the "master" $V_{OL}$ signal applied through the Vref signal line. This comparison takes place in voltage cancellation loop 318 which consists of a slave receiver acting as a comparator 317 and offset cancellation circuit 319. Voltage offset values are applied (added and subtracted) through offset cancellation circuit 319 of the slave receiver until its output toggles at which point the offset loop is locked. Offsets due to manufacturing defects in the slave receiver and/or I*R drops present in the data bus are eliminated in this fashion.

In another adaptation of the circuitry shown in FIG. 31, a binary master current control value is simply right-shifted by one bit to half its value. The resulting value is applied to output driver 315. The slave accordingly compares the output of driver 315, $V_{OL}$ at half its normal current, to Vref. An offset cancellation loop is run as above until the output toggles.

Figure 32:
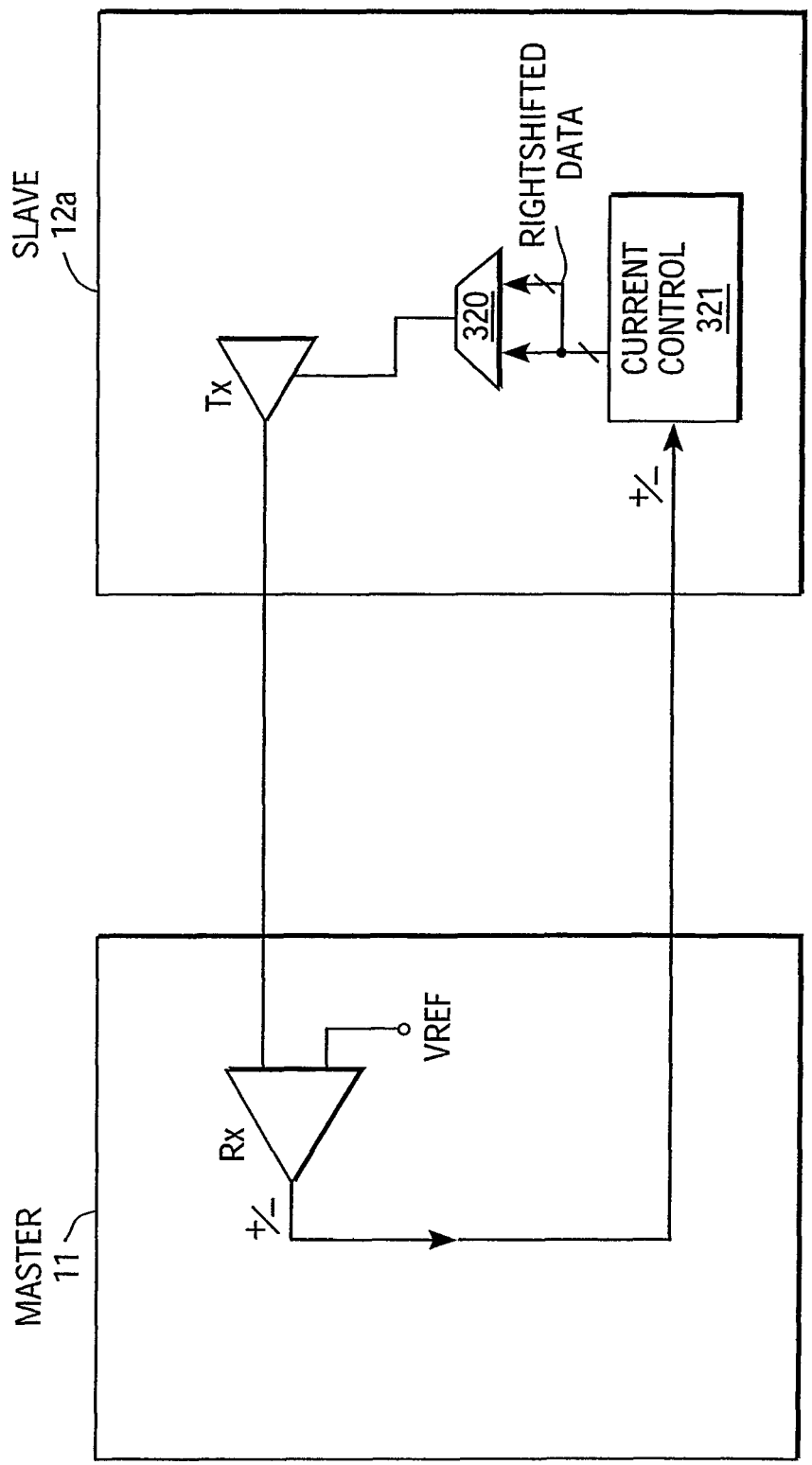
FIG. 32 is a block diagram illustrating a second embodiment of a voltage calibration circuit consistent with the present invention.

Read voltage output swings for the slave are similarly calibrated. For example, in FIG. 32 a current control register 321 in slave 12a is right-shifted by one bit in order to drive half the nominal output value from a slave transmitter. A corresponding receiver in the master samples the output level of the returned data signal and compares it to Vref. An up/down signal resulting from this comparison is fed back to slave 12a via a feedback signal line. The up/down (+/−) signal is applied to increment or decrement a slave current control value in the current control register 321 until the output of the master receiver toggles, at which point the output swing loop is locked. This loop also compensates for DC channel resistance since the "sense" element in the path, i.e., the master receiver, is the same element used to detect read data transmissions.

Figure 33:
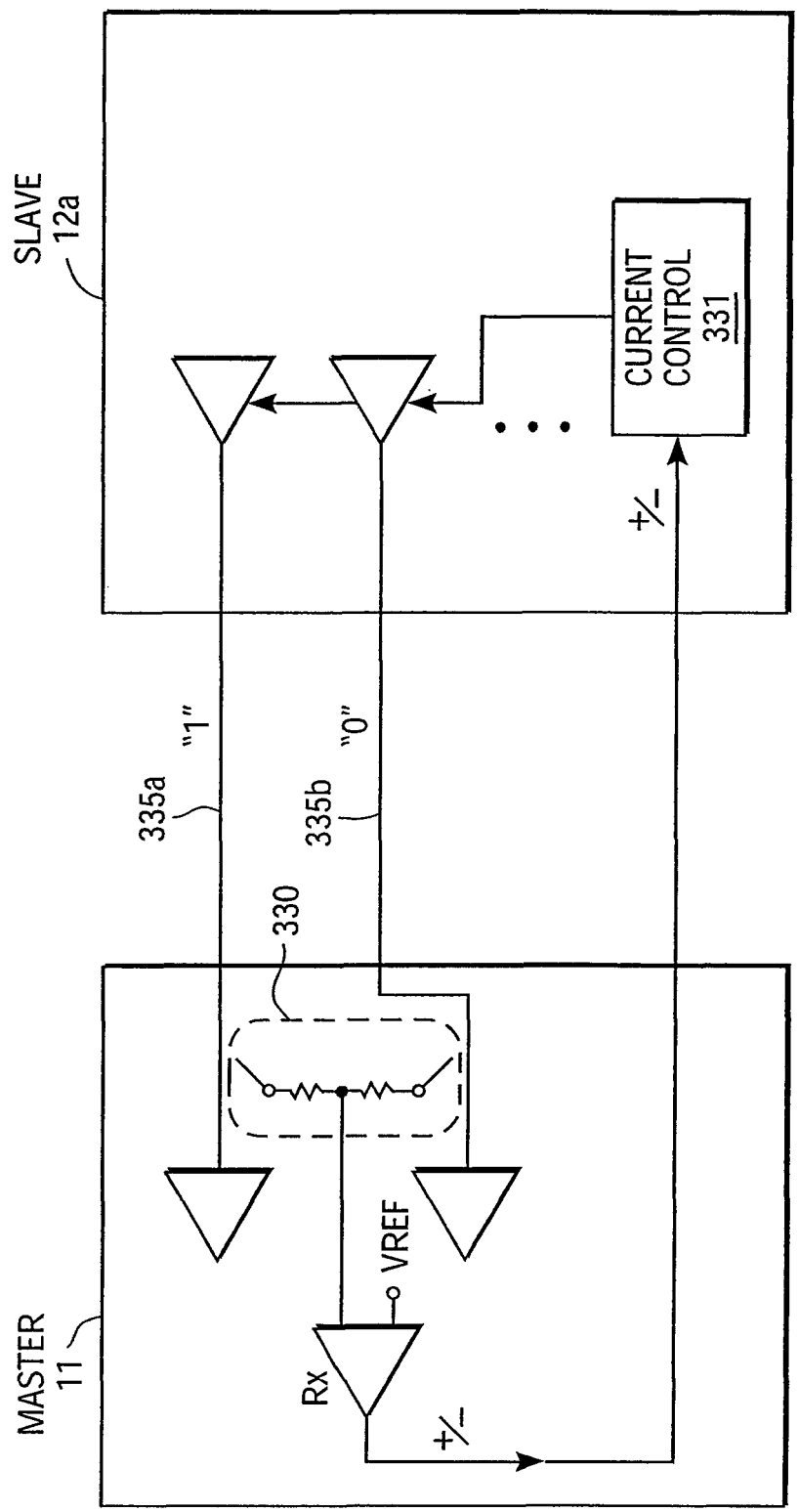
FIG. 33 is a block diagram illustrating a third embodiment of a voltage calibration circuit consistent with the present invention.

Alternatively, the read output voltage swing may be calibrated using a circuit like the one shown in FIG. 33. Here, slave 12a transmits both a "1" and a "0" on different data bus lines 335a and 335b. Master 11 includes a precision resistive divider 330 which receives these signals and combines them to form an output voltage of Vswing/2. This output voltage is then compared to Vref in a master data receiver. The result of this comparison is then sent back to slave 12a as an up/down (+/−) signal and applied to a current control register 331 which is incremented or decremented accordingly until the output of the "comparator" data receiver in the master toggles between 0 and 1.

Figure 34:
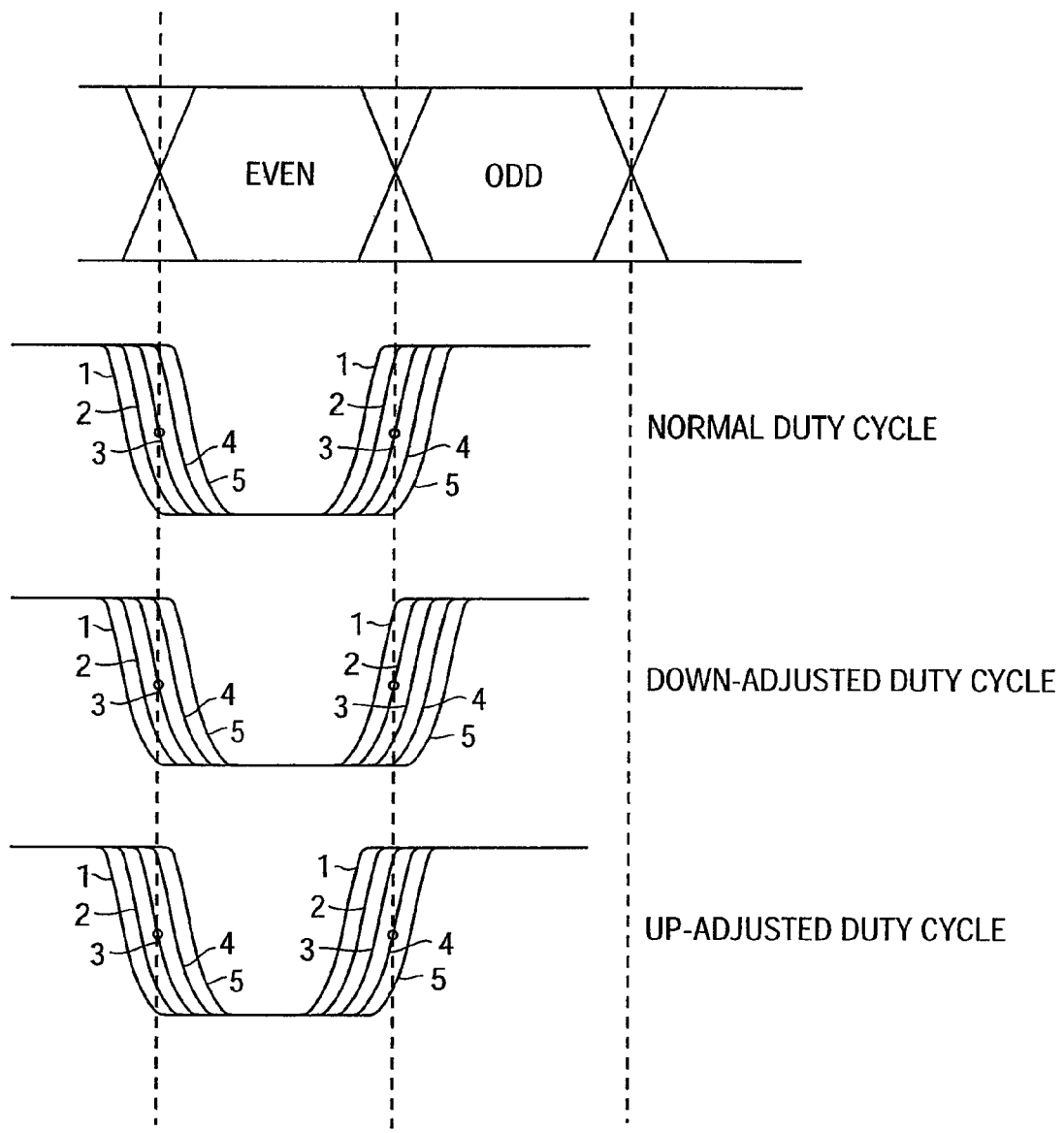
FIG. 34 is a waveform diagram illustrating an adapted scanning window approach to duty cycle adjustment calibration.

As with timing and voltage calibration, there must be a way of determining the appropriate values to program into the duty cycle adjustment registers. This can be readily accomplished using a modified version of the scanning window illustrated in FIG. 28. The modified scanning window is illustrated in FIG. 34. Instead of a single set of curves corresponding to varying values of the offset register, there are multiple sets, each corresponding to a different value for the duty cycle adjustment offset. Each set has the same duty cycle, but differing phases, depending on the duty cycle adjustment offset value. As before, the duty cycle adjustment offset values are scrolled through to find the leading and lagging edges of the data eye. However, for duty cycle calibration, this procedure must be run N times for an N-data rate system in order to find the edges of each eye.

The example shown in FIG. 34 illustrates this procedure for a DDR system, where the scrolling is performed twice, once to find the edges of the even eye and once to find the edges of the odd eye. The procedure is repeated for each value of the duty cycle offset register. The device chooses the duty cycle offset values which make the width of the even and odd eyes most closely equal.

If the relationships (i.e. the mapping) between duty cycle adjustment offset values and the corresponding eye sizes are known, a second method can be employed. Namely, the size of each eye is measured using nominal duty cycle offset values, then the appropriate register values are chosen to make the eyes of equal size based on the known relationships.

If the relationships are not known, they can be estimated by setting the duty cycle adjustment offset values to the extremes of their ranges and then scrolling and measuring the sizes of the eyes. Appropriate values can be chosen by interpolation between the measured duty cycles at the extremes.

Another approach would be simply to measure the overall size of the composite eye, and choose the duty cycle offset register settings that make this size the largest.

Until now, timing (including duty cycle) and voltage adjustments have been discussed as separate phenomenon. While various adjustment mechanisms have been described which address these problems separately, one of ordinary skill in the art will recognize that timing adjustments and voltage adjustments are better viewed as a related family of operating system parameters. Effective bus optimization seeks to maximize both timing and voltage margins, although improvements to one or the other will remedy different system performance problems. Recognizing the interplay between signal timing and signal voltage requirements, the concept of signal equalization will now be addressed.

Signal Equalization

Signal equalization parameters can also be adjusted to increase voltage margins for data signals on the system bus. Equalization involves dynamically changing the drive strength of a channel output driver to compensate for noise signals on the bus. Noise signals may arise from many sources including adjacent channel crosstalk, or residual or undesired signal reflections on the bus. No matter their nature or origin, noise signals cause signal voltages to vary from one clock cycle to another. Compensation for signal voltage variations due to residual signals on the channel is referred to as "temporal equalization." Compensation for signal voltage variations due to inductive coupling from neighboring channels is referred to as "cross-talk (or spatial) equalization."

Temporal and cross-talk equalization are discussed separately below. It should be noted that the circuitry to accomplish both forms of equalization may be resident in a master transmitter or in respective slave transmitters.

Figure 35:
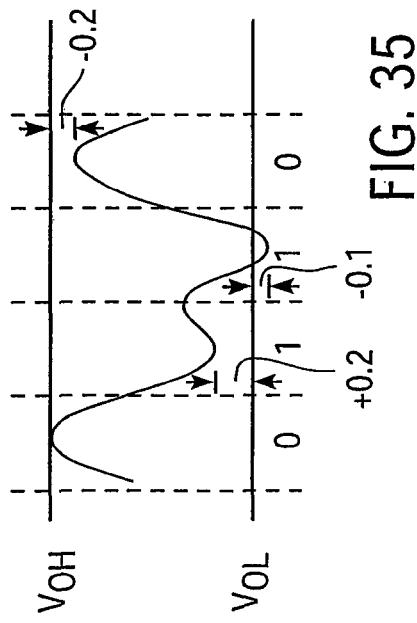
FIG. 35 is a waveform diagram illustrating an unequalized data transmission.

FIG. 35 illustrates a signal waveform on a hypothetical channel that results from an unequalized transmission of data having a logic pattern 0, 1, 1, 0. The voltage on the channel rises to $V_{OH}$ ("voltage output high") during transmission of the first logical 0 and then drops toward $V_{OL}$ during transmission of the first logical 1. As shown, the voltage on the channel does not reach $V_{OL}$ during transmission of the first logical 1 and instead reaches a local minimum 200 mV above $V_{OL}$. By contrast, the voltage on the channel drops 100 mV below $V_{OL}$ during transmission of the second logical 1. Finally, the voltage on the channel reaches a local maximum 200 mV below $V_{OH}$ during transmission of the second logical 0.

The foregoing illustrates how signal voltage on a channel is affected by prior transmissions on the same channel. In general, a logical 1 that follows transmission of a logical 0 is less likely to reach $V_{OL}$ than a logical 1 that follows transmission of another logical 1. Similarly, a logical 0 that follows a logical 1 is less likely to reach $V_{OH}$ than a logical 0 that follows another logical 0. Both these effects result in reduced voltage margin at the receiver, making the system more susceptible to errors caused by noise and other margin-reducing effects.

Figure 36A:
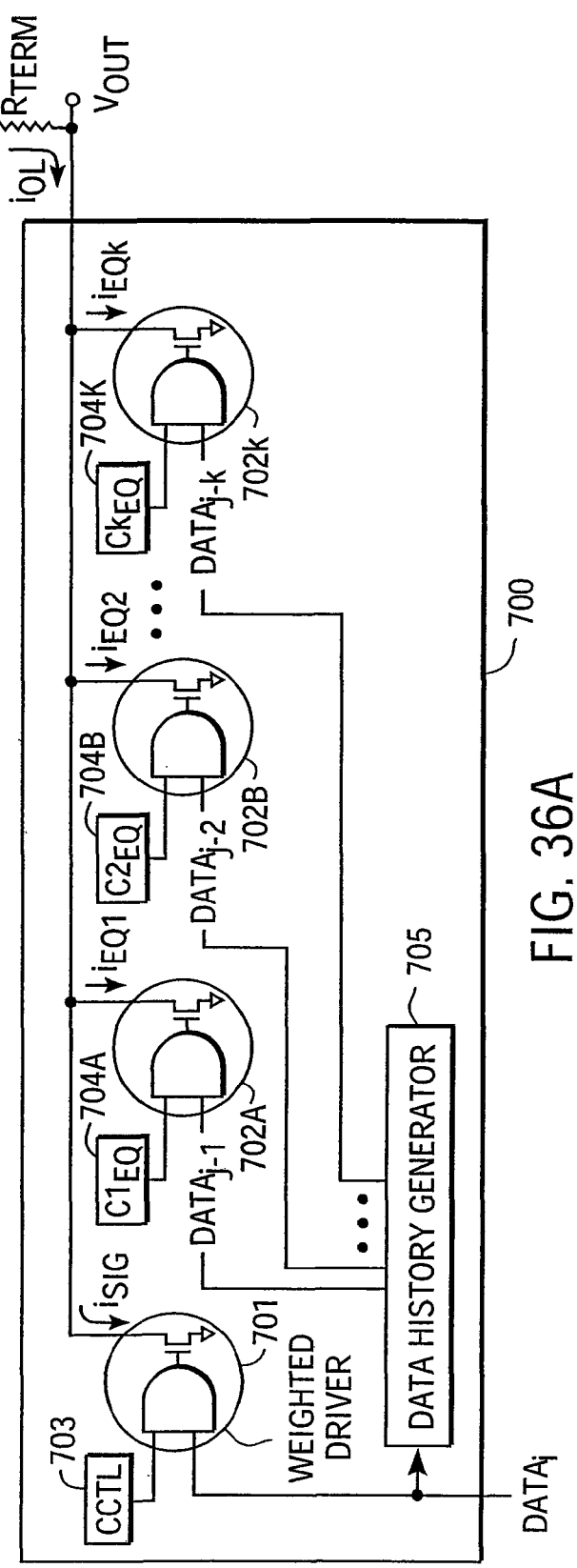
FIG. 36A and 36B are exemplary transmitter-side output driver circuits comprising a temporal equalization circuit.

FIG. 36A illustrates an output driver 700 that includes temporal equalization circuitry according to one embodiment of the present invention. A data signal, Data, is used to gate a weighted driver 701. When $Data_j$ is a logical 1, the weighted driver 701 is turned ON to a degree determined by a current control value (CCTL) in register 703 so that a current $I_{SIG}$ flows through driver 701. Weighted equalization drivers 702A-702K are similarly gated by respective prior versions of the data signal ($Data_{j-1}$, $Data_{j-2}$, ..., $Data_{j-K}$) to sink equalization currents $I_{EQ1}$ through $I_{EQK}$. Thus, the total current that flows through $R_{TERM}$ is given by: $I_{OL}=I_{SIG}+I_{EQ1}+I_{EQ2}+ \ldots +I_{EQK}$, with each of the $I_{EQ}$ terms being controlled by equalization coefficients stored in respective equalization registers 704A-704K. Because the output voltage $V_{OUT}$ is equal to $V_{TERM}-I_{OL}*R_{TERM}$, $V_{OUT}$ can be equalized to compensate for prior outputs by appropriate setting of equalization coefficients.

Figure 36B:
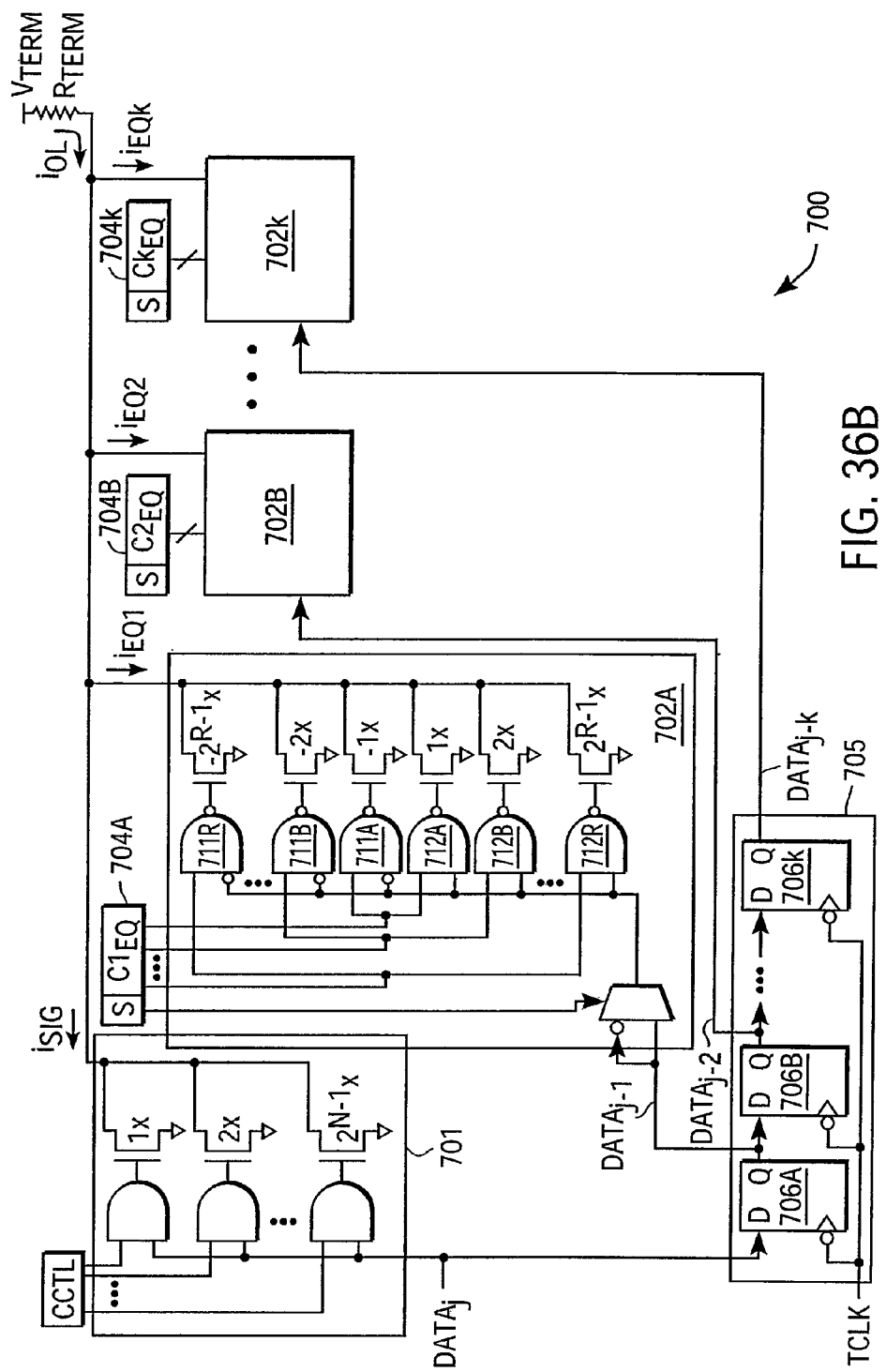

FIG. 36B illustrates an embodiment of output driver 700 in greater detail. As shown, the weighted driver 701 includes N binary weighted transistors (1×, 2×, ..., $2^{N-1}$×) so that $I_{SIG}$ is given by $Data_j*CCTL*I_{UNIT}$, $I_{UNIT}$ being the current through the 1× transistor when active.

Data history generator 705 receives $Data_j$ and a transmit clock signal, tclk, and generates K delayed data signals, $Data_{j-1}$ through $Data_{j-K}$. In one embodiment, a new data value is transmitted at each rising edge and each falling edge of tclk. Thus, the delayed data signals are generated by passing Dataj through a sequence of flip-flops 706A-706K that are alternately clocked by falling and rising edges of tclk. By this arrangement, flip-flop 706A outputs $Data_{j-1}$, flip-flop 706B outputs $Data_{j-2}$ and so forth to flip-flop 706K which outputs $Data_{j-K}$. In an alternative embodiment in which data is transmitted on only one clock edge per cycle of tclk (i.e., one data value per clock edge instead of two), flip-flops 706A-706K may be clocked by the same edge of tclk.

Equalization driver 702A includes a multiplexer 709, a set of additive logic gates 712A-712R and corresponding binary weighted transistors ($1\times$, $2\times$, ..., $2^{R-1}\times$), and a set of subtractive logic gates 711A-711R and corresponding binary weighted transistors ($-1\times, -2\times, ..., -2^{R-1}\times$). In the embodiment shown in FIG. 36B, each of the equalization registers 704A-704K contains a signed value formed by a coefficient sign (bit S) and a coefficient magnitude (e.g., C1, C2, ..., CK). Referring specifically to equalization register 704A, the coefficient sign is used to select between inverted and non-inverted versions of the data value Data, while each bit of the coefficient magnitude is input to a logic gate pair. Each logic gate pair consists of an additive and a subtractive logic gate both having a multiplier that corresponds to the bit position of the coefficient magnitude, but with opposite signs. For example, bit 1 of the coefficient magnitude is input to logic gates 712A and 711A which, depending on the state of $\text{Data}_{j-1}$, activate the $1\times$ and the $-1\times$ transistors, respectively. Similarly, bit 2 of the coefficient magnitude is input to logic gates 712B and 711B to control activation of the $2\times$ and $-2\times$ transistors, and bit R of the coefficient magnitude is input to logic gates 712R and 711R to control activation of the $2R-1\times$ and $-2R-1\times$ transistors. Although FIG. 36B indicates that the coefficient magnitude includes at least three bits (i.e., R=3), the coefficient magnitude may include more or fewer than three bits without departing from the scope of the present invention.

Reflecting on the operation of the equalization driver 702A, it can be seen that when the magnitude coefficient in register 704A is zero, all transistors controlled by subtractive logic gates 711A-711R are activated and all transistors controlled by additive logic gates 712A-712R are off This is true regardless of the state of $\text{Data}_{j-1}$ or the sign bit, S. Consequently, when the coefficient magnitude is zero, the equalization current, Ieq1 is becomes $2^R*I_{UNIT}$. When the coefficient magnitude is at a maximum (i.e., all bits set), $\text{Data}_{j-1}$ is a logical 1, and the coefficient is positive (i.e., sign bit is equal to 0), then all the transistors controlled by the subtractive logic gates 711A-711R and all the transistors controlled by the additive logic gates 712A-712R are activated so that the equalization current becomes $2^{R+1}*I_{UNIT}$. Conversely, when the coefficient magnitude is at a maximum, $\text{Data}_{j-1}$ is a logical 1, and the coefficient sign is negative, then all the transistors controlled by the subtractive logic gates 711A-711R and all the transistors controlled by the additive logic gates are off so that the equalization current is turned off More generally, the current $I_{EQ1}$ is given by the expression:

$$I_{EQ1} = 2^R * I_{UNIT} + (C1 * 2^R) * \text{Polarity}(\text{Data}_{j-1}) * I_{UNIT}$$

where C1 may be positive or negative and where Polarity$(\text{Data}_{j-1})=1$ if $\text{Data}_{j-1}$ is 1; and $-1$ if $\text{Data}_{j-1}$ is 0. The currents drawn by equalization circuits 702B-702K are similarly controlled by coefficients C2-CK. By this arrangement, each of the equalization circuits allows current to be increased or decreased relative to $2^R*I_{UNIT}$ based on respective coefficients and delayed data values. Thus, the overall current $I_{OL}$ is given by the expression:

$$I_{OL} = I_{SIG} + I_{EQ}, \text{ where}$$

$$I_{EQ} = 2^R * K * I_{UNIT} + C1 * 2^R * \text{Polarity}(\text{Data}_{j-1}) * I_{UNIT} +$$
$$C2 * 2^R * \text{Polarity}(\text{Data}_{j-2}) * I_{UNIT} +$$
$$\vdots$$
$$CK * 2^R * \text{Polarity}(\text{Data}_{j-k}) * I_{UNIT}$$

By selecting the current $2^R*K*I_{UNIT}$ to correspond to the desired high voltage level on the channel ($V_{OH}$), the coefficients in the equalization registers can be used to effect a current swing above and below the nominal current used to produce $V_{OH}$ and above and below the nominal current used to produce $V_{OL}$. These current swings can be used in turn to overdrive or underdrive the channel, compensating the output voltage for past output levels. Note that the current $I_{UNIT}$ drawn by the $1\times$ transistor in the equalization drivers may be different from the current $I_{UNIT}$ drawn by the $1\times$ transistor in the weighted driver 701.

Although FIGS. 36A and 36B illustrate a pull-down circuit for equalizing the channel voltage, a combination of pull-up and pull-down circuits may be used in an alternative embodiment. For example, a set of weighted transistors coupled between $V_{TERM}$ and the output of driver circuit 700 may be used to pull up the output signal in proportion to a negative equalization coefficient and a corresponding set of weighted transistors may be used to pull down the output signal in proportion to a positive equalization coefficient. Generally, any circuit for adjusting channel voltages may be used without departing from the scope of the present invention.

As mentioned above, cross-talk equalization involves equalizing a channel voltage to compensate for cross-coupled signals from neighboring channels. The circuits shown in FIGS. 36A and 36B may be modified to provide cross-talk equalization. Referring to FIG. 36A, for example, the data history generator 705 may be removed and the outputs of neighboring channels may be coupled to the inputs of equalization drivers 702A-702K. By this arrangement, equalization currents $I_{EQ1}$-$I_{EQK}$ may be generated based on the state of neighboring channels and weighted by the coefficients stored in equalization registers 704A-704K. As with temporal equalization, a combination of weighted pull-up and pull-down circuits or other circuits for adjusting channel voltages may be used to perform cross-talk equalization. As discussed above, a given device may include both cross-talk equalization circuitry and temporal equalization circuitry.

The foregoing examples of temporal and cross-talk equalization have been drawn to output driver circuits, or transmitter-side circuits. However, such circuits may be incorporated as receiver-side circuits.

Figure 37:
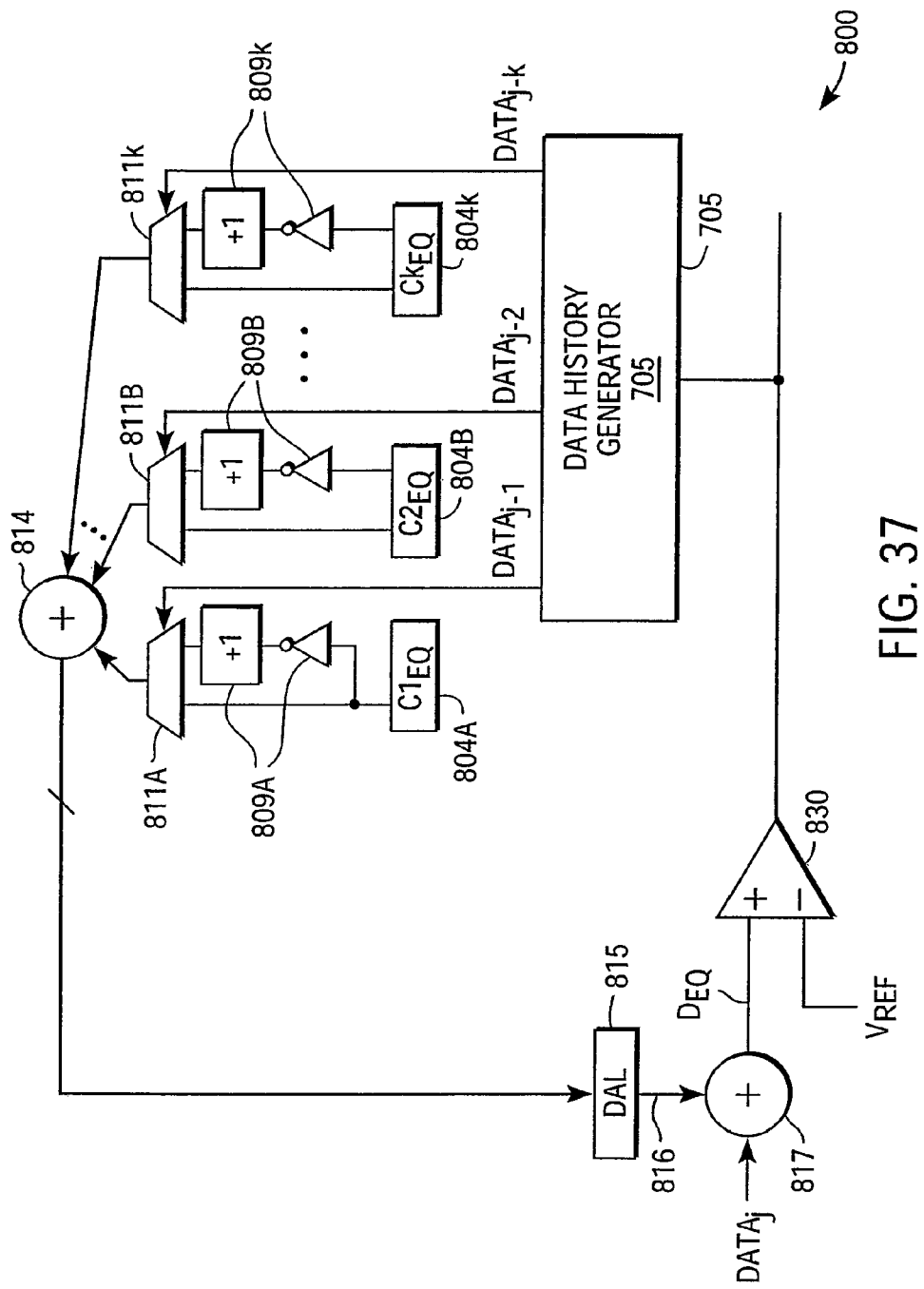
FIG. 37 is an exemplary receiver-side equalization circuit.

For example, FIG. 37 illustrates a bus receiver 800 with equalization circuitry according to one embodiment of the present invention. Incoming data, $\text{Data}_j$, is summed with an equalization offset 816 in analog adder 817, generating an equalized data value, DEQ, for comparison with Vref. The equalization offset 816 is generated by adding or subtracting respective equalization coefficients $C1_{EQ}$-$CK_{EQ}$ according to the state of previously received data values, $\text{Data}_{j-1}$-$\text{Data}_{j-K}$, respectively.

A data history generator 705 receives the output of comparator 830 and generates the data history values, $\text{Data}_{j-1}, \text{Data}_{j-2}, \ldots \text{Data}_{j-K}$. The data history values are used to select, via multiplexers 811A-811K, between positive and negative versions of respective equalization coefficients $C1_{EQ}$-$CK_{EQ}$ stored in equalization registers 804A-804K. As with the equalization coefficients discussed in reference to FIG. 36B, equalization coefficients $C1_{EQ}$-$CK_{EQ}$ may be positive or negative values. As shown in FIG. 37, a negative version of the content of each equalization register 804A-804K is generated by a respective two's-complement generator 809A-809K. Any number of circuits for generating negative versions of the equalization coefficients may be used in alternative embodiments. Also, one's-complement circuitry may be used in alternative embodiments instead of two's complement circuitry.

A digital adding circuit 814 receives the output from each of the multiplexers 811A-811K and provides a sum of coefficients to digital-to-analog converter 815 which generates the equalization offset 816. In an alternative embodiment, separate digital to analog converters are used to convert the outputs of multiplexers 811A-811K to respective analog values. The analog values are then combined with the incoming data value, Dataj, in analog adder 817. In this embodiment, adding stage 814 may be omitted, reducing the amount of time required to provide a valid offset value at adder 817. In another alternative embodiment, adder 817 is used to add the equalization offset 816 to Vref instead of to the incoming data. In this case, the equalization offset is generated with reverse polarity.

In yet another embodiment of the bus receiver, analog rather than digital circuitry is used to perform equalization. Sample and hold circuitry is used to capture past data signals (i.e., $Data_{j-1}$ to $Data_{j-k}$). The amplitude of the captured signals are weighted by equalization coefficients $C1_{EQ}$-$CK_{EQ}$ from registers 804A-804K, then input to adder 817. Cross-talk equalization is also accomplished in this manner, except that neighboring signals are weighted by the equalization coefficients instead of prior data signals on the same signal path.

Equalization coefficients may be determined using the techniques described above for determining voltage offset values. See FIGS. 24 and 29-31 and related discussion above. Referring to the scanning window feedback technique shown in FIG. 29, for example, a slave may write a sequence of patterns of successive bits (e.g., 101, 001, 010, 110. . . ) to a master to allow the master to determine the signal margin in the final bit of each pattern. For example, the master may determine that the voltage on the channel is 200 mV above $V_{OL}$ in the final bit of the pattern 01 and 200 mV below $V_{OH}$ in the final bit of the pattern 10 and provide a coefficient that contributes ±200 mV to the slave device.

Thus, by gauging the effect of toggled bits in different positions in the pattern, temporal equalization coefficients may be determined, fed back to the slave and installed in the temporal equalization registers within the slave's transmitter or receiver. Equalization coefficients for the master's transmitter may be determined in a similar manner with the slave returning margin measurements to the master for the master to determine its own coefficients.

In an alternative embodiment, each bit in each equalization register may be set during transmission of the sequence of bit patterns and then reset for transmission of the same sequence. Margin measurements may be made by a receiving device (e.g., a master if a slave's transmitter is being equalized) and used to determine whether the equalization bit should remain set. If the margin is improved, the bit under test is set. Otherwise the bit is reset. By successively testing the effect of each bit in the equalization register, moving from most significant bit to least significant bit, the appropriate equalization value may be determined. Once the content of a given equalization register has been established, the bits in the next register may be tested. Referring to FIG. 36A, for example, coefficient C1 may be established first, then coefficient C2, and so forth.

Coefficients for cross-talk equalization may also be determined using the techniques described in reference to FIGS. 24 and 29-31. However, rather than measuring margins that result from transmission of a given temporal bit pattern, margins are determined based on spatial bit patterns (e.g., different patterns of bits that are transmitted on nearby channels of the bus at the same time, rather than in succession on a single channel). By toggling each of the bit positions in the pattern, spatial coefficients may determined and installed in the cross-talk equalization registers for the transmitter under test. Also, each bit of each register may be successively determined by comparing margins measured when the bit is set with margins measured when the bit is reset.

Calibration Sequence

Several exemplary techniques have been presented by which timing offsets and voltage offsets and equalization offsets may be determined during the calibration phase of system operation. There are, however, several issues which should be considered when designing reliable and efficient calibration procedures. Definition of an appropriate calibration data sequence is one such issue.

Multiple calibration sequences are possible, but there are few which are optimal. A first preferred sequence consists of very simple 0-to-1 and 1-to-0 transitions at a data rate (frequency) much lower than the normal data rate of the channel during the bus system operation phase. A data rate with a period larger than the time memory of the channel, e.g., twice the bus electrical length, will usually be adequate. Since the clock and data receivers functioning as phase receivers in the foregoing embodiments are run at normal frequency during the calibration phase, but the data transfer rate is significantly reduced, any timing skews that arise as a function of the data rate are eliminated. In theory, the low frequency data may be considered the mean of the distribution of offsets in a system having frequency dependent offsets. The various offset registers, or rather the offset values stored therein, are determined using this low frequency data and timing, and voltage skews are minimized accordingly.

This approach works because the channel (data bus) transferring data between the master and slaves reacts differently at different data rates. That is, data at different transfer frequencies results in different offsets which are created by resonances and discontinuities at that frequency. Hypothetically, the center of the distribution for such offsets is actually more or less at the same location as the transitions of very low frequency data, and such data can be constructed by large data blocks having a single data transition. Such very low frequency data does not excite harmonics as much as higher frequency data can, and the single data transition may be readily discerned within the calibration process. Thus, by phase detecting the very low frequency data in receivers running at much higher clock rates, the timing and voltage offsets may be accurately determined.

A second preferred calibration sequence consists of a spectrum of calibration data which starts at a very low frequency and slowly increases until the fundamental is reached. No data frequency is favored over another in this approach, so each frequency is given the same number of data transitions, and thus the same number of phase detector evaluations, before the frequency is changed.

In a third preferred calibration sequence, the master observes the valid data window width using the scanning approach explained above, and determines if the communications channel will reliably run at the given frequency. If the master determines that the valid data window is not adequate, it reduces the operating frequency and re-establishes the valid data window width at the new frequency. Since the master's offset registers are calibrated in degrees for most of the foregoing embodiments, the percentage of valid bit-time required for reliable communication can be stored once for all operating frequencies and the final operating frequency need not be an integer multiple of the initial operating frequency.

Figure 38:
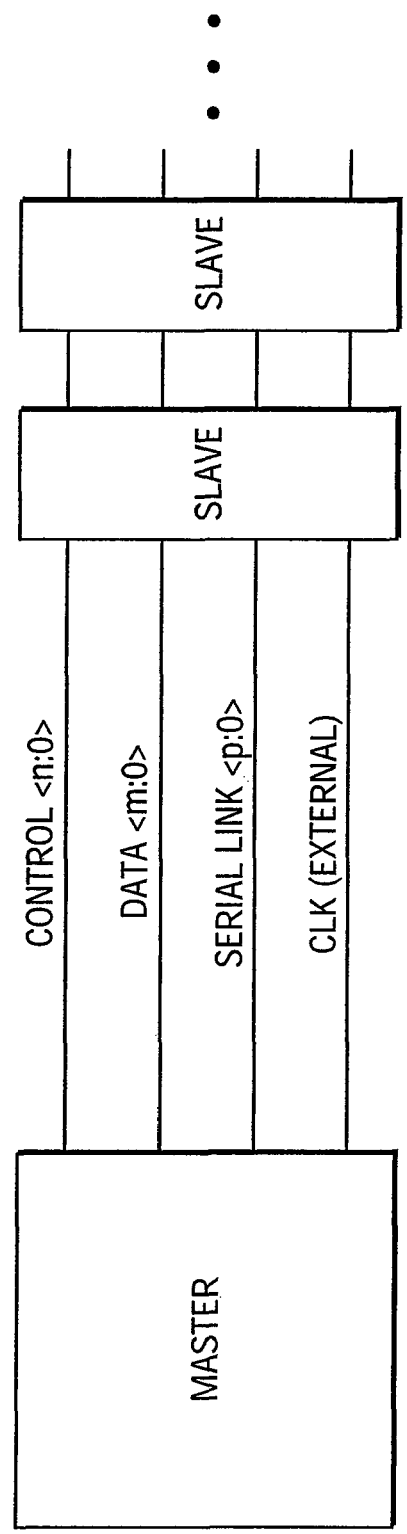
FIG. 38 is a block diagram of a bus system highlighting additional channel signals over those shown in FIGS. 1 and 5.

Preeminent among calibration issues is the fact that data transfers, and in particular control data transfers, between the master and slaves are inherently suspect before completion of the timing and voltage calibration procedures. FIG. 38 shows the exemplary bus system of FIG. 5 in some different detail. The communication channel between master and slaves, as further illustrated, typically includes a control bus, and a serial data link in addition to the data bus and external clock signal(s).

As noted, many contemporary bus systems communicate data between the master and slaves using packets. This is particularly true where the bus system comprises a memory system. Thus, the problem of communicating reliable control data from the master to a slave is often compounded by the packet nature of the communicated control data. In yet another aspect, the present invention addresses this problem.

Figure 39:
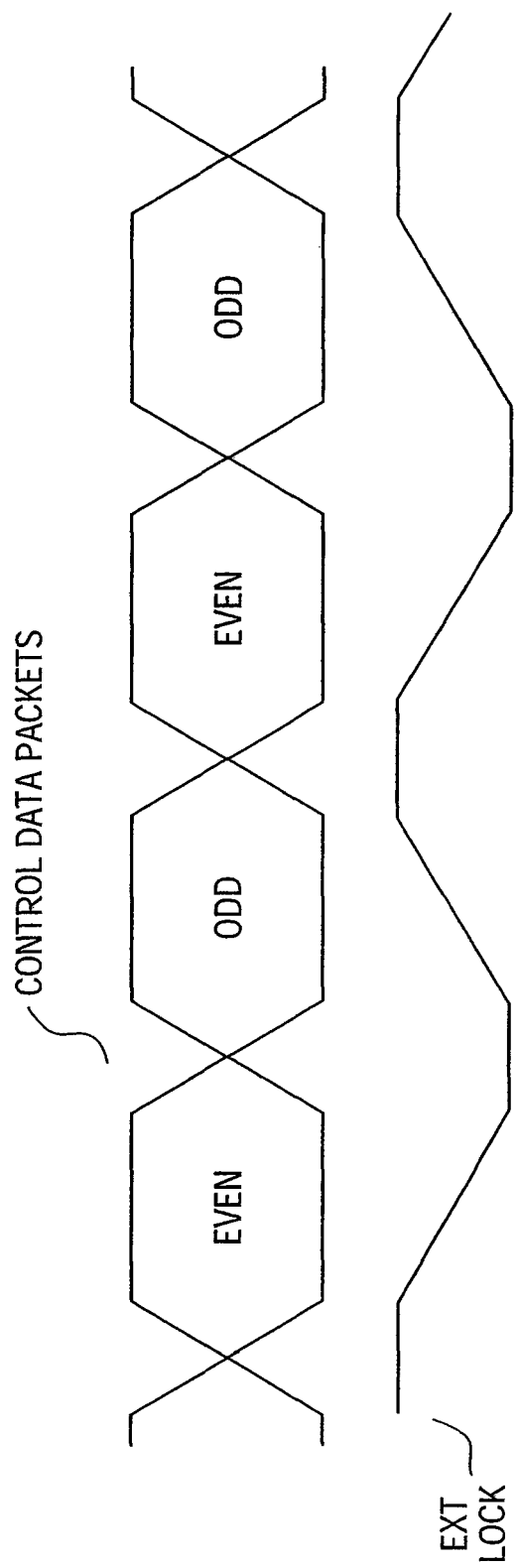
FIG. 39 is a timing diagram illustrating even and odd data packet definitions relative a clock signal.

FIG. 38 shows the basic configuration of a packet protocol based memory system. In normal operation, the master sends control data over "n+1" control lines to one or more slave devices. The slaves decode the command indicated by the control data, and perform the requested operation, such as a read or write operation. During a write operation data is transferred from the master to the slave via the data bus, and during a read operation data is returned from a slave to the master via the data bus. The control and data packets are sent synchronously relative to the external reference clock, e.g., CTM and CFM. Since in many high performance applications data packets are transferred on both the rising and falling edges of clock signal, the data packets can be viewed as being "even" or "odd" depending on their relationship to the external (EXT) clock, as illustrated in FIG. 39. The system shown in FIG. 38 also includes a slow speed serial link typically used during system initialization to convey device identification.

Figure 40:
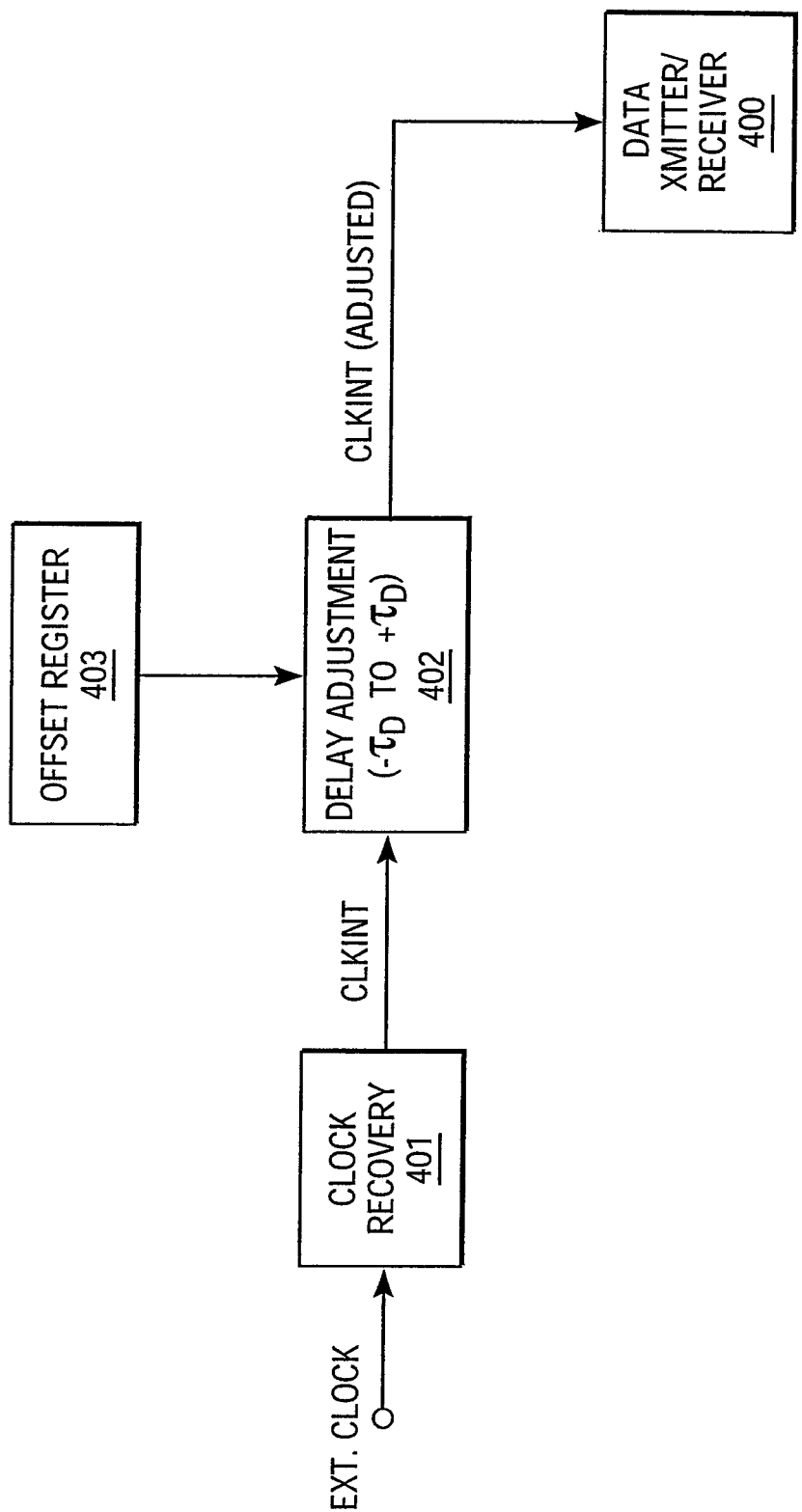
FIG. 40 is a block diagram generally illustrating the timing adjustment aspect of the present invention in relation to one exemplary bus system.

Many of the timing adjustment circuits explained above and resident in a slave can be functionally summarized by the diagram in FIG. 40. An adjusted internal clock, CLKINT (ADJUSTED), is developed and applied to a slave data receiver or transmitter 400. The adjusted internal clock has been derived from an internal clock (CLKINT) typically generated by a clock recovery circuit 401 on the slave receiving the external clock as an input. The internal clock is adjusted by a delay adjustment circuit 402 providing a delay between $-\tau_D$ and $+\tau_D$ in relation to an adjustment value stored in an offset register 403. Within this generalized approach to timing offset compensation, the master will vary the adjustment offset value in the offset register of the slave while performing a sequence of data writes and reads until an optimal offset value is determined which provides the best overall system margin.

Unfortunately, before the receiver and transmitter timing is calibrated to a master clock signal (EXT.CLK), the read and write command packets sent via the control bus may not be received correctly. Unreliable control makes calibration extremely difficult.

To overcome this difficulty, the slow speed serial link might be used to send commands to an un-calibrated slave device. However, this solution presents several problems. First, the serial port is very slow. As a result, the calibration process becomes unwieldy and takes an inordinate amount of time. Second, the slave device is forced to multiplex the slow speed read/write commands with normal control and data transfers. This ability requires significant additional control logic. Such additional hardware may delay certain critical paths during normal slave device operation.

Figure 41:
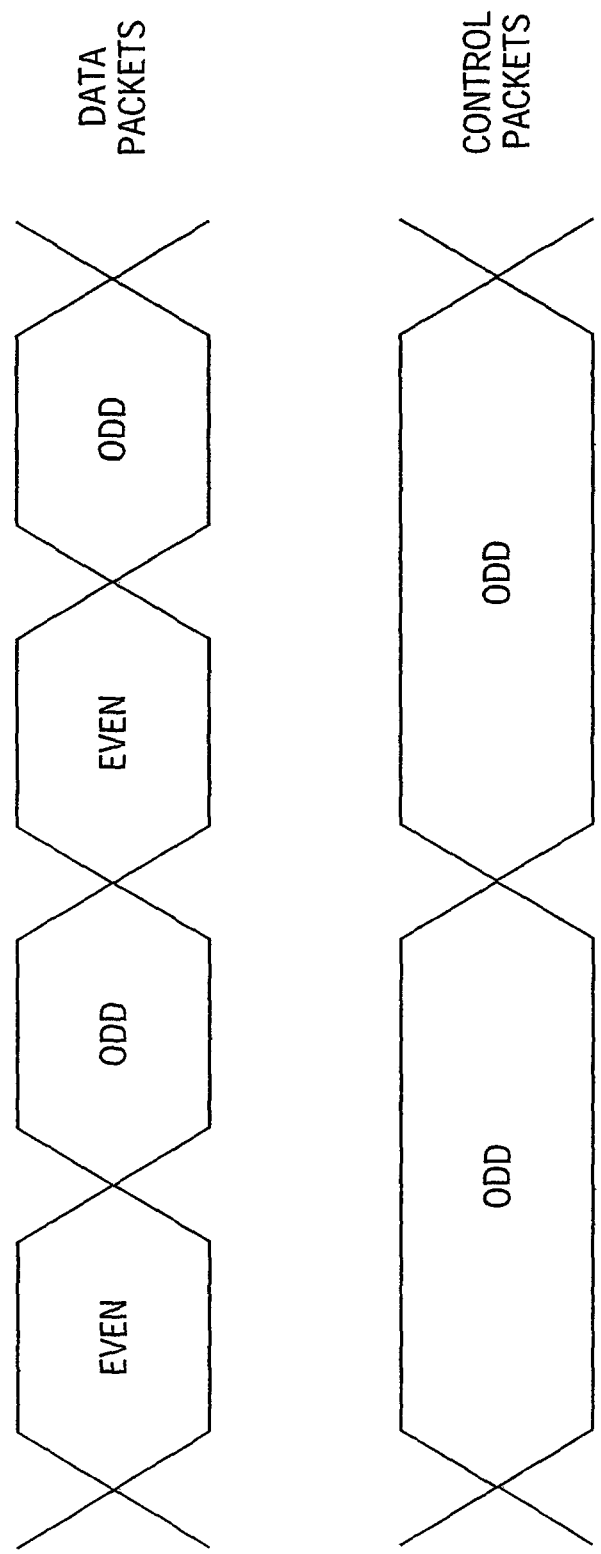
FIG. 41 is a timing diagram illustrating one exemplary relationship between expanded control packets and normal data packets.

Another approach to overcoming the unreliable nature of control packet transfer to un-calibrated slave devices requires that the control command packet be transmitted at half its normal rate. Such a scheme is illustrated in FIG. 41. By running at half the normal rate and delaying the control data by one quarter cycle, bits on the control bus lines have twice the ordinary timing margin. Such expanded timing margin is sufficient to reliably transfer control data even without calibration of the slave device. Transmitting only the even control bits shifted forward by 90° would provide control data having a similarly expanded timing margin.

While generally superior to transmitting control packets via the serial link, the foregoing technique presents some challenges to the system designer. The slave device must be capable of responding to two different protocols—one for regular operation and the other for calibration. Several exemplary techniques for accomplishing this result are explained below.

Assuming as an example that the slave is a memory device, the control packet typically consists of bit fields representing a number of different components including: a Device ID identifying which slave device is being accessed, an Opcode identifying the nature of the operation, an Address identifying a location related to the operation, and a Write Mask selecting a portion of write data to be stored.

During calibration of the memory device not all of these fields are required. For example, if the system has a method of enabling/disabling the memory device through the serial link, which is typical, then the Device ID field is not needed during calibration. All memory devices other than the one being calibrated can be readily disabled using the serial link. The Write Mask need not be used during calibration. Further, only a subset of the normal Opcodes are required during calibration, since the memory device need only perform simple read and write commands. Finally, only a portion of the typical Address field is required. The addressable memory requirements of the memory device during calibration are greatly reduced as compared to normal operation. Accordingly, many of the control packet bits may be utilized for other purposes during calibration.

FIG. 42 compares the format of a normal operation control packet with the format of a calibration mode control packet. The example assumes a four clock cycle transfer period, a five line control bus, and "normal" odd/even transfer on the rising and falling edges of the clock. In the example "D" bits are Device ID bits, "O" bits are Opcode bits, "ST" are framing bits, "M" bits are Write Mask bits, and "A" bits are Address bits.

In the calibration mode data packet, required calibration bits are placed in the odd positions. The even positioned bits effectively become "don't care" bits. This arrangement of bits allows the same overall control packet format and protocol to be used during normal and calibration modes of operation.

Figure 43:
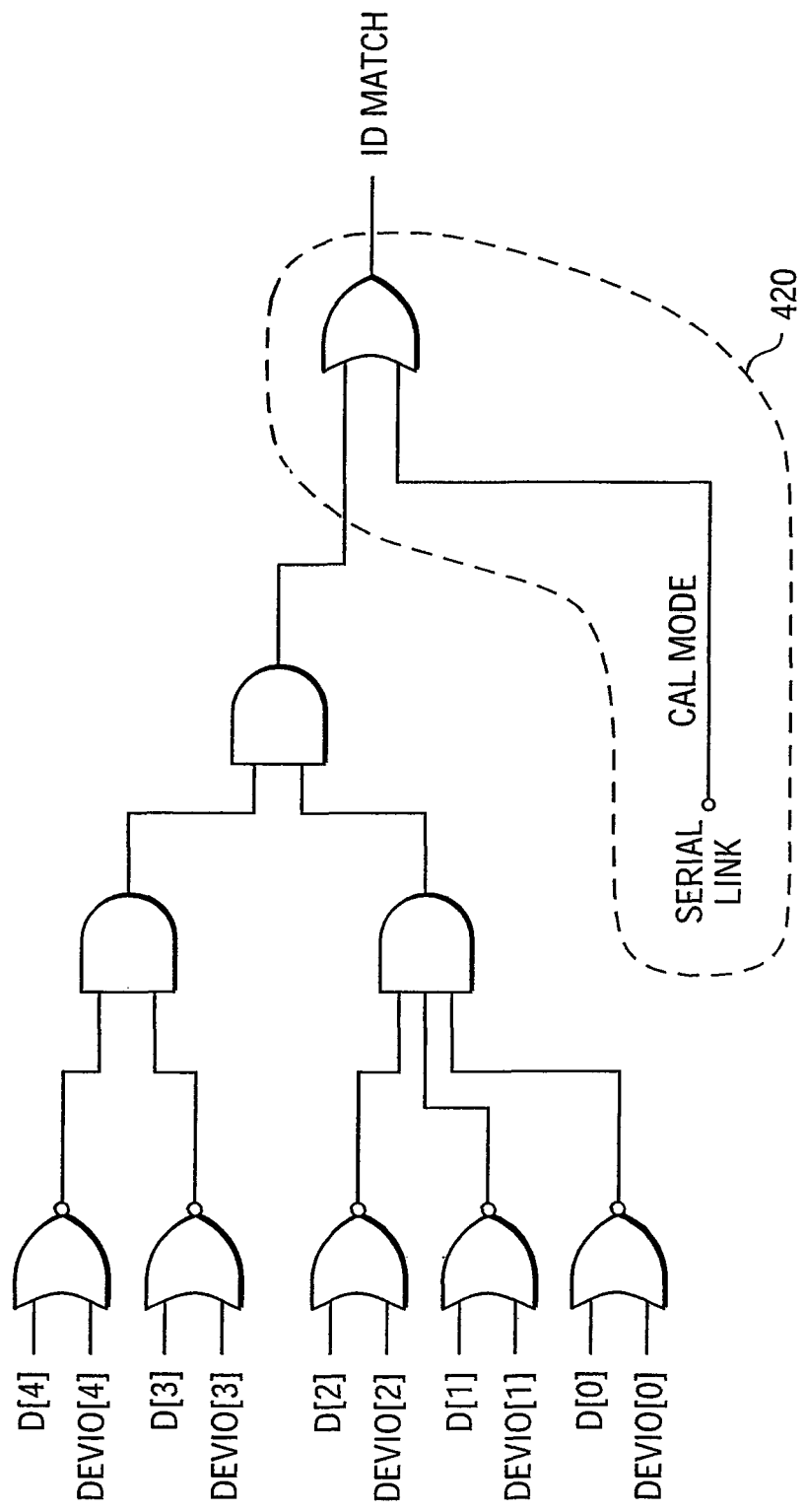
FIG. 43 illustrates the changes to a selected exemplary decoding circuit required to implement the different mode of interpretation of the control information packet shown in FIG. 26.

During calibration, the control packet decode logic will receive correct bits for the odd bits and "don't care" bits for even bits. The logic used to decode control data during normal operation requires remarkably little modification to also decode control data during calibration. As shown in FIG. 43, only the single additional gate and control line, combined 420, need be added to the normal logic.

In the example illustrated by FIGS. 42 and 43, a serial register bit causes all control packets to be processed, regardless of the state of the control packet D[4:0] bits or the device ID register. As long as the serial register bit is set before calibration starts and the system does not perform any masked writes, the control link will operate reliably with the expanded margins described above.

Restrictions on addressable memory space brought about by the foregoing must be considered when a calibration sequence is defined. Furthermore, as Opcode and Address bits are cannibalized using this approach, the control packet format and the corresponding calibration control logic must also be modified. Such tradeoffs are well within ordinary skill in the art. The foregoing examples of the control packet and its associated decode logic are highly specific to a presently preferred embodiment of the bus system. Any reasonable control packet format, definition of bits, and resulting decoding logic might be used to effect dual operation of the memory device, as between normal operation and calibration, with minimal overhead.

The foregoing embodiments of the present invention illustrate various implementations of the timing and/or voltage control circuitry in the slave devices of an exemplary bus system. However, bus system designers may wish to minimize the size, cost, and complexity of the slave devices. Alternatively, bus system designers may provide a very powerful master device. Whatever the motivation for doing so, the timing and/or voltage control circuits previously described as being resident in individual slave devices may be implemented in the master.

A master incorporating such circuits may generally implement voltage/timing adjustments in one of two ways: a mean control approach or an individual control approach. In the mean control approach, optimizing voltage/timing offsets are calibrated for each slave device during calibration. Once a field of offset values have been calculated, a mean offset value is determined in the master. This mean offset value is stored in a register on the master and used to adjust the read/write timing or the read/write voltage for data being communicated between the master and all slave devices.

In the individual slave device control approach, a separate timing/voltage offset value is stored in the master for each slave to produce a field of timing/voltage offset values. As described above, an appropriate offset value may be determined for each slave during calibration. Once determined, the offset value is specifically applied to read/write operations involving the corresponding slave.

Figure 44:
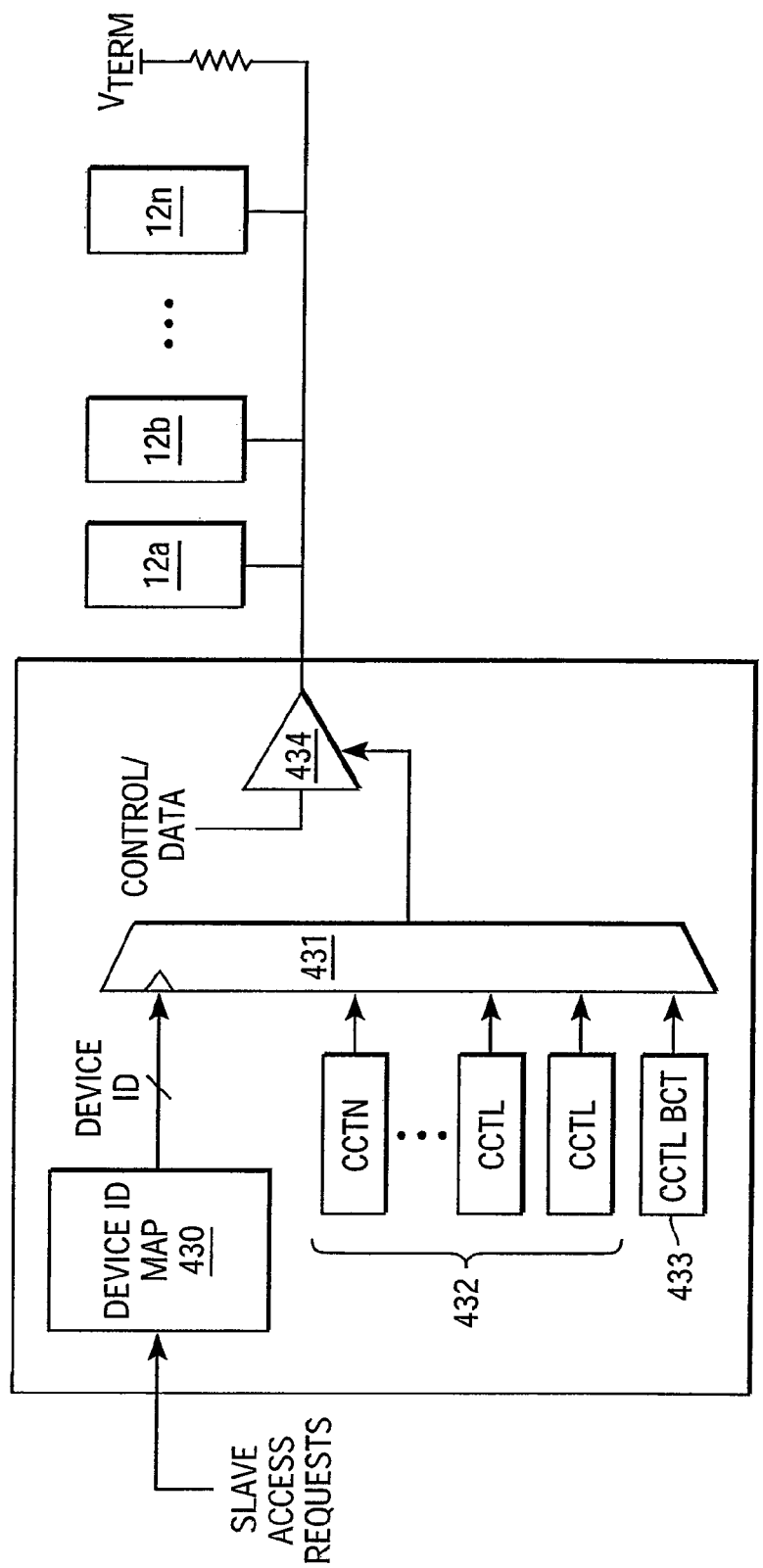
FIG. 44 generically illustrates the placement of one or more "offset registers" within the master as compared with slave resident registers.

FIG. 44 illustrates one example in which current control is implemented for each slave device on an individual basis using offset values stored in the master. As is typical in many contemporary bus systems, this example assumes that each slave device (12a-12n) is identified within the bus system by a unique device ID. Thus, a "request" to access (read/write) data in one slave will include a device ID indicator. The example shows a device ID map circuit 430 receiving a request and extracting a device ID signal from it. The device ID signal is applied to a selector circuit 431, such as a MUX, which also receives a plurality of offset values. Current control registers 432 (CCTLa, CCTLb . . . CCTLn) each contain an offset value for a corresponding slave device (12a, 12b, . . . 12n). A broadcast control register CCTL (BCT) 433 is also provided. The offset value stored in broadcast control register is used by the master when communicating data to all slave devices. This offset value may be the mean control value mentioned above.

However, in normal operating mode, the device ID extracted from a slave access request is used to select a corresponding current control offset value for the accessed slave device. The selected current control offset value is then applied to a drive circuit 434 which adjusts the current of write signals (control or data) being sent to the slave device. The example shows a single signal line, but one or more drive circuits may adjust the output current on a number of data bus signal lines.

From this specific example, one of ordinary skill in the art may see that a very similar approach may be taken to implement read signal voltage adjustments in the master. Further, read/write timing adjustments may also be made on the basis of a mean timing offset value or a field of timing offset values stored in the master. Timing control adjustment may be made in relation to a particular offset value by adjusting the master read/write clock signal, or by communicating a slave device specific internal read/write signal via a signal line.

What is claimed is:

1. A memory controller to control a memory device, the memory controller comprising:
a transmitter to output a calibration sequence to the memory device;
a receiver to receive a signal representing a phase difference between a clock signal received at the memory device and the calibration sequence as received by the memory device; and,
circuitry to apply a transmit timing offset to write data, based on the phase difference between the clock signal as received at the memory device and the calibration sequence as received by the memory device.

2. The memory controller of claim 1, wherein the calibration sequence is a data pattern sent by the memory controller.

3. The memory controller of claim 1, further comprising:
a transmit clock output to transmit the clock signal to the memory device, the clock signal to be based on a signal produced by a phase-locked loop (PLL) on the memory controller.

4. The memory controller of claim 1, further comprising:
a transmit clock output to transmit the clock signal to the memory device, the clock signal to be based on a signal produced by a delay-locked loop (DLL) on the memory controller.

5. The memory controller of claim 1, wherein the circuitry comprises a register to store a value representative of the transmit timing offset to apply to the write data.

6. The memory controller of claim 5, wherein the write data is output using the transmitter, and wherein the transmit timing offset is applied to the write data at the transmitter.

7. A memory controller to control a memory device, the memory controller comprising:
a first output to transmit, in response to a calibration mode, a calibration sequence to the memory device;
circuitry to place the memory device in a mode to receive the calibration sequence; and,
a first input to receive, from the memory device, phase data representing a phase difference between a clock signal as received by the memory device and the calibration sequence as received by the memory device.

8. The memory controller of claim 7, wherein the calibration sequence is a data pattern sent by the memory controller via the first output.

9. The memory controller of claim 7, wherein the first output is associated with a data bus.

10. The memory controller of claim 7, further comprising a phase-locked loop (PLL) to produce the clock signal.

11. The memory controller of claim 7, further comprising a delay-locked loop (DLL) to produce the clock signal.

12. The memory controller of claim 7, further comprising:
a register to store a value representative of a timing offset to apply to data sent via the first output.

13. The memory controller of claim 12, wherein the value that is representative of the timing offset is based on the phase data representing the phase difference between the clock signal and the received calibration sequence.

14. The memory controller of claim 12, wherein the value is calculated from the phase data from the memory device.

15. A method of operating a memory controller, comprising:
sending, from the memory controller, a calibration sequence;
receiving, by the memory controller, a signal generated by the memory device that represents a phase difference between the calibration sequence, as received by the memory device, and a clock signal; and,
adjusting, by the memory controller, a timing offset for write operations based on the phase difference between the calibration sequence, as received by the memory device, and the clock signal.

16. The method of claim 15, further including repeating the sending, receiving, and adjusting for each memory device of a plurality of memory devices, wherein the timing offsets for each memory device of the plurality of memory devices are independent of one another.

17. The method of claim 15, wherein the calibration sequence is a data pattern.

18. The method of claim 15, wherein the clock signal is generated by a phase-locked loop (PLL) on the memory controller.

19. The method of claim 15, wherein the clock signal is generated by a delay-locked loop (DLL) on the memory controller.

20. The method of claim 15, further comprising:
after the calibration sequence is complete, storing the timing offset for write operations.

21. The method of claim 16, further comprising:
after repeating the sending, receiving, and adjusting for each of a plurality of memory devices in the memory system, storing timing offsets for each of the plurality of memory devices in the memory system.

* * * * *